US009698539B2

(12) United States Patent
Toba et al.

(10) Patent No.: US 9,698,539 B2
(45) Date of Patent: Jul. 4, 2017

(54) CONNECTOR, DATA TRANSMITTING APPARATUS, DATA RECEIVING APPARATUS, AND DATA TRANSMITTING AND RECEIVING SYSTEM

(71) Applicant: SONY CORPORATION, Tokyo (JP)

(72) Inventors: Kazuaki Toba, Kanagawa (JP); Akira Matsuda, Tokyo (JP); Taichi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/785,135

(22) PCT Filed: Mar. 18, 2014

(86) PCT No.: PCT/JP2014/057415
§ 371 (c)(1),
(2) Date: Oct. 16, 2015

(87) PCT Pub. No.: WO2014/174941
PCT Pub. Date: Oct. 30, 2014

(65) Prior Publication Data
US 2016/0087377 A1 Mar. 24, 2016

(30) Foreign Application Priority Data
Apr. 26, 2013 (JP) .................... 2013-093891

(51) Int. Cl.
*H01R 13/6587* (2011.01)
*H01R 13/6581* (2011.01)
(Continued)

(52) U.S. Cl.
CPC ..... *H01R 13/6587* (2013.01); *H01R 13/6581* (2013.01); *H01R 13/6594* (2013.01);
(Continued)

(58) Field of Classification Search
CPC .................................. H05K 5/0269
(Continued)

(56) References Cited

U.S. PATENT DOCUMENTS 6,997,748 B1 2/2006 Su
2007/0105440 A1* 5/2007 Delaney ........... H01R 13/65802
439/607.36

(Continued)

FOREIGN PATENT DOCUMENTS

JP 2007-227233 9/2007
JP 2009-515317 4/2009
(Continued)

OTHER PUBLICATIONS

Oct. 27, 2016, Extended European search report for related EP application No. 14787761.7.

*Primary Examiner* — Abdullah Riyami
*Assistant Examiner* — Justin Kratt
(74) *Attorney, Agent, or Firm* — Paratus Law Group, PLLC

(57) ABSTRACT

To be able to further reduce deterioration in signal quality, there is provided a connector including: a signal pin (11) that is connected to a wiring pattern (15) on a mounted substrate (14) and that transmits a signal to an inside and an outside of any apparatus, the mounted substrate (14) having an end disposed in the apparatus; and a shell (13) that is formed of an electric conductor and grounded to ground potential on the mounted substrate (14), in a manner that the shell (13) covers the signal pin (11) in a region in which the signal pin (11) stretches toward the mounted substrate (14).

17 Claims, 61 Drawing Sheets

(51) Int. Cl.
*H01R 24/66* (2011.01)
*H01R 13/6594* (2011.01)
*H05K 5/02* (2006.01)
*H01R 24/60* (2011.01)

(52) U.S. Cl.
CPC ............ *H01R 24/66* (2013.01); *H01R 24/60* (2013.01); *H05K 5/0269* (2013.01)

(58) Field of Classification Search
USPC .................................................... 439/620.22
See application file for complete search history.

(56) References Cited

U.S. PATENT DOCUMENTS

| | | | |
|---|---|---|---|
| 2009/0197441 A1* | 8/2009 | Tanaka | H01R 13/6471 |
| | | | 439/101 |
| 2010/0203751 A1 | 8/2010 | Tsai | |
| 2011/0300748 A1 | 12/2011 | Song et al. | |
| 2012/0003873 A1 | 1/2012 | Tsuchiya | |
| 2012/0045935 A1 | 2/2012 | Zhang et al. | |
| 2012/0231675 A1 | 9/2012 | Zhang | |

FOREIGN PATENT DOCUMENTS

| | | |
|---|---|---|
| JP | 2009-129649 | 6/2009 |
| JP | 2010-129540 | 6/2010 |
| JP | 2011-096381 | 5/2011 |
| JP | 2012-069353 | 4/2012 |
| WO | WO2011/052105 A1 | 5/2011 |

\* cited by examiner

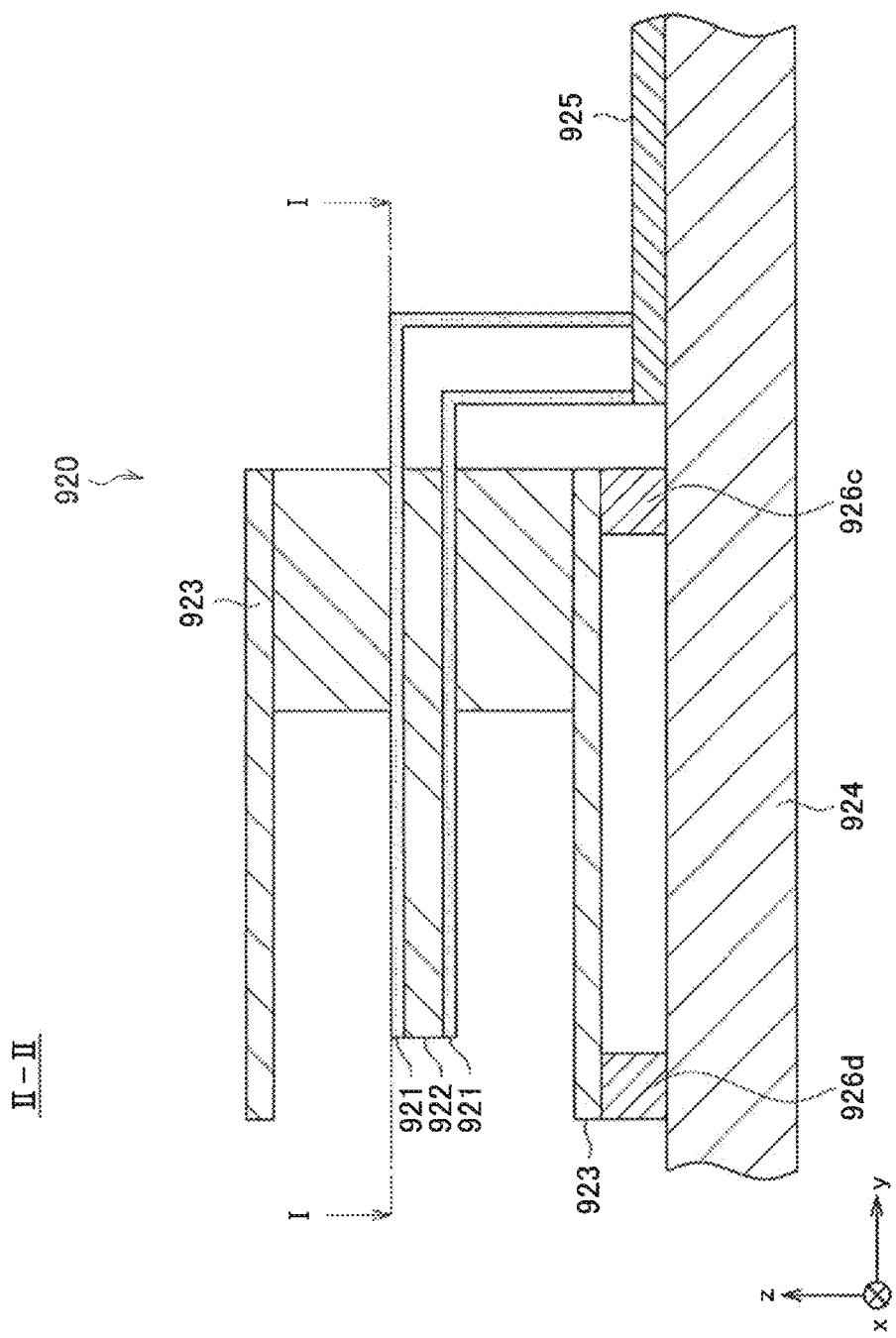

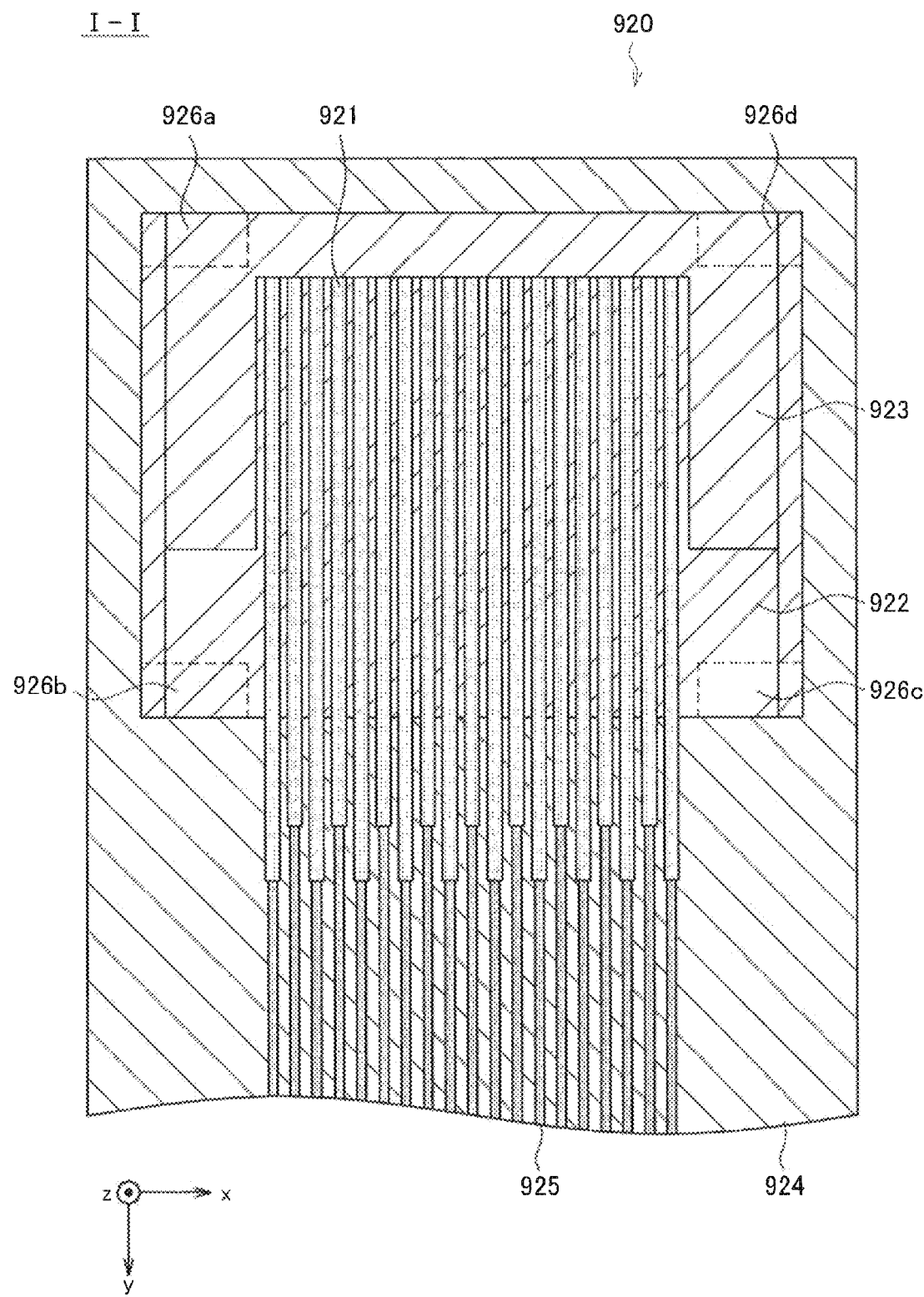

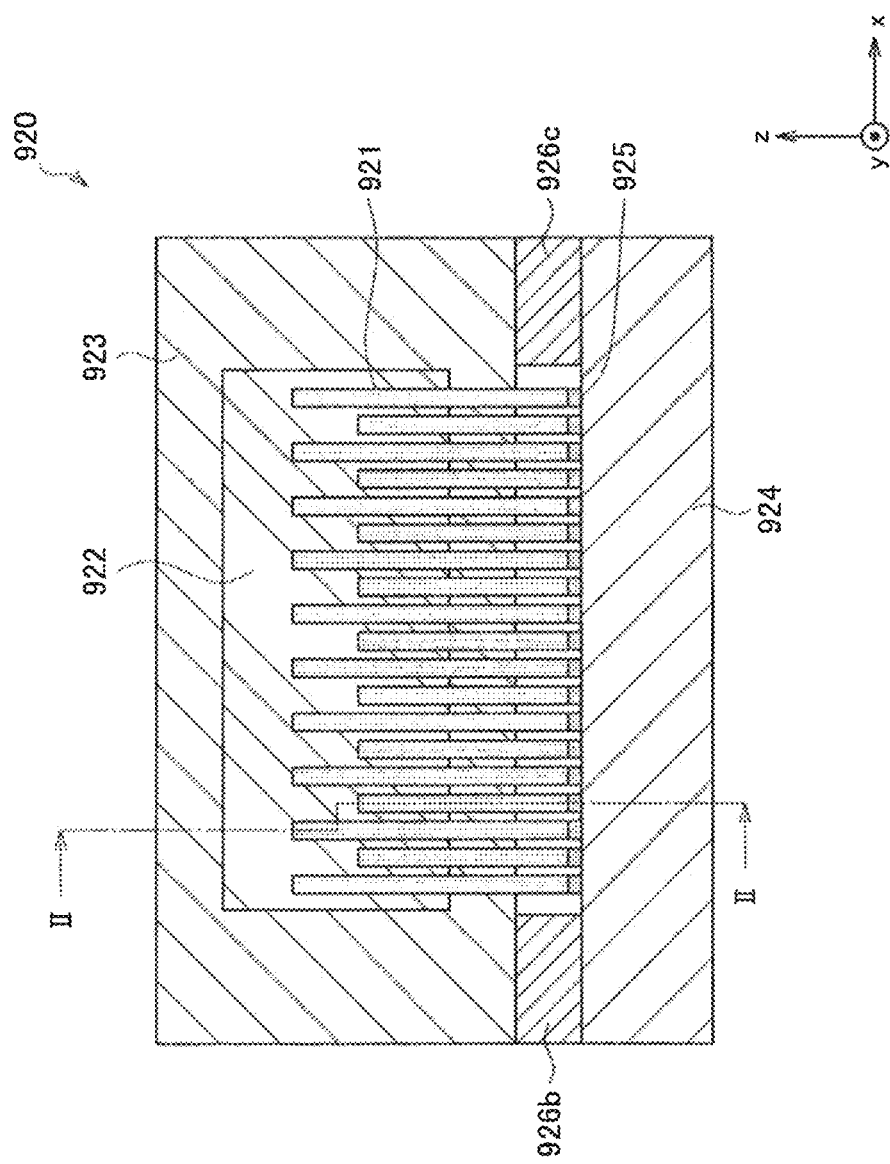

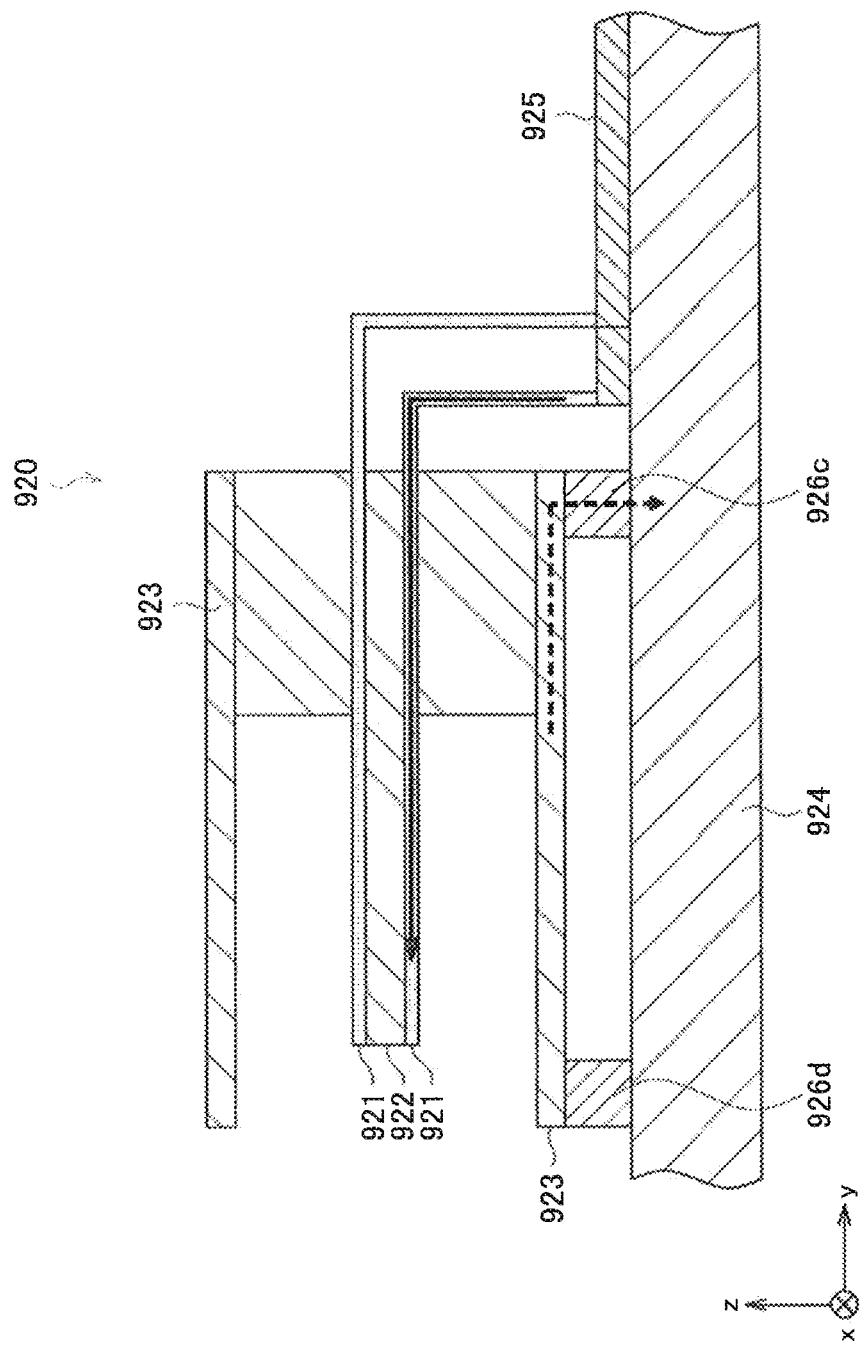

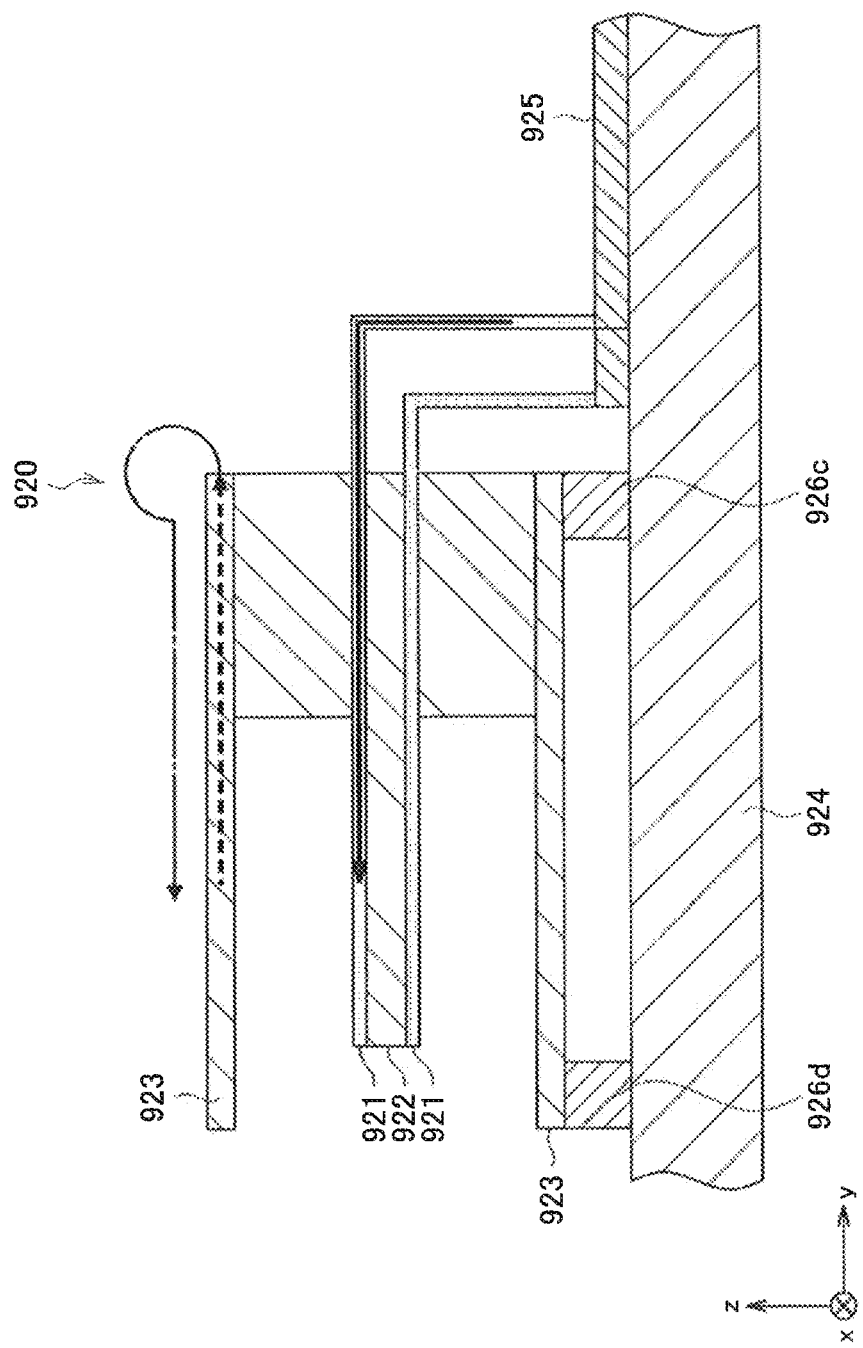

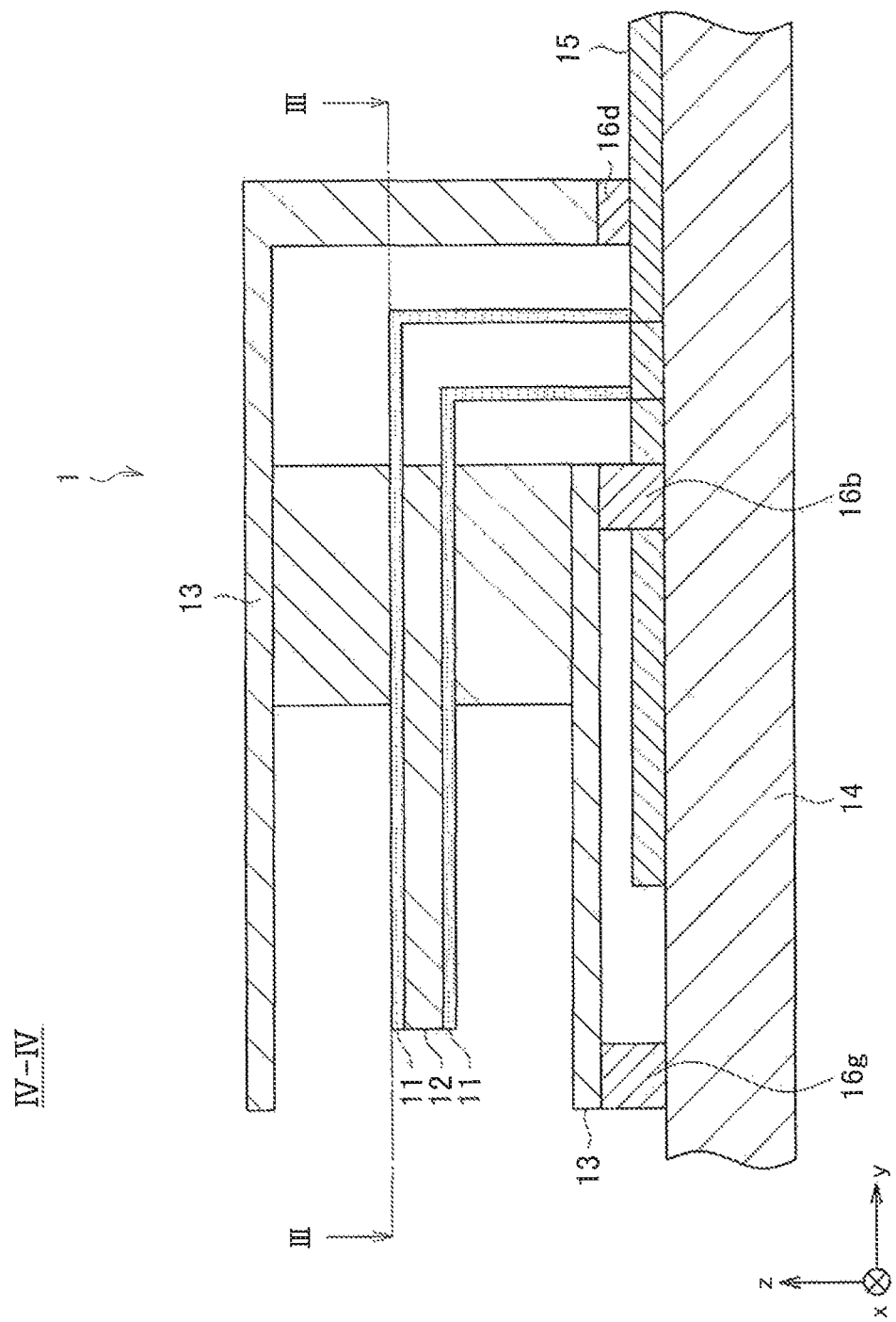

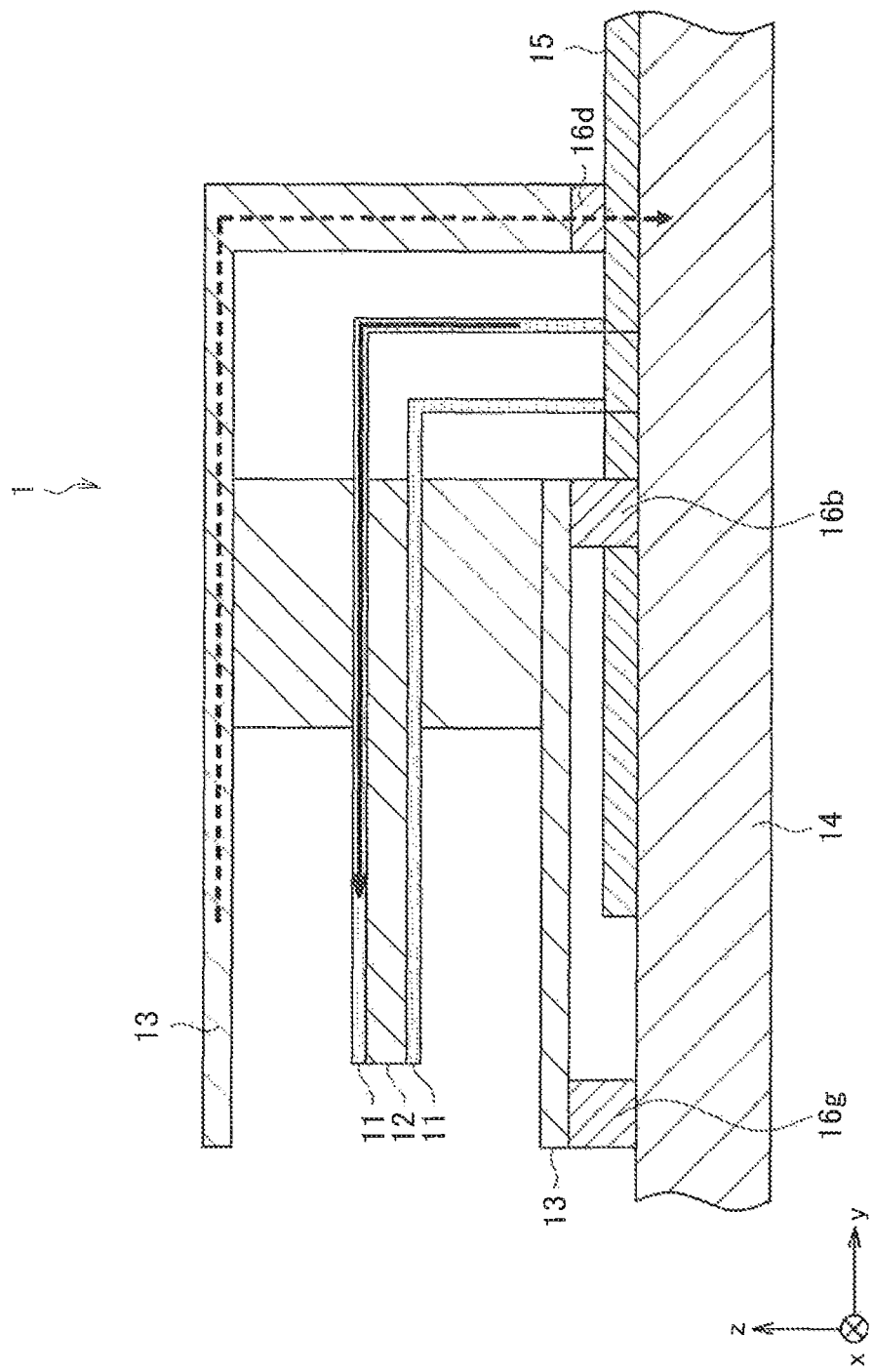

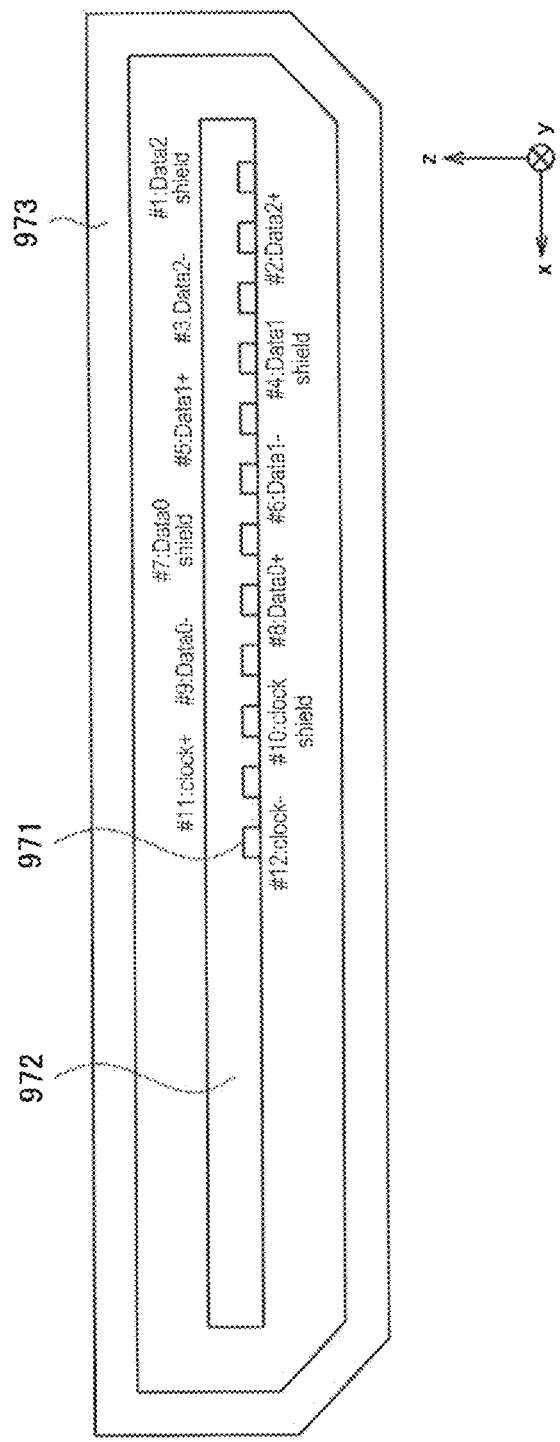

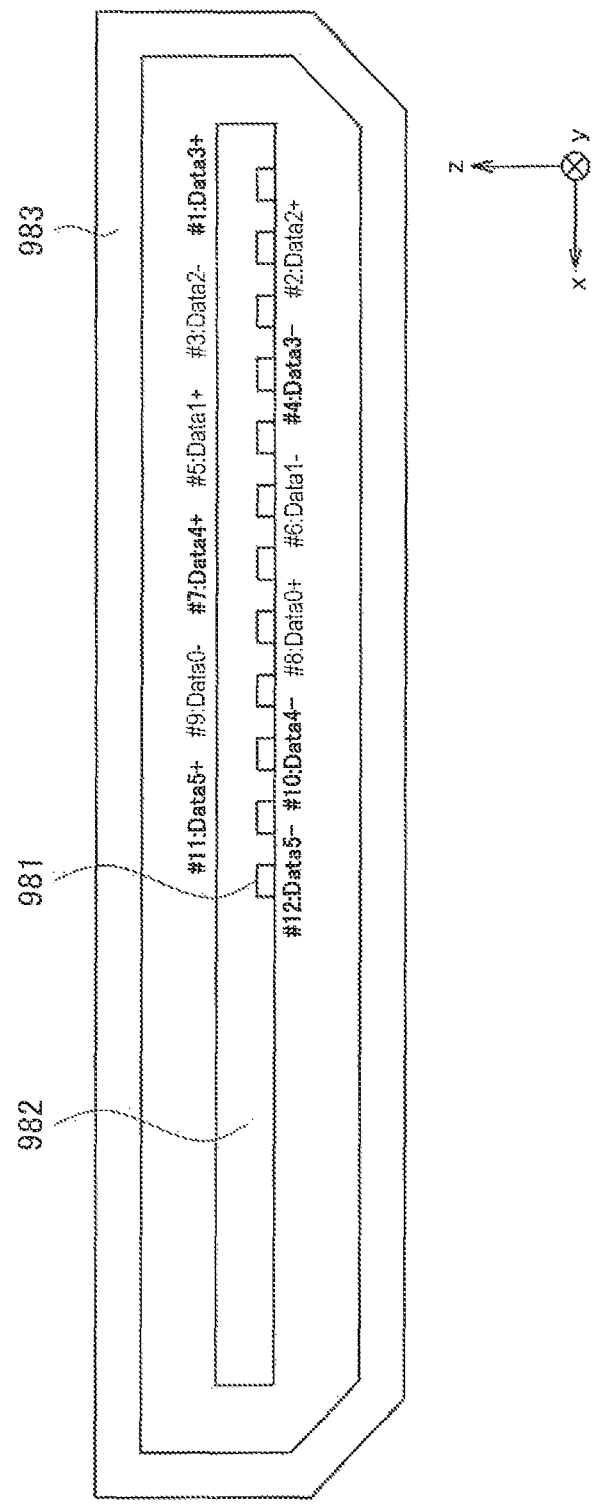

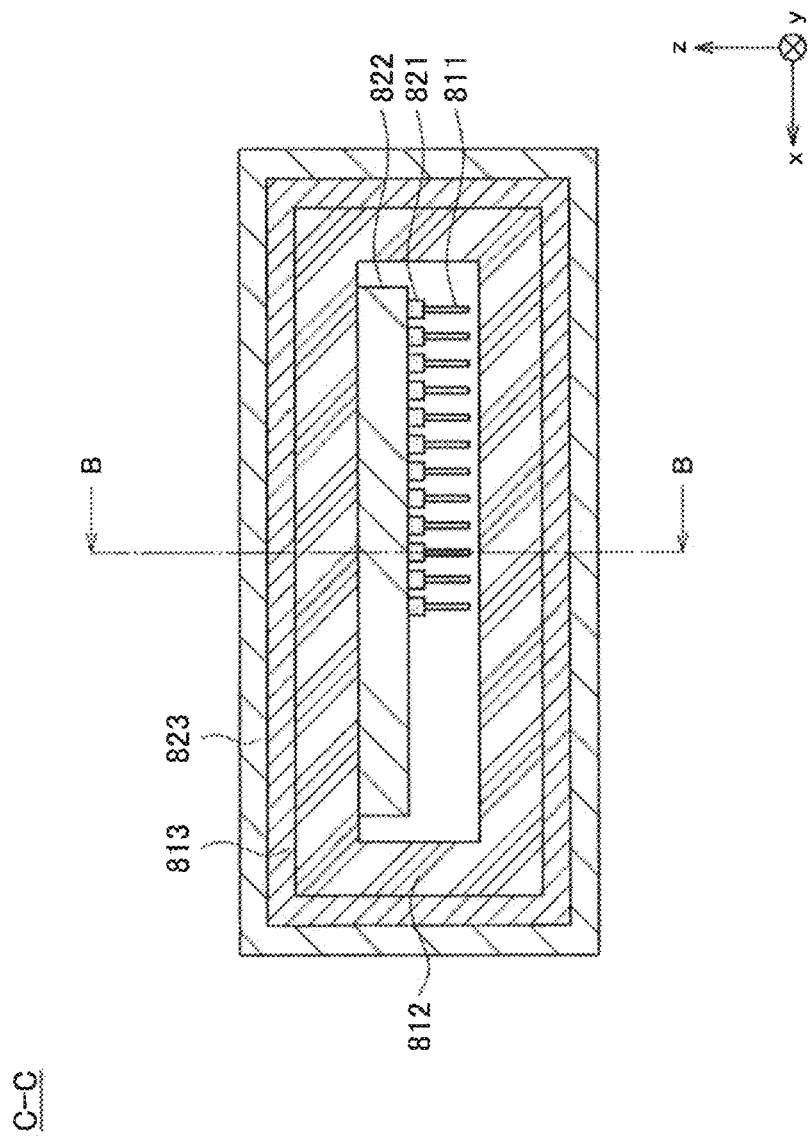

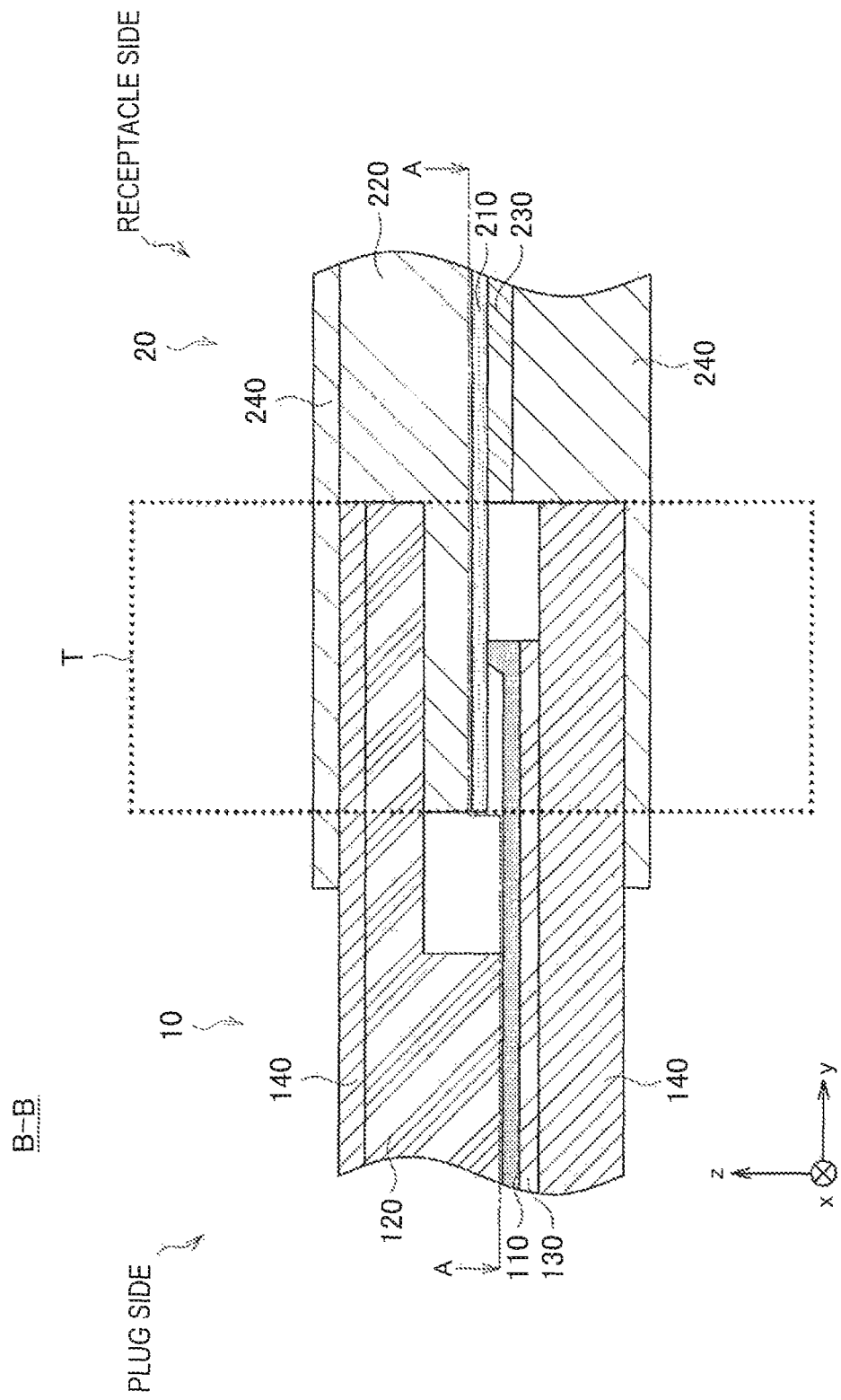

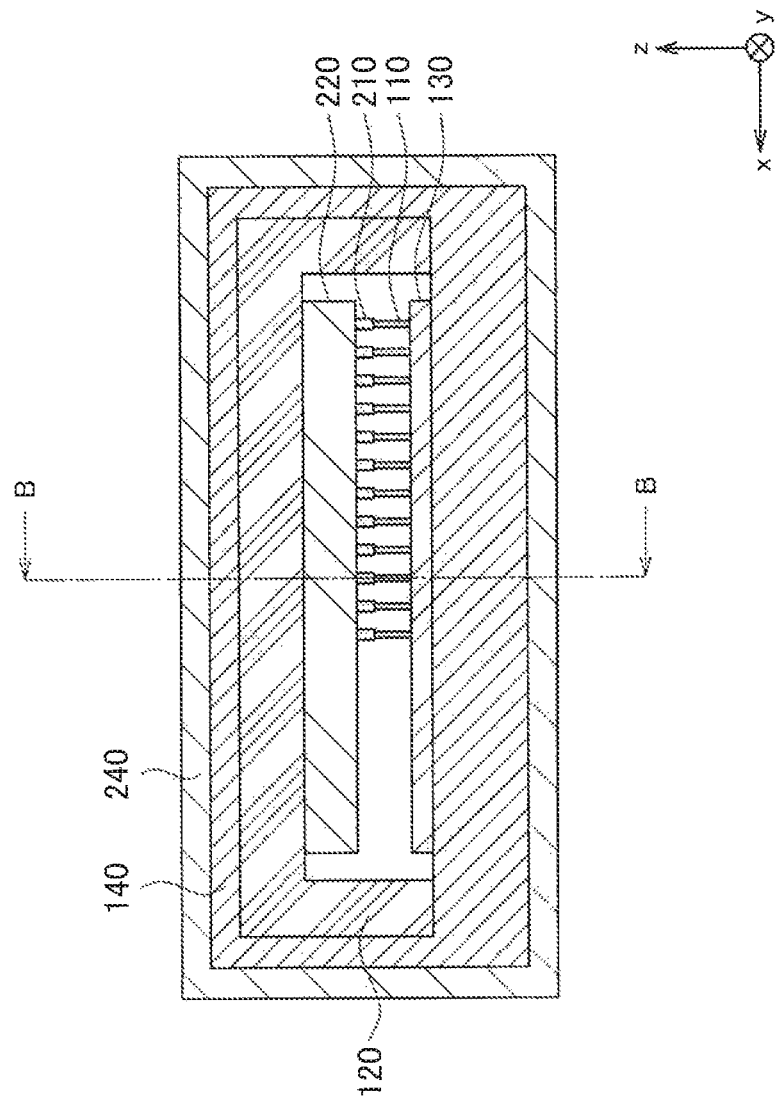

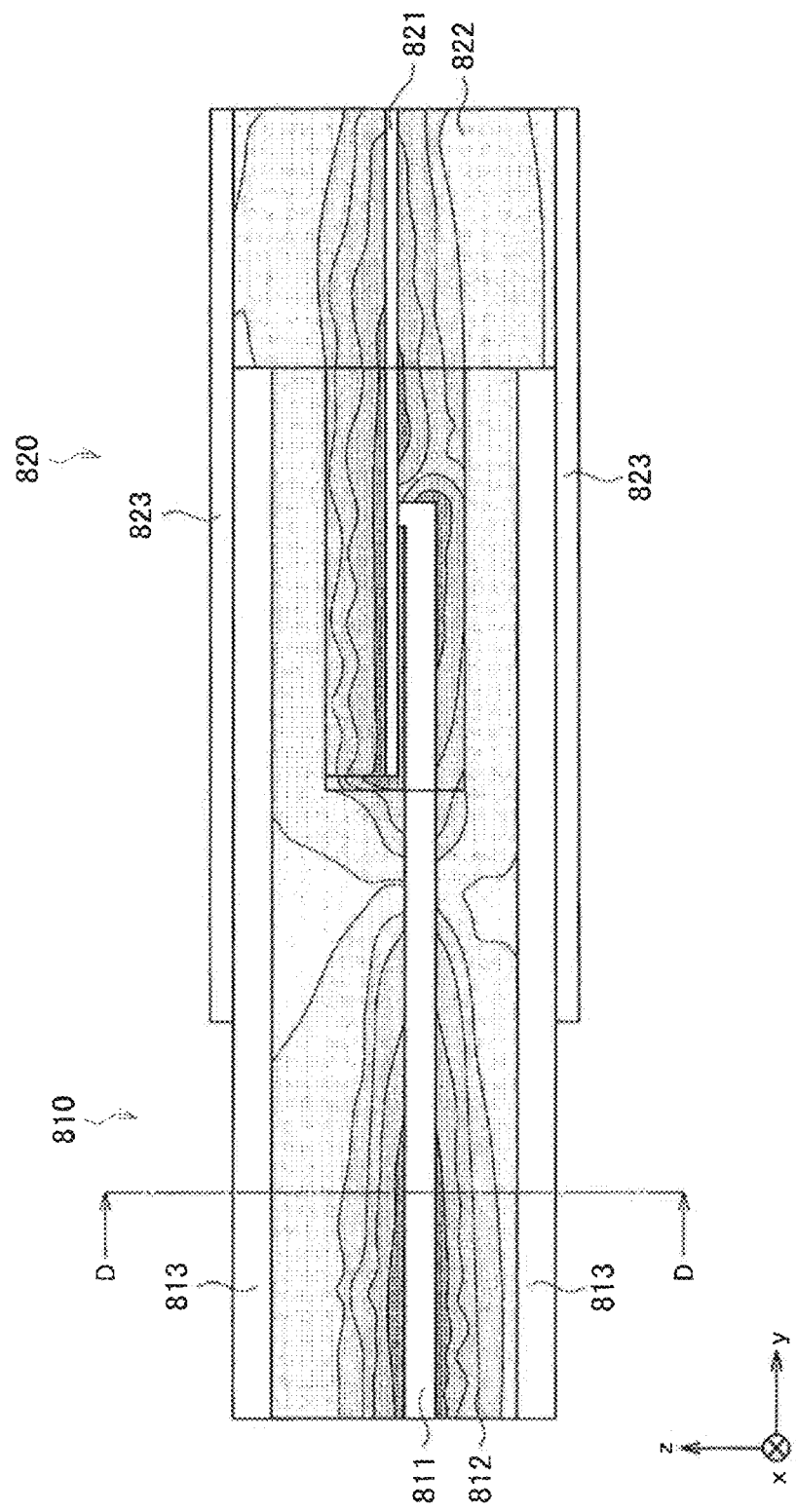

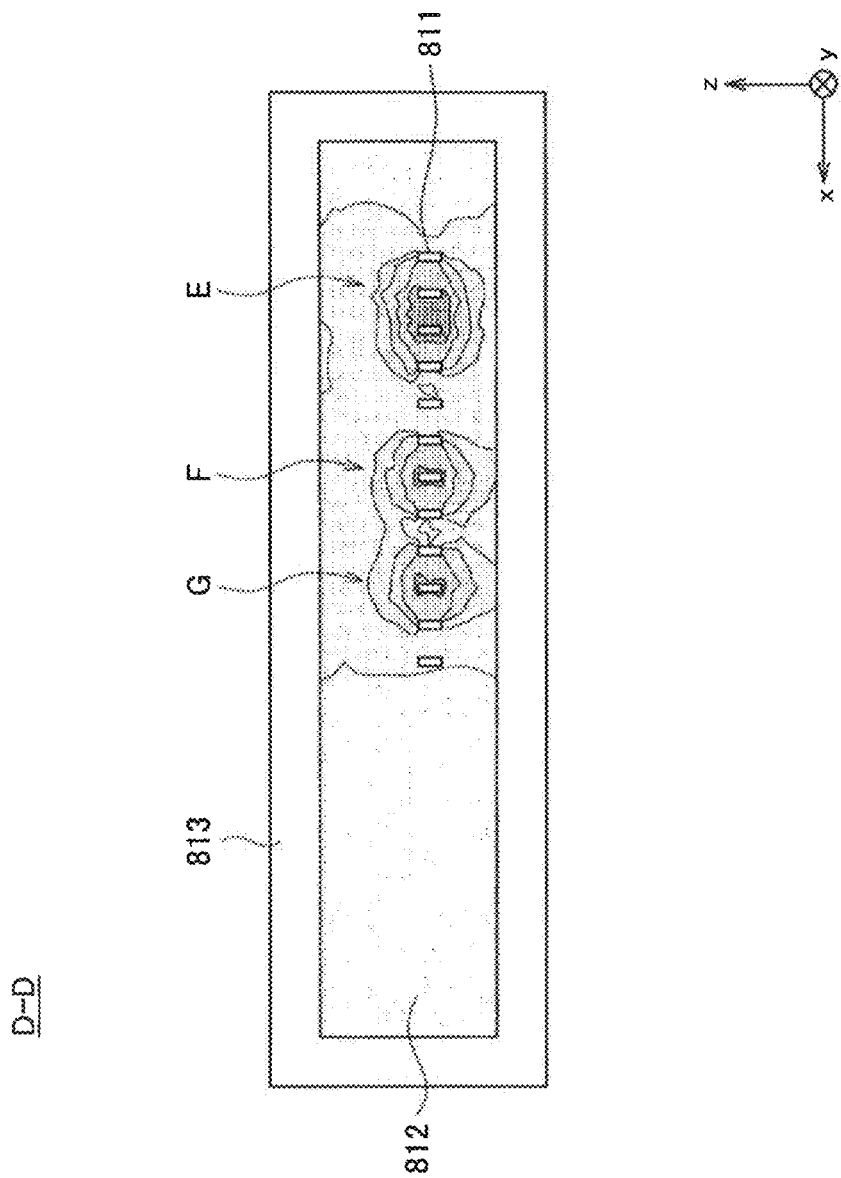

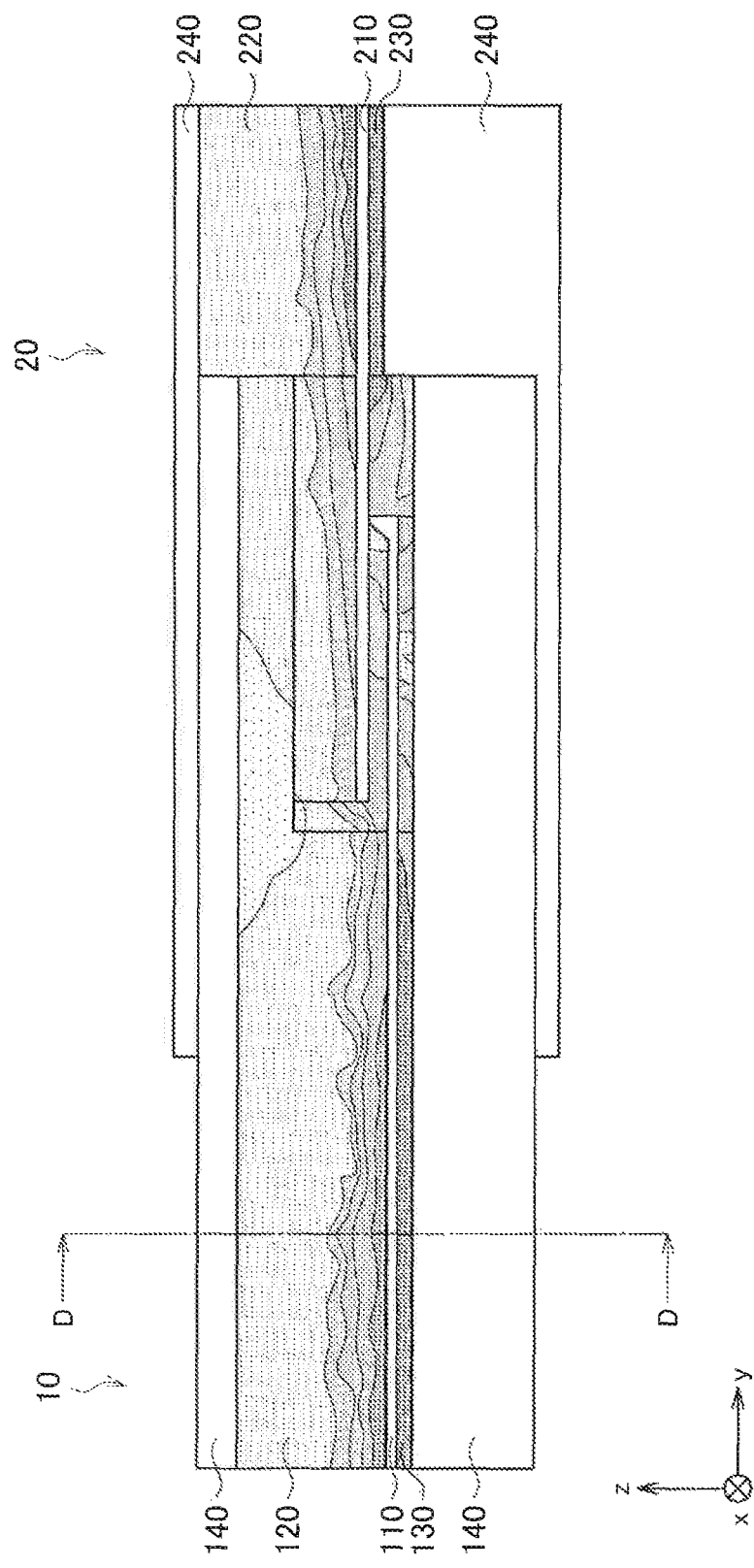

-- RELATED ART --

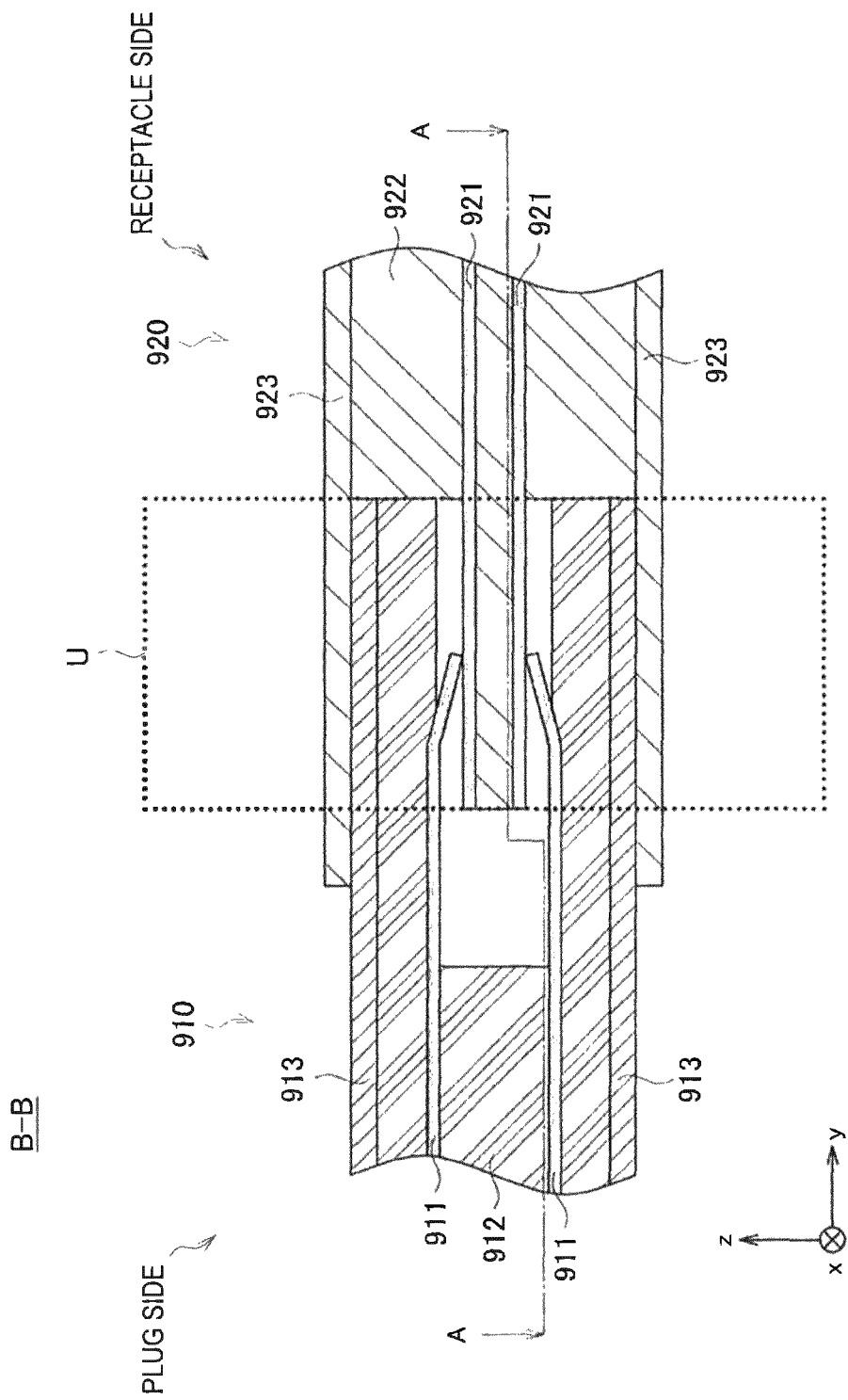

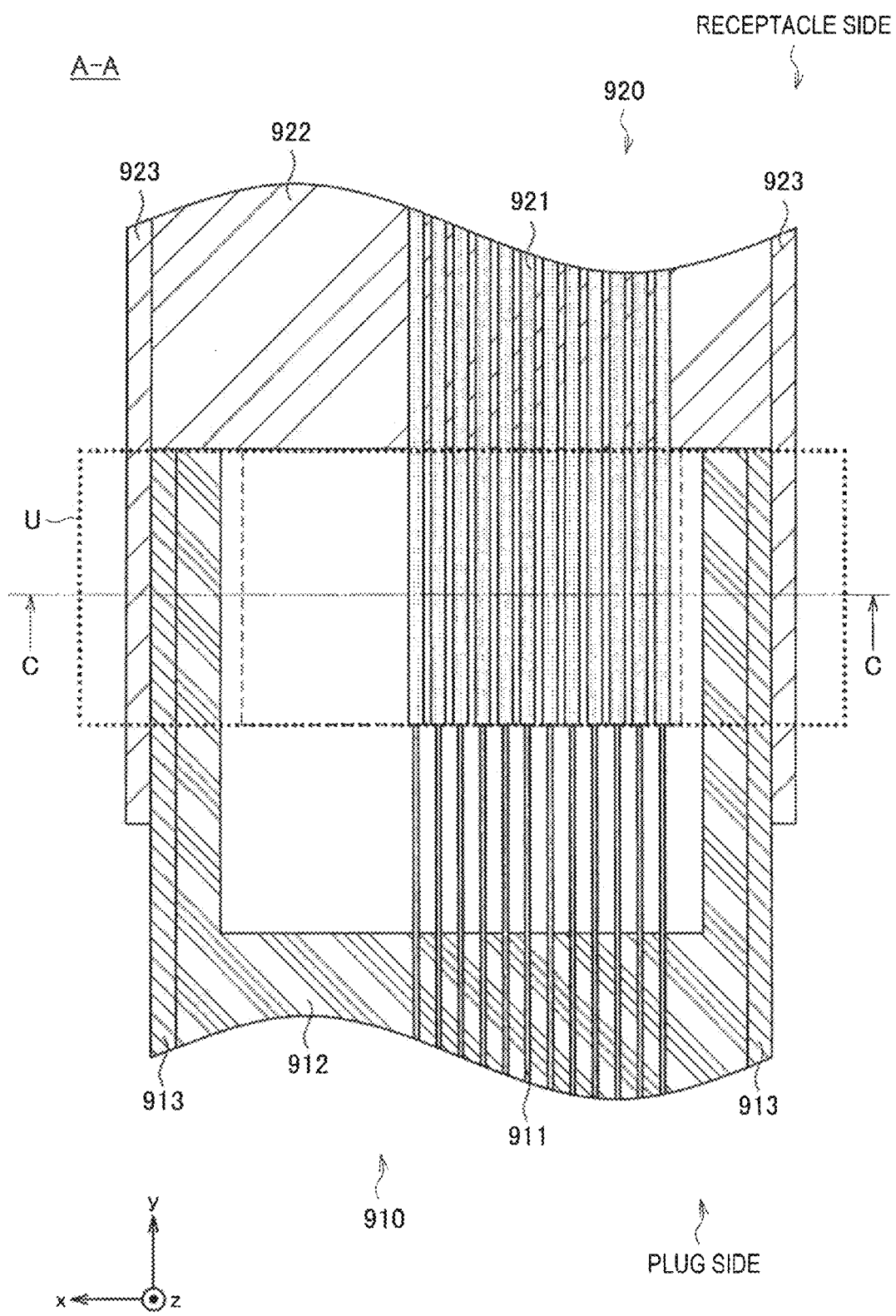

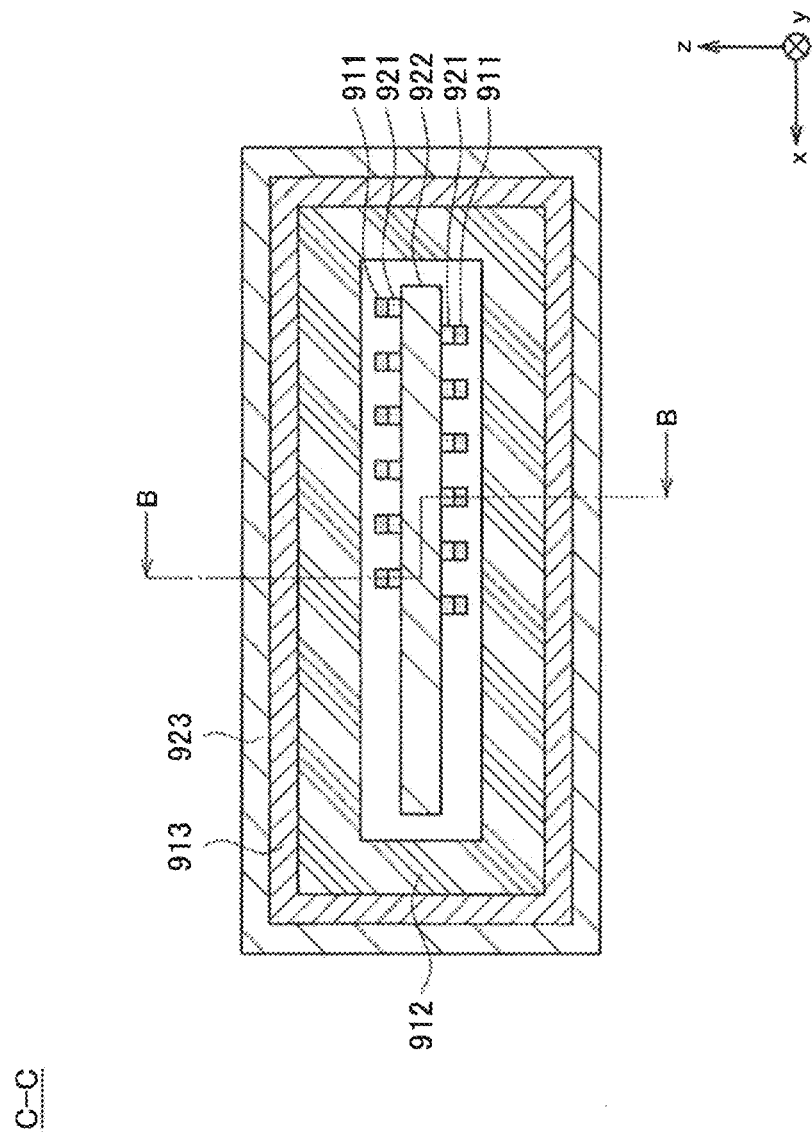

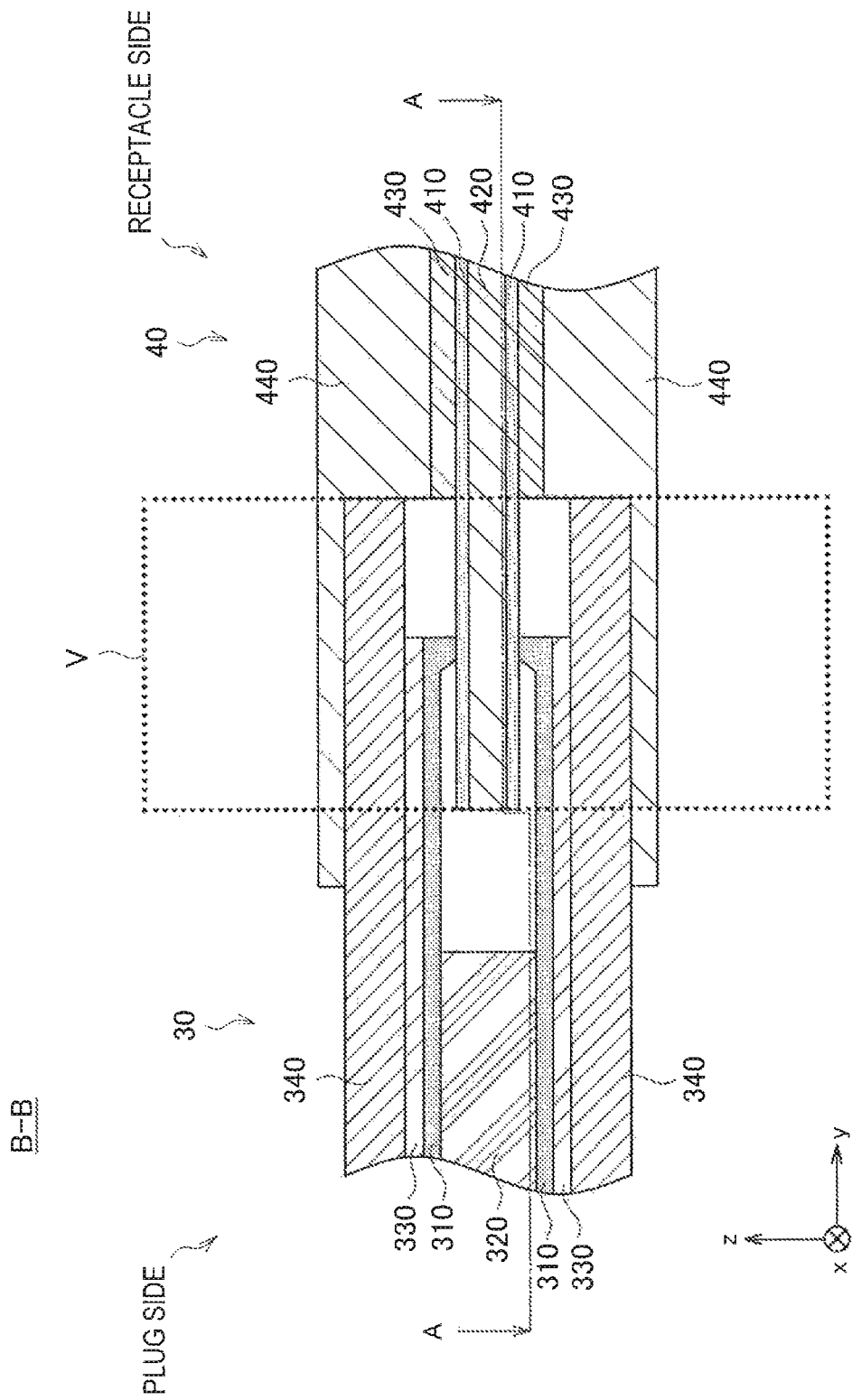

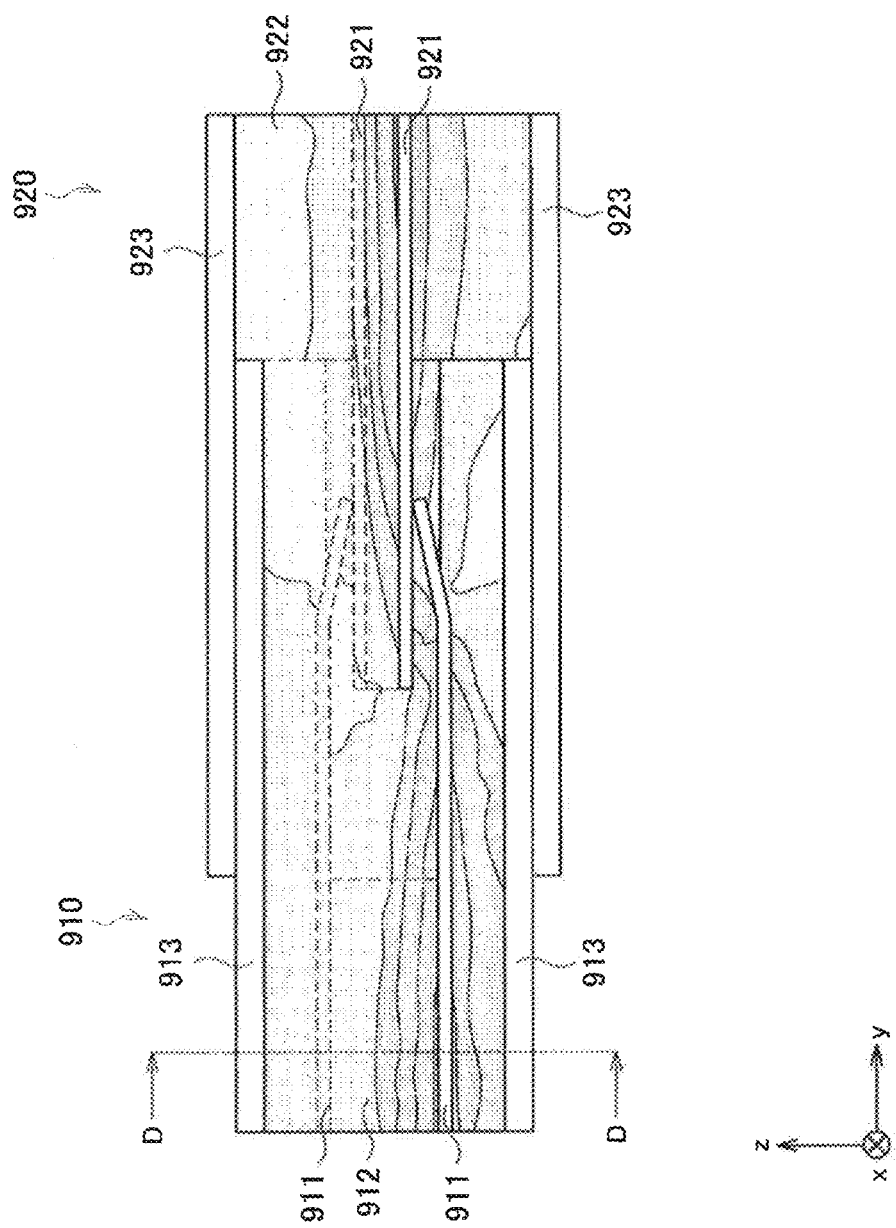

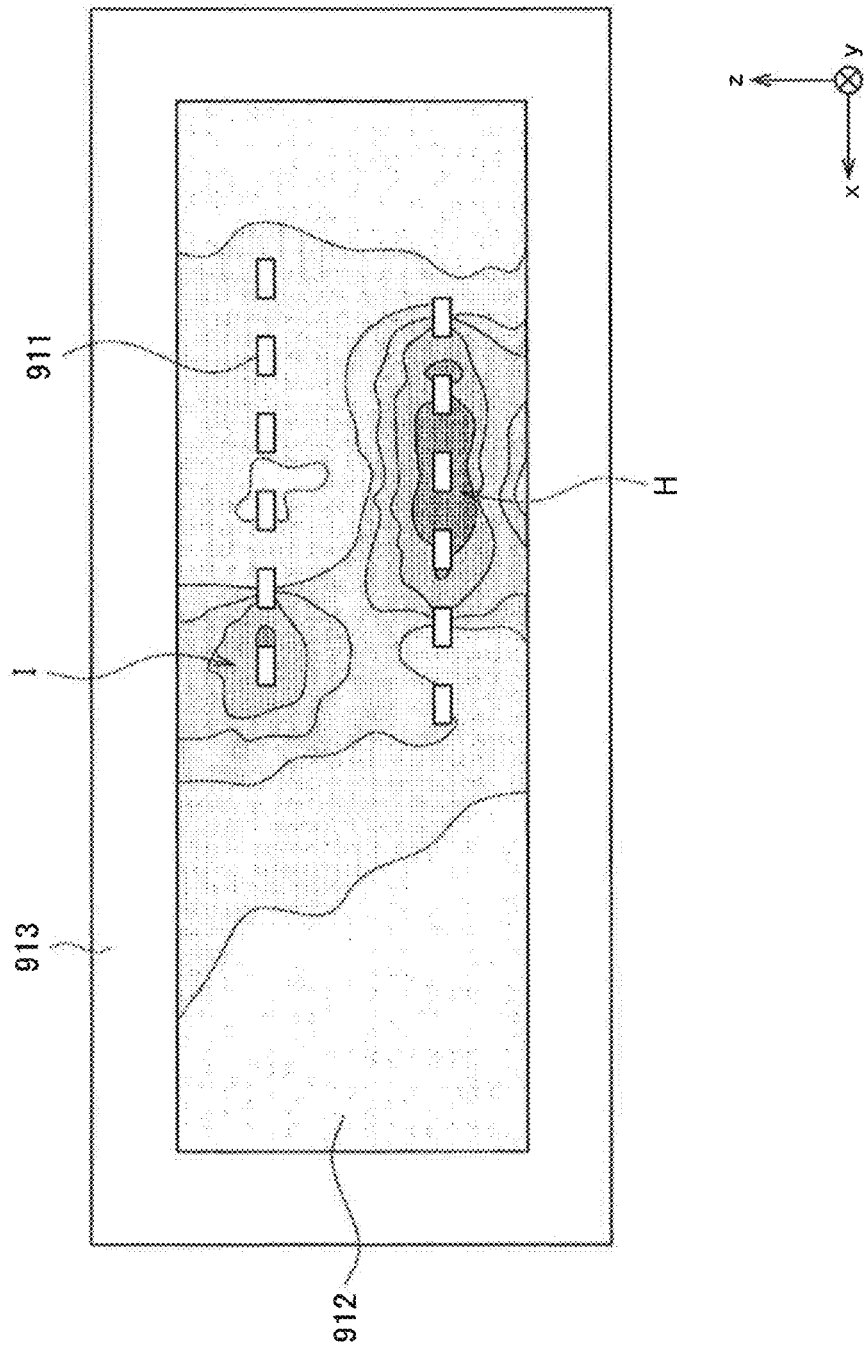

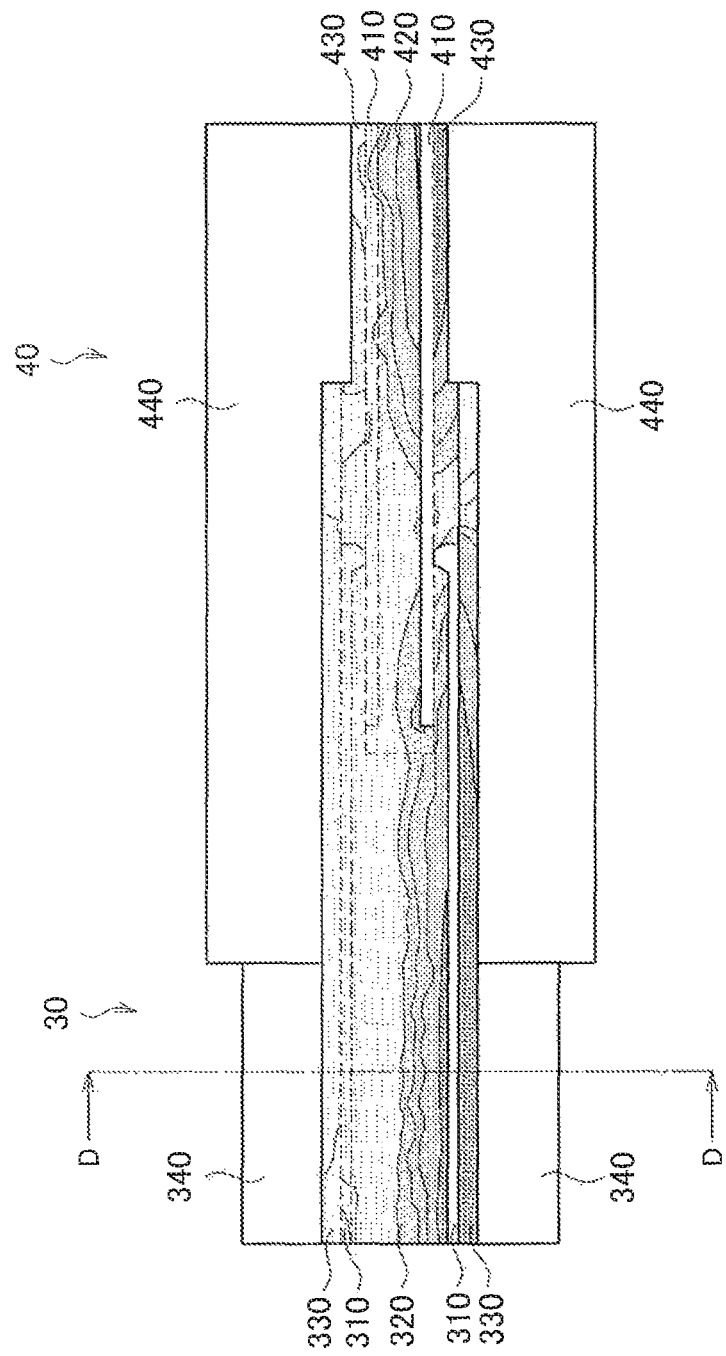

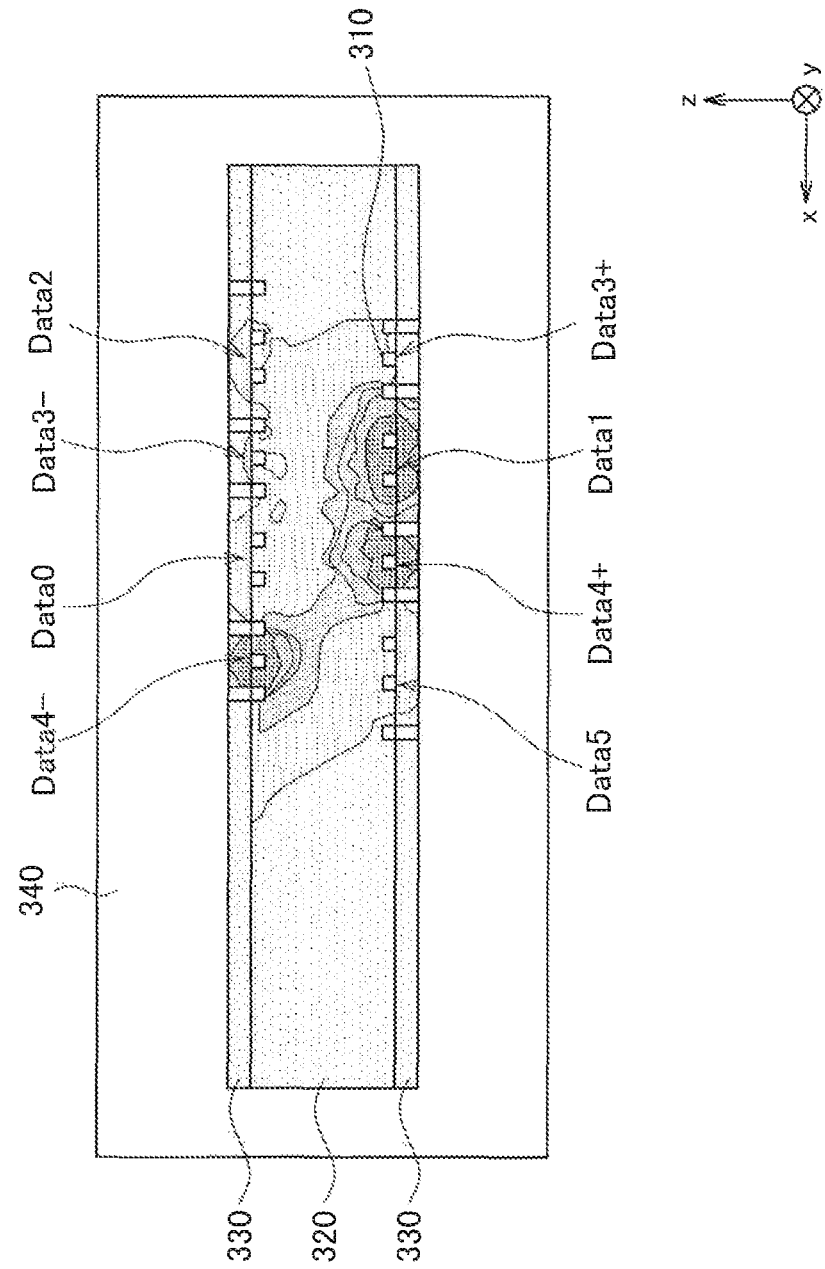

-- RELATED ART --

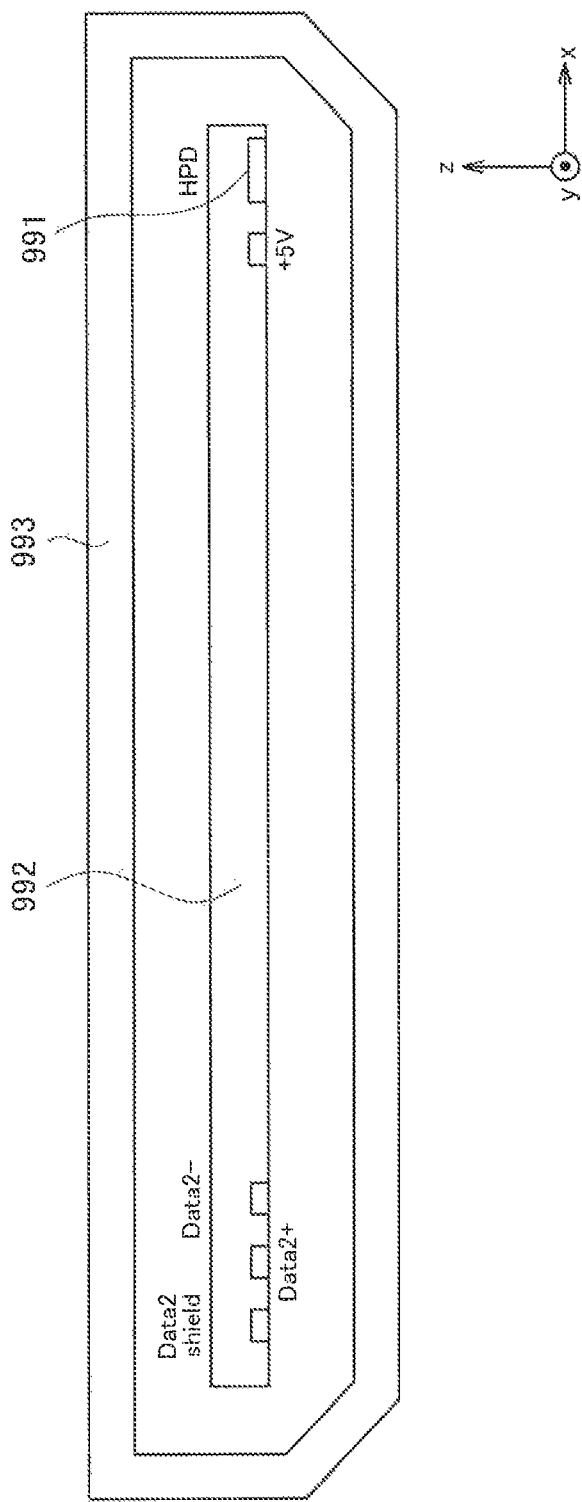

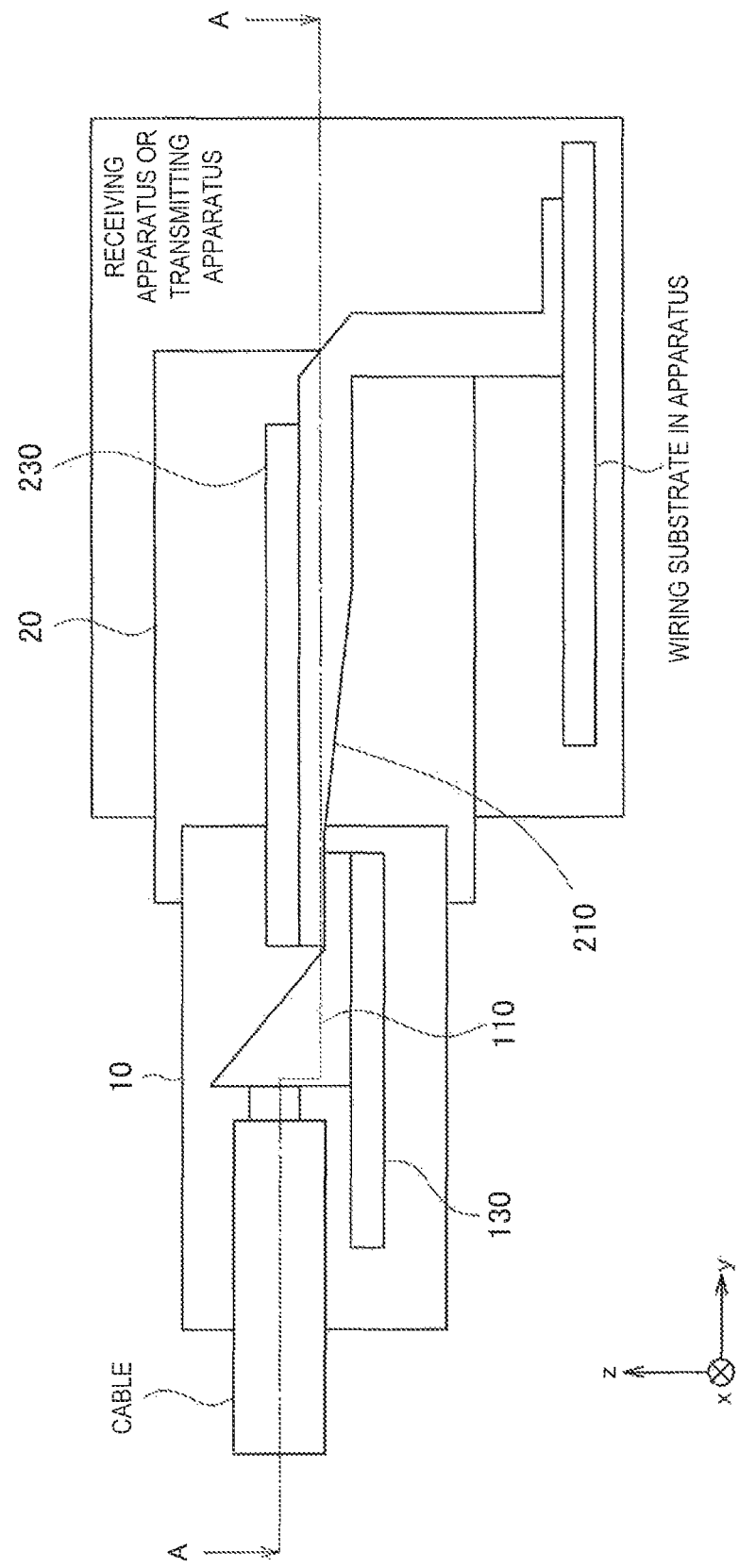

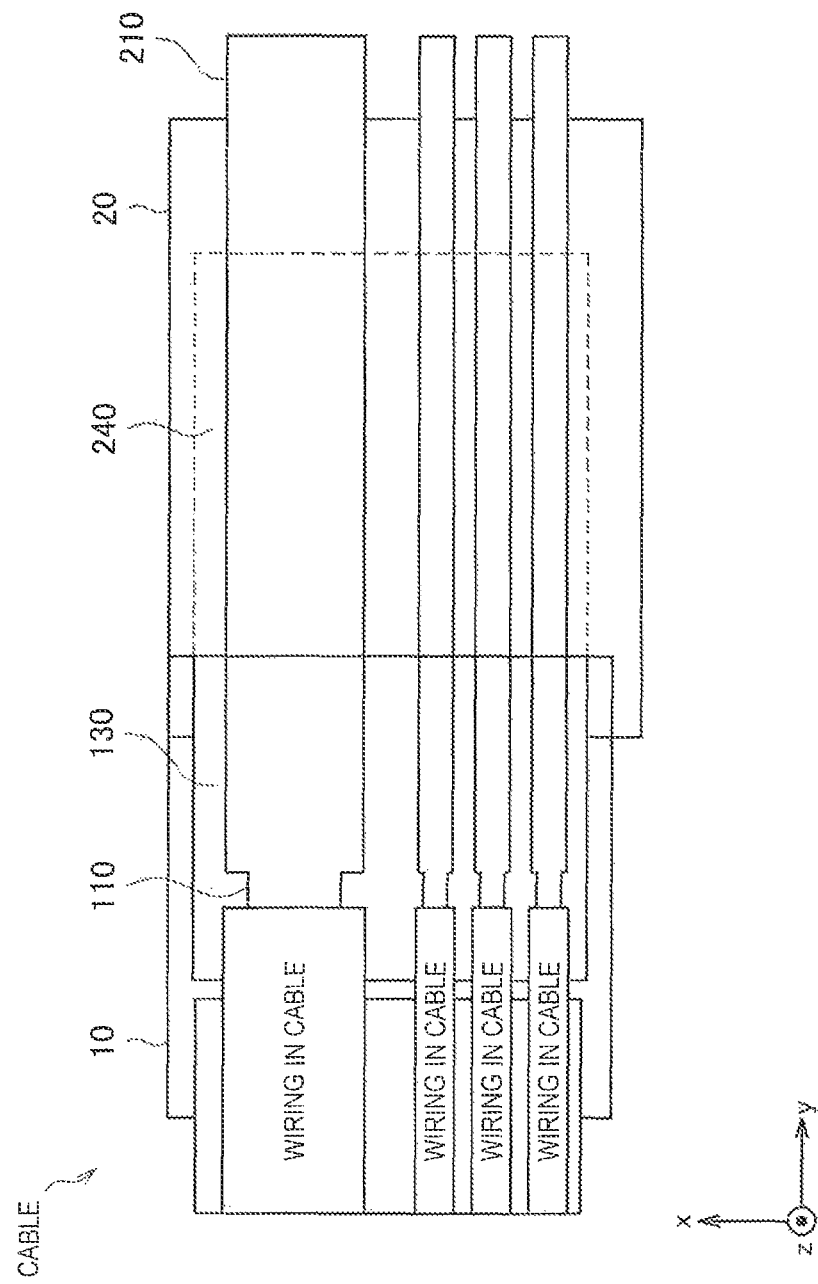

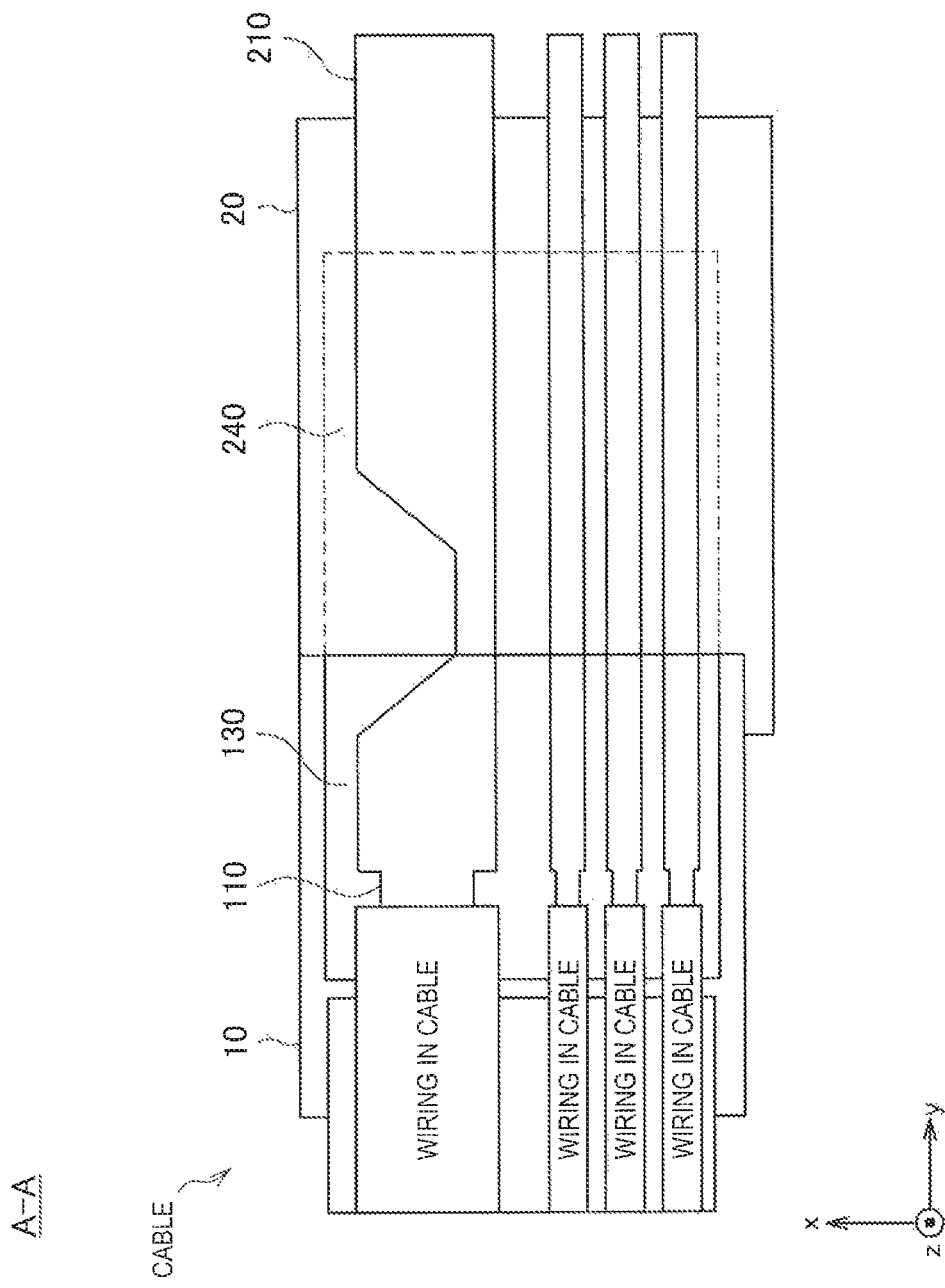

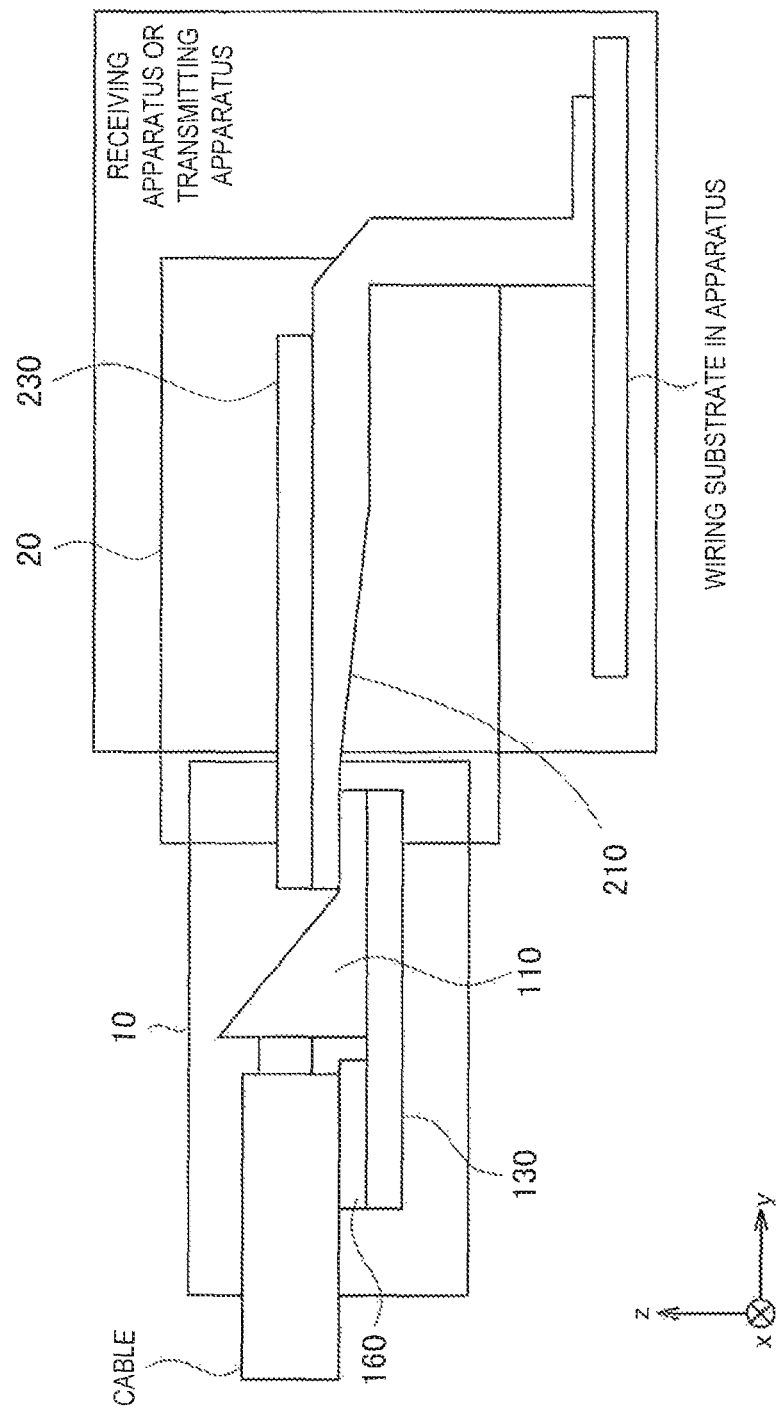

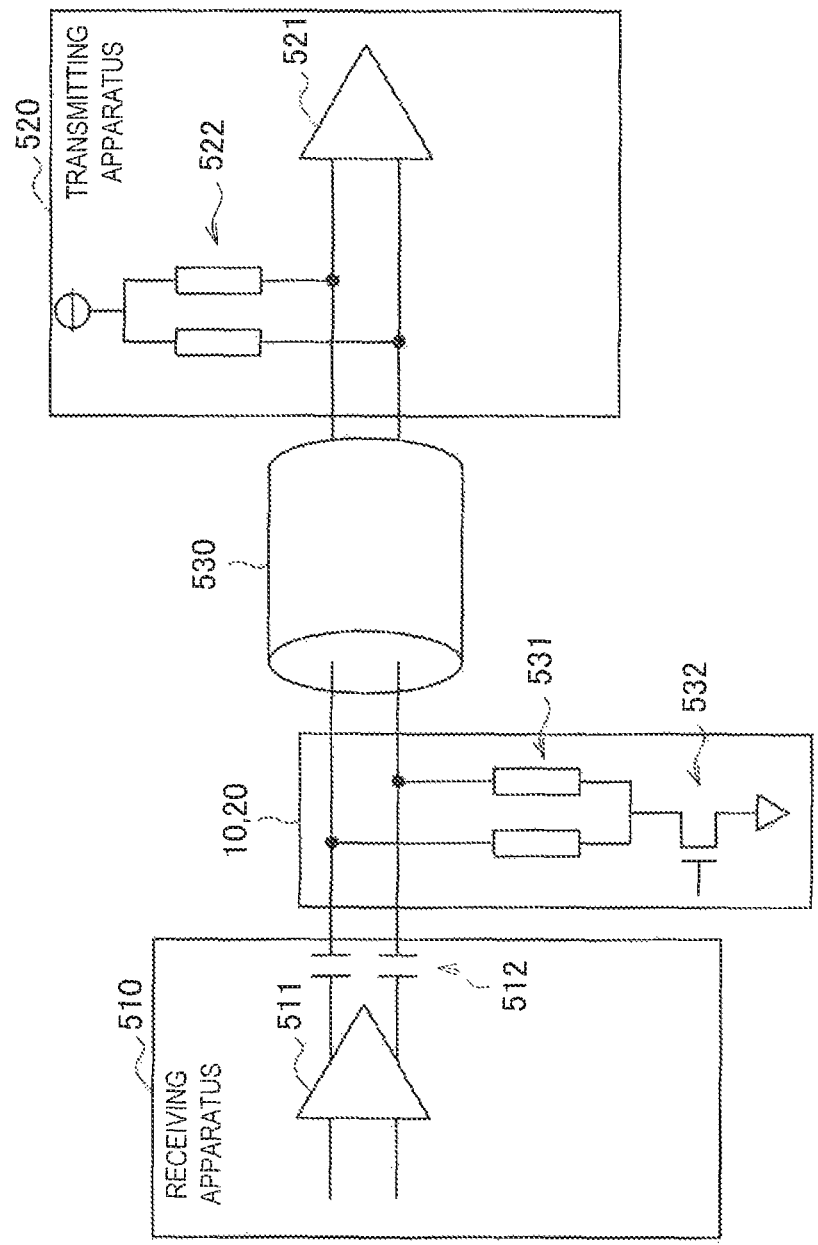

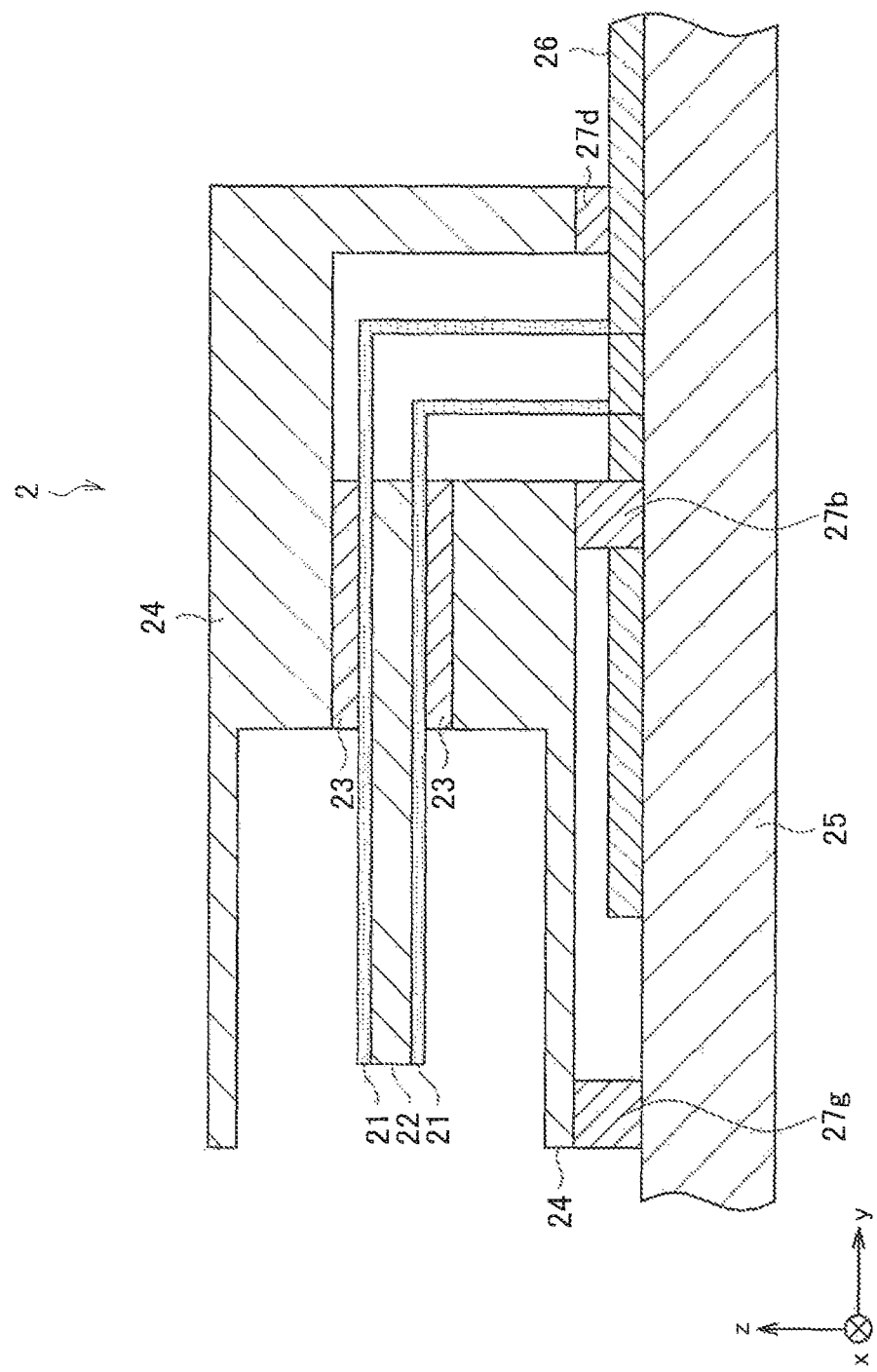

— RELATED ART —

CONNECTOR, DATA TRANSMITTING APPARATUS, DATA RECEIVING APPARATUS, AND DATA TRANSMITTING AND RECEIVING SYSTEM

CROSS REFERENCE TO PRIOR APPLICATION

This application is a National Stage Patent Application of PCT International Patent Application No. PCT/JP2014/057415 (filed on Mar. 18, 2014) under 35 U.S.C. §371, which claims priority to Japanese Patent Application No. 2013-093891 (filed on Apr. 26, 2013), which are all hereby incorporated by reference in their entirety.

TECHNICAL FIELD

The present disclosure relates to a connector, a data transmitting apparatus, a data receiving apparatus, and a data transmitting and receiving system.

BACKGROUND ART

As information-oriented society has developed in recent years, the amounts of information (amounts of data and amounts of signals) handled by information processing apparatuses such as personal computers (PCs) and servers have explosively increased. According to such increases in data amounts, the need to transfer more data at higher speeds in data transmission and reception (data transmission) performed between apparatuses has grown.

However, deterioration in signal quality in data transferring process is generally caused by increase in the data transmission amounts and increase in data transmission speed. Accordingly, a technology of reducing the deterioration in signal quality is being desired with regard to data transmission between apparatuses.

For example, Patent Literature 1 discloses a technology of reducing deterioration in signal quality by adjusting characteristic impedance of a connector mounting unit of a substrate to be connected with a connector applicable to a High-Definition Multimedia Interface (HDMI) (registered trademark) standard, according to change in thickness of the substrate, the connector transmitting digital signals.

CITATION LIST

Patent Literature

Patent Literature 1: JP 2009-129649A

SUMMARY OF INVENTION

Technical Problem

In recent years, data transmission speed increases more in data transmission between apparatuses via a connector and a cable, and effect of electromagnetic waves can no longer be ignored, the electromagnetic waves occurring when signals are transmitted by signal pins extended in the connector and the cable. Electromagnetic interference (EMI) by such electromagnetic waves deteriorates signal quality in data transmission and may cause another function of the apparatus to malfunction. For example, in an apparatus having a wireless communication function, the wireless communication function may not work well due to the electromagnetic waves, and may cause deterioration in the communication function. The technology described in Patent Literature 1 does not take sufficient measures against EMI, and may be insufficient as a technology of reducing deterioration in signal quality.

Accordingly, the present disclosure proposes a novel and improved connector, data receiving apparatus, data transmitting apparatus, and data transmitting and receiving system that are capable of reducing deterioration in signal quality.

Solution to Problem

According to the present disclosure, there is provided a connector including: a signal pin that is connected to a wiring pattern on a mounted substrate and that transmits a signal to an inside and an outside of any apparatus, the mounted substrate having an end disposed in the apparatus; and a shell that is formed of an electric conductor and grounded to ground potential on the mounted substrate, in a manner that the shell covers the signal pin in a region in which the signal pin stretches toward the mounted substrate.

According to the present disclosure, there is provided a data transmitting apparatus that transmits a signal via a connector to any apparatus, the data transmitting apparatus including: the connector including a signal pin that is connected to a wiring pattern on a mounted substrate and that transmits a signal to an inside and an outside of any apparatus, the mounted substrate having an end disposed in the apparatus, and a shell that is formed of an electric conductor and grounded to ground potential on the mounted substrate, in a manner that the shell covers the signal pin in a region in which the signal pin stretches toward the mounted substrate.

According to the present disclosure, there is provided a data receiving apparatus that receives a signal transmitted via a connector from any apparatus, the data receiving apparatus including: the connector including a signal pin that is connected to a wiring pattern on a mounted substrate and that transmits a signal to an inside and an outside of any apparatus, the mounted substrate having an end disposed in the apparatus, and a shell that is formed of an electric conductor and grounded to ground potential on the mounted substrate, in a manner that the shell covers the signal pin in a region in which the signal pin stretches toward the mounted substrate.

According to the present disclosure, there is provided a data transmitting and receiving system including: a data transmitting apparatus that transmits a signal to any apparatus via a connector including a signal pin that is connected to a wiring pattern on a mounted substrate and that transmits a signal to an inside and an outside of any apparatus, the mounted substrate having an end disposed in the apparatus, and a shell that is formed of an electric conductor and grounded to ground potential on the mounted substrate, in a manner that the shell covers the signal pin in a region in which the signal pin stretches toward the mounted substrate; and a data receiving apparatus that receives a signal transmitted from any apparatus via the connector.

According to the present disclosure, a shell is grounded to ground potential on the mounted substrate in a manner that the shell covers the signal pin in a region in which the signal pin stretches toward the mounted substrate. Accordingly, shielding effect of signal pins can be achieved, and it is possible to reduce deterioration in signal quality due to disturbance and the like with regard to signals transmitted to signal pins. In addition, in every portion of the shell, a path through which induction current generated in the shell flows out to the mounted substrate is formed. Therefore, EMI is suppressed, and it is possible to further reduce deterioration in quality of signals transmitted to the signal pins.

Advantageous Effects of Invention

As described above, according to the present disclosure, it is possible to further reduce deterioration in signal quality.

BRIEF DESCRIPTION OF DRAWINGS

FIG. 2A is a cross-sectional view showing a structural example of a general Type A receptacle-side HDMI connector or a general Type D receptacle-side HDMI connector when being cut at a plane constituted by a y axis and a z axis through signal pins.

FIG. 2B is a cross-sectional view of a general Type A receptacle-side HDMI connector or a general Type D receptacle-side HDMI connector corresponding to an I-I cross section in FIG. 2A, the I-I cross section being constituted by an x axis and the y axis.

FIG. 2C is a schematic view showing a general Type A receptacle-side HDMI connector or a general Type D receptacle-side HDMI connector shown in FIG. 2A when viewed from a positive direction of the y axis.

FIG. 3A is an explanatory diagram illustrating EMI in a receptacle-side connector of a general Type A HDMI connector or a general Type D HDMI connector.

FIG. 3B is an explanatory diagram illustrating EMI in a receptacle-side connector of a general Type A HDMI connector or a general Type D HDMI connector.

FIG. 4A is a cross-sectional view showing a structural example of a receptacle-side connector according to the embodiment when being cut at a y-z plane through signal pins.

FIG. 5B is an explanatory diagram illustrating EMI suppression effect in a receptacle-side connector 1 according to the embodiment.

FIG. 7A is a schematic view showing pin arrangement for transmitting a high-speed differential signal in a general Type C HDMI connector.

FIG. 7B is a schematic view showing an example of pin arrangement in which high-speed differential data lines are newly added in a Type C HDMI connector.

FIG. 8C is a cross-sectional view of the general Type C HDMI connectors corresponding to a C-C cross section in FIG. 3B, the C-C cross section being constituted by the x axis and the z axis.

FIG. 9A is a cross-sectional view showing a structural example of connectors according to a first modification when being cut at a cross section constituted by a y axis and a z axis through signal pins.

FIG. 9C is a cross-sectional view of the connectors according to the first modification corresponding to a C-C cross section in FIG. 4B, the C-C cross section being constituted by the x axis and the z axis.

FIG. 11A is a contour map of an electric field showing electric field distribution in a general Type C HDMI connector structure.

FIG. 11B is a contour map of an electric field showing electric field distribution in the general Type C HDMI connector structure.

FIG. 12A is a contour map of an electric field showing electric field distribution in a connector structure according to the first modification.

FIG. 15A is a cross-sectional view showing a structural example of general Type D HDMI connectors when being cut at a cross section constituted by a y axis and a z axis through signal pins.

FIG. 15B is a cross-sectional view of the general Type D HDMI connector corresponding to an A-A cross section in FIG. 15A, the A-A cross section being constituted by an x axis and a y axis.

FIG. 15C is a cross-sectional view of the general Type D HDMI connectors corresponding to a C-C cross section in FIG. 15B, the C-C cross section being constituted by the x axis and the z axis.

FIG. 16A is a cross-sectional view showing a structural example of connectors according to a second modification when being cut at a cross section constituted by a y axis and a z axis through signal pins.

FIG. 17A is a contour map of an electric field showing electric field distribution in a general Type D HDMI connector structure.

FIG. 17B is a contour map of an electric field showing electric field distribution in a general Type D HDMI connector structure.

FIG. 18A is a contour map of an electric field showing electric field distribution in a connector structure according to the second modification.

FIG. 18B is a contour map of an electric field showing electric field distribution in a connector structure according to the second modification.

FIG. 21A is a schematic view showing an example of related signal pin arrangement in a modification in which a cross-sectional area of a signal pin is expanded, the modification being one of modifications according to the present disclosure.

FIG. 21B is a schematic view showing a structural example of the connector shown in FIG. 16A when being cut at a cross section constituted by a y axis and a z axis through signal pins.

FIG. 21C is a schematic view of the connector shown in FIG. 16A corresponding to an A-A cross section in FIG. 16B, the A-A cross section being constituted by an x axis and the y axis.

FIG. 21D is a schematic view showing a modification, in which across-sectional area of a signal pin is expanded only in a region other than the fitting part, of the connector corresponding to FIG. 16C.

FIG. 22 is a schematic view showing a configuration example of a modification in which a device is provided on a substrate, the modification being one of modifications of the present disclosure.

FIG. 23A is a schematic view showing an example of a circuit configuration of an AC/DC conversion circuit that is a specific example of the device according to the modification shown in FIG. 22.

FIG. 29 is a cross-sectional view showing a structural example of a receptacle-side connector according to the second embodiment of the present disclosure when being cut at a y-z plane through signal pins.

DESCRIPTION OF EMBODIMENTS

Figure 1:
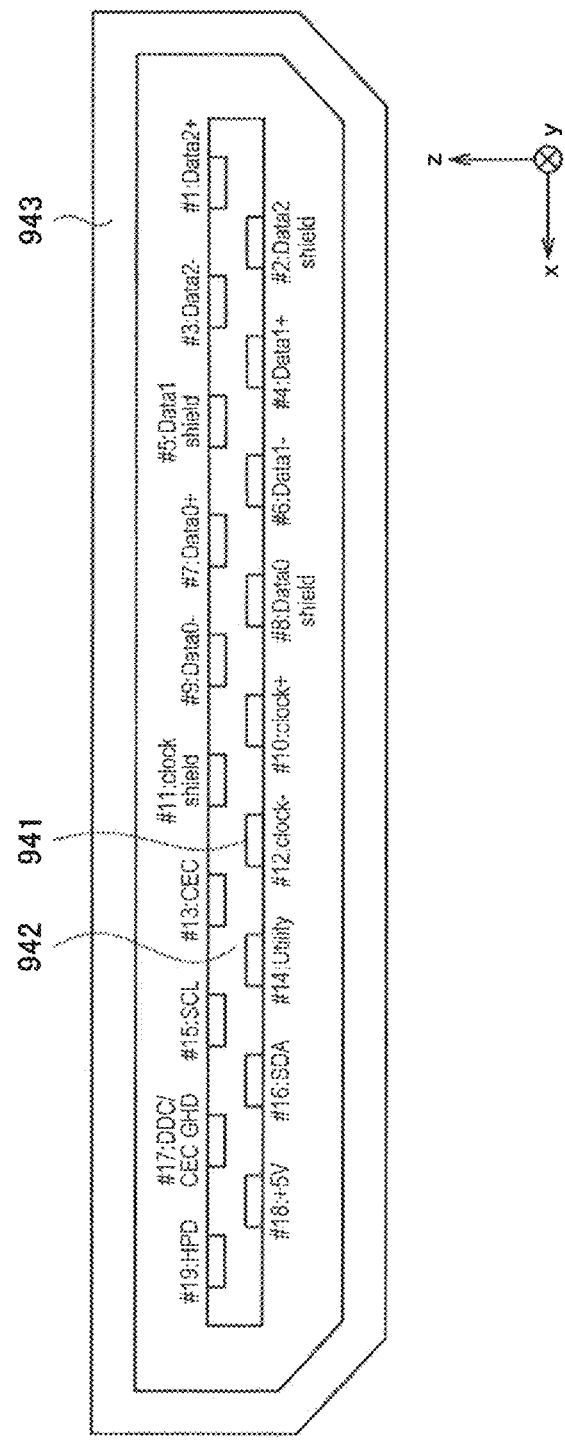
FIG. 1 is a schematic view showing pin arrangement in a general Type A HDMI connector or in a general Type D HDMI connector.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, in the following explanation, a connector (hereinafter, referred to as an HDMI connector), a data receiving apparatus, a data transmitting apparatus, and a data transmitting and receiving system that are applicable to a High-Definition Multimedia Interface (HDMI) standard are used as an example of a connector, a data receiving apparatus, a data transmitting apparatus, and a data transmitting and receiving system according to an embodiment of the present disclosure. However, the present embodiment is not limited thereto, and can be applied to a connector, a data receiving apparatus, a data transmitting apparatus, and a data transmitting and receiving system that are based on another communication method or another communication standard.

In the following explanation, the plug-side connector of a cable is referred to as a "plug-side connector" or "plug-side HDMI connector," and the receptacle-side connectors in a data receiving apparatus and a data transmitting apparatus are referred to as "receptacle-side connectors" or "receptacle-side HDMI connectors." In addition, a "connector" simply means any of a plug-side connector and a receptacle-side connector unless particularly stated. Moreover, in the following explanation, the plug-side connector has a so-called male terminal shape, and the receptacle-side connector has a so-called female terminal shape. However, the present embodiment is not limited thereto. Relation between the terminal shape of the plug-side connector and the terminal shape of the receptacle-side connector may be reversed.

Note that the description is given in the following order.
1. Study on EMI in Receptacle-side Connector
2. First Embodiment
3. Modification due to Increase in Transmission Data Amount
3.1. Study on Increase in Transmission Data Amount
3.2. First Modification
3.2.1. Configuration of General Type C Connector
3.2.2. Configuration of Connector according to First Modification
3.2.3. Comparison of Characteristic
3.3. Second Modification
3.3.1. Configuration of General Type D Connector
3.3.2. Configuration of Connector according to Second Modification
3.3.3. Comparison of Characteristic
3.4. Further Modifications of First and Second Modifications
3.4.1. Expansion of Cross-sectional Area of Signal Pin
3.4.2. Mounting of Device on Substrate
3.5. Application Example
3.5.1. CEC
3.5.2. Power Supply Control
4. Second Embodiment
4.1. Configuration of Connector according to Second Embodiment
4.2. Comparison of Characteristic
5. Conclusion <1. Study on EMI in Receptacle-side Connector>

First, a background led the present inventors to arrive at the present invention is first explained so as to clarify the present disclosure. In this item <1. Study on EMI in Receptacle-side Connector> and the following item <2. First Embodiment>, a Type A HDMI connector and a Type D HDMI connector are used as an example in explanations. Note that, the explanations in this item <1. Study on EMI in Receptacle-side Connector> and the following item <2. First Embodiment> can be applied to other types of HDMI connectors (for example, Type B HDMI connector and Type C HDMI connector), and connectors based on another communication method or another communication standard.

Recently, HDMI has been widespread as a communication interface for transmitting video signals (video data, audio data, or the like) between video devices at high speed. In communication based on the HDMI standard, a device that is a video signal source such as a disc reproduction apparatus is generally connected to a display apparatus (monitor receiver, television receiver, or the like) via an HDMI cable. Note that, in the following explanation, a device for outputting signals such as a video signal is referred to as a source device, an output apparatus, a transmitting apparatus, or the like, and a device to which the signal such as the video signal is input is referred to as a sink device, an input apparatus, a receiving apparatus, or the like.

Such as the disc reproduction apparatus and the display apparatus, demand for consumer electrics (CEs) that can handle a video with higher-quality images and higher-quality sounds has been increasing. Thus, recently, transmission of larger amount of data has been desired with regard to the video signal such as video data and audio data, when the data is transmitted on the basis of the HDMI standard.

According to the HDMI standard, an HDMI connector has 19 pins. In a general HDMI connector, 12 of the pins are used for transmitting video signals, and the other pins are used for consumer electrics control (CEC), a power source, a hot plug detector (HPD), and the like. For details of the HDMI standard including pin arrangement in a general HDMI connector, "HDMI Specification Version 1.4" can be referred, for example.

Here, details of the configuration of the receptacle-side connector are explained. First, with reference to FIG. 1, pin arrangement of a general HDMI connector is explained using a Type A HDMI connector or a Type D HDMI connector as an example. Note that, pin arrangement in the Type D HDMI connector is similar to the pin arrangement in the Type A HDMI connector.

FIG. 1 is a schematic view showing pin arrangement in a general Type A HDMI connector or in a general Type D HDMI connector. In addition, FIG. 1 shows a terminal surface of a receptacle-side HDMI connector in a receiving apparatus and a transmitting apparatus.

With reference to FIG. 1, 19 signal pins 941 are arranged in two lines in zigzag on the terminal surface of the general Type A HDMI connector or the general Type D HDMI connector, the 19 signal pins 941 being embedded in a dielectric 942 covered by an outer shell (shell) 943. In addition, to each of the signal pins 941, a different kind of signal is applied, and FIG. 1 shows the kinds of signals.

Specifically, "Data2+", "Data2Shield", and "Data2−" are allocated to the #1, #2, and #3 signal pins 941, respectively. In a similar way, "Data1+", "Data1 Shield", and "Data1−" are allocated to the #4, #5, and #6 signal pins 941, respectively. In addition, in a similar way, "Data0+", "Data0 Shield", and "Data0−" are allocated to the #7, #8, and #9 signal pins 941, respectively. "clock+", "clock Shield", and "clock−" are allocated to the #10, #11, and #12 signal pins 941, respectively.

That is, each of the data lines (Data0/1/2) and the clock is constituted by three lines including differential lines Datai+, Datai−, and Datai Shield (i=0, 1, 2). When data is transmitted, differential lines Datai+ and Datai− generate coupling between differential signals (differential coupling is generated). By using Data0/1/2, an HDMI source device transmits, to an HDMI sink device, each of digital video data sets (video data) of R (red), G (green), and B (blue) as serial data at maximum 3.425 Gbps, and pixel clock (maximum 340.25 MHz) that is 10-frequency division of the serial video data as clock.

In the HDMI connector, #1 to #12 signal pins 941 transmits video data, and a control signal and a power source are allocated to the other #3 to #19 signal pins 941. Specifically, a "Consumer Electronics Control (CEC)" signal for controlling a transmitting apparatus and a receiving apparatus is allocated to the #13 signal pin 941. "Utility" use used for backward audio signal transmission is allocated to the #14 signal pin 941.

To the #16 signal pin 941, a "serial data (SDA)" signal for reading out enhanced extended display identification data (E-EDID) information that is information on performance of the transmitting apparatus or the receiving apparatus is allocated, for example. To the #15 signal pin 941, a "serial clock (SCL)" signal that is a clock signal used for synchronization at a time of transmitting or receiving the SDA signal is allocated.

To the #17 signal pin 941, "ground of the CEC signal (CEC GND)" or "Display Data Channel (DDC)" constituted by the SDA or SCL signal used by the transmitting apparatus reading out the E-EDID information or the like from the receiving apparatus is allocated. "+5V power source" is allocated to the #18 signal pin 941. A "hot plug detector (HPD)" for detecting a connection status between the transmitting apparatus and the receiving apparatus is allocated to the #18 signal pin 941.

With reference to FIG. 1, pin arrangement of a general HDMI connector has been explained using the Type A HDMI connector or the Type D HDMI connector as an example. In the following explanations, signal pins by which differential signals are transmitted mean the #1 to #12 signal pins by which differential signals are transmitted at higher speeds than the other signal pins, unless otherwise specified.

Here, in the following description, coordinate axes are defined, and an explanation of the connector is provided. Specifically, a direction in which the signal pins are arranged on the terminal surface of the connector is defined as an x axis direction. A direction in which a pair of connectors fit with each other is defined as a y axis direction. A direction perpendicular to the x axis and the y axis is defined as a z axis direction. Note that, in the following explanations, the y axis direction is also referred to as a first direction.

With regard to positive and negative directions of the x axis, a direction in which a signal pin number becomes larger (direction from right to left in FIG. 1) is defined as positive direction of the x axis in conformity with the HDMI standard. With regard to positive and negative directions of the y axis, a direction from the plug-side connector to the receptacle-side connector (toward a plane of a paper of FIG. 1 in a direction perpendicular to the plane of the paper) is defined as a positive direction of the y axis. With regard to positive and negative directions of the z axis, a direction in which the #1 signal pin 941 is located (upper direction in FIG. 1) is defined as a positive direction of the z axis.

FIG. 1 shows pin arrangement on a terminal surface of the receptacle-side connector. In a terminal surface of the plug-side connector, signal pins 941 are arranged in an opposite manner. In other words, in the terminal surface of the plug-side connector, the #1 signal pin 941 is disposed at a left end in FIG. 1, and the #19signal pin 941 is disposed at a right end. In the receiving apparatus and the transmitting apparatus, the terminal surface (in other words, surface in the negative direction of the y axis in FIG. 1) of the receptacle-side connector shown in FIG. 1 is disposed to be opened to an outside of the apparatus. When the plug-side connector fits the terminal surface from the negative direction of the y axis, the signal pins 941 having a same number contact each other, and various data is transmitted.

In the receptacle-side connector, the signal pins 941 stretch toward the inside of the apparatus (in other words, the positive direction of the y axis in FIG. 1). These signal pins 941 are connected to the mounted substrate in the apparatus, and signals are transmitted from the mounted substrate to various circuits in the apparatus. Here, details of the configuration of the inside of the receptacle-side connector are explained with reference to FIGS. 2A to 2C.

FIG. 2A is a cross-sectional view showing a structural example of a general Type A receptacle-side HDMI connector or a general Type D receptacle-side HDMI connector when being cut at a plane (y-z plane) constituted by a y axis and a z axis through signal pins. FIG. 2B is a cross-sectional view of a general Type A receptacle-side HDMI connector or a general Type D receptacle-side HDMI connector corresponding to an I-I cross section in FIG. 2A, the I-I cross section being a plane (x-y plane) being constituted by an x axis and the y axis. FIG. 2C is a schematic view showing a general Type A receptacle-side HDMI connector or a general Type D receptacle-side HDMI connector shown in FIG. 2A when viewed from a positive direction of the y axis. In addition to the receptacle-side connector, FIGS. 2A to 2C each show the mounted substrate disposed in the transmitting apparatus and the receiving apparatus and connected to the signal pins of the receptacle-side connector. As shown in FIG. 1, in the pin arrangement of the Type A HDMI connector or the Type D HDMI connector, signal pins are arranged in two lines in the z axis direction in zigzag on the terminal surface, in the x axis direction. FIG. 2A shows the cross-sectional view (in other words, cross-sectional view of the II-II cross section shown in FIG. 2C) through a signal pin in the upper line (upper direction in the z axis direction) and a signal pin on the lower line (lower direction in the z axis direction). FIG. 2B shows all the signal pins by omitting the dielectric between the signal pins in the upper line and the signal pins in the lower line.

With reference to FIGS. 2A to 2C, the receptacle-side connector 920 of the general Type A HDMI connector or the general Type D HDMI connector includes the signal pins 921, a dielectric 922, and an outer shell (shell) 923. The signal pin 921 extends in the first direction, in other words, the y axis direction. A part of the signal pin 921 is embedded in the dielectric 922. Note that, the signal pin 921 corresponds to the signal pin 941 shown in FIG. 1.

The shell 923 covers the signal pins 921 and the dielectric 922. One surface of the shell 923 in the negative direction of the y axis is an open surface open to an outside. In addition, the shell 923 is formed of an electric conductor. A Potential of the shell 923 is fixed to the ground potential.

The plug-side connector (not shown) also includes a shell. In the shell of the plug-side connector, an open surface corresponding to the open surface of the shell 923 of the receptacle-side connector 920 is provided. An end of the shell of the plug-side connector, in which the open surface is provided, is inserted in an opening of the open surface of the shell 923 of the receptacle-side connector 920 from the negative direction of the y axis. Accordingly, the plug-side connector and the receptacle-side connector 920 are fitted. In a predetermined region near the open surface of the shell 923, the signal pin 921 includes an exposed part in which a part of a region of a surface of the signal pin 921 is exposed from the dielectric 922. When the plug-side connector and the receptacle-side connector 920 are fitted, an exposed part of the signal pin 921 contacts a signal pin of the plug-side connector. Accordingly, the plug-side connector and the receptacle-side connector 920 are electrically connected to each other. Note that, in the following (3.3.1. Configuration of General Type D Connector), details of the configurations of the plug-side connector and the receptacle-side connector of the general Type A HDMI connector and the general Type D HDMI connector are explained with reference to FIGS. 15A to 15C.

With reference to FIGS. 2A to 2C, a mounted substrate 924 connected to the signal pins 921 of the receptacle-side connector 920 is disposed in each of the transmitting apparatus and the receiving apparatus. As shown in FIGS. 2A to 2C, the signal pins 921 stretch toward the positive direction of the y axis in the transmitting apparatus and the receiving apparatus, are bent toward the mounted substrate 924 in the transmitting apparatus and the receiving apparatus, and are connected to the mounted substrate 924. Specifically, a plurality of wiring patterns 925 corresponding to the signal pins 921 are provided on the mounted substrate 924, and the signal pins 921 are connected to the wiring patterns 925 on the mounted substrate 924 in the transmitting apparatus and the receiving apparatus. The wiring patterns 925 stretch toward various circuits for performing predetermined signal processes on the mounted substrate 924 or other substrates. Various signals transmitted via the signal pins 921 are further transmitted to the predetermined circuits by the wiring patterns 925, and signal processes corresponding to the respective signals are appropriately performed in such circuits.

Between the shell 923 and the mounted substrate 924, grounding parts 926a to 926d for connecting the shell 923 to ground potential are provided. The grounding parts 926a to 926d are, for example, formed of the same dielectric as that of the shell 923, and are grounded to a region having ground potential on the mounted substrate 924. Accordingly, the locations in which the grounding parts 926a to 926d are provided represent grounding locations of the shell 923 and the mounted substrate 924. In FIG. 2B, the regions in which the grounding parts 926a to 926d are provided are indicated by dashed lines. As shown in FIG. 2B, the shell 923 is grounded to the ground potential on the mounted substrate 924 at four corers in the x-y plane in the general Type A receptacle-side HDMI connector or the general Type D receptacle-side HDMI connector.

With reference to FIGS. 2A to 2C, the structure of the general Type A receptacle-side HDMI connector and the general Type D receptacle-side HDMI connector has been explained.

As shown in FIGS. 2A to 2C, the signal pins 921 are exposed in the region in which the signal pins 921 stretch toward the mounted substrate 924 in the general receptacle-side connector 920. In such region in which the signal pins 921 are exposed, shielding effect of the signal pins 921 is not sufficient. Therefore, signals to be transmitted to the signal pins 921 are likely to be affected by disturbance and the like, and deterioration in signal quality may occur.

As explained with reference to FIG. 1, the #1 to #12 signal pins 921 and 941 transmit differential signals at relatively high speeds in the general Type A HDMI connector 920 and the general Type D HDMI connector 920. When such signal pins 921 and 941 transmit differential signals at high speeds, effect (EMI: electromagnetic interference) of electromagnetic waves accompanying the signal transmission on the signal quality can no longer be ignored.

With reference to FIGS. 3A to 3B, details of EMI in the general receptacle-side connector 920 are explained. FIGS. 3A and 3B are each an explanatory diagram illustrating EMI in the receptacle-side connector 920 of the general Type A HDMI connector or the general Type D HDMI connector. Detailed explanations of the configuration of the Type A receptacle-side connector 920 or the Type D receptacle-side connector 920 shown in FIGS. 3A and 3B are omitted since the configuration thereof is similar to the configuration of the receptacle-side connector 920 shown in FIG. 2A.

First, FIG. 3A shows an arrow representing a signal transmitted in the signal pin 921 in the lower line (lower direction in z axis direction). When the signal is transmitted in the signal pin 921 as described above, electromagnetic waves is generated by the signal transmission, and a current is generated in the shell 923 (so-called electromagnetic induction). For example, as shown in FIG. 3A, it is considered that a relatively large current (induction current) is generated at a lower portion of the shell 923 serving as a portion relatively close to the signal pin 921 among portions of the shell 923 when the signal is transmitted in the signal pin 921 in the lower line. In FIG. 3A, the induction current generated in the lower portion of the shell 923 is schematically indicated by a dashed arrow.

As described with reference to FIGS. 2A to 2C, the shell 923 is grounded to the ground potential on the mounted substrate 924 at the four corners in the x-y plane in the receptacle-side connector 920 of the general Type A HDMI connector or the general Type D HDMI connector. Accordingly, as indicated by the dashed arrow n FIG. 3A, it is considered that the induction current generated in the lower portion of the shell 923 flows to ground via the grounding parts 926b and 926c and the mounted substrate 924, and noise is hardly generated by the induction current, relatively.

On the other hand, FIG. 3B shows an arrow representing a signal transmitted in the signal pin 921 in the upper line (upper direction in z axis direction). As shown in FIG. 3B, it is considered that a relatively large induction current is generated at an upper portion of the shell 923 serving as a portion relatively close to the signal pin 921 among portions of the shell 923 when the signal is transmitted in the signal pin 921 on the upper line. In FIG. 3B, the induction current generated in the upper portion of the shell 923 is schematically indicated by a dashed arrow.

As described with reference to FIGS. 2A to 2C, the shell 923 is grounded to the ground potential on the mounted substrate 924 at the four corners in the x-y plane in the receptacle-side connector 920 of the general Type A HDMI connector or the general Type D HDMI connector. However, the upper portion of the shell 923 is not directly connected to the mounted substrate. Accordingly, as indicated by the dashed-dotted arrow n FIG. 3B, it is considered that a part of the induction current generated in the upper portion of the shell 923 is, for example, reflected by an end part of the shell 923 and flows toward the plug-side HDMI connector as a return current. Such return current may be noise when a signal is transmitted.

As explained with reference to FIGS. 3A to 3B, it is difficult to suppress the EMI and the EMI becomes a cause of deterioration in signal quality in the general Type A HDMI connector and the general Type D HDMI connector. On the basis of the above-described study, the present inventors have arrived at the connector, data receiving apparatus, data transmitting apparatus, and data transmitting and receiving system according to the present disclosure capable of suppressing EMI and reducing deterioration in signal quality more. Next, a preferred embodiments is explained in the following <2. First Embodiment>.

<2. First Embodiment>

Figure 4B:
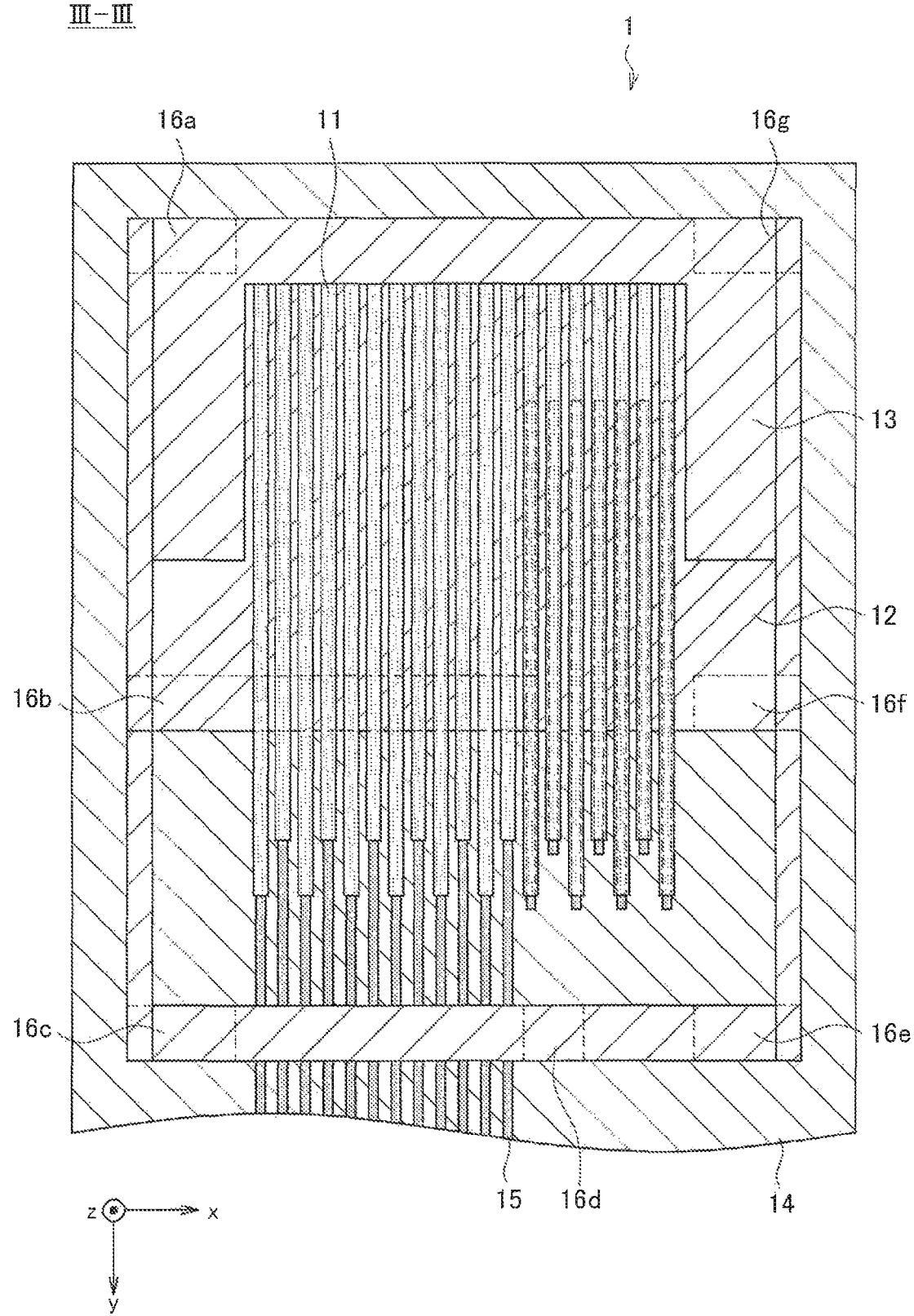
FIG. 4B is a cross-sectional view corresponding to an x-y plane of a receptacle-side connector according to the present embodiment and a III-III cross section in FIG. 4A.
Figure 4C:
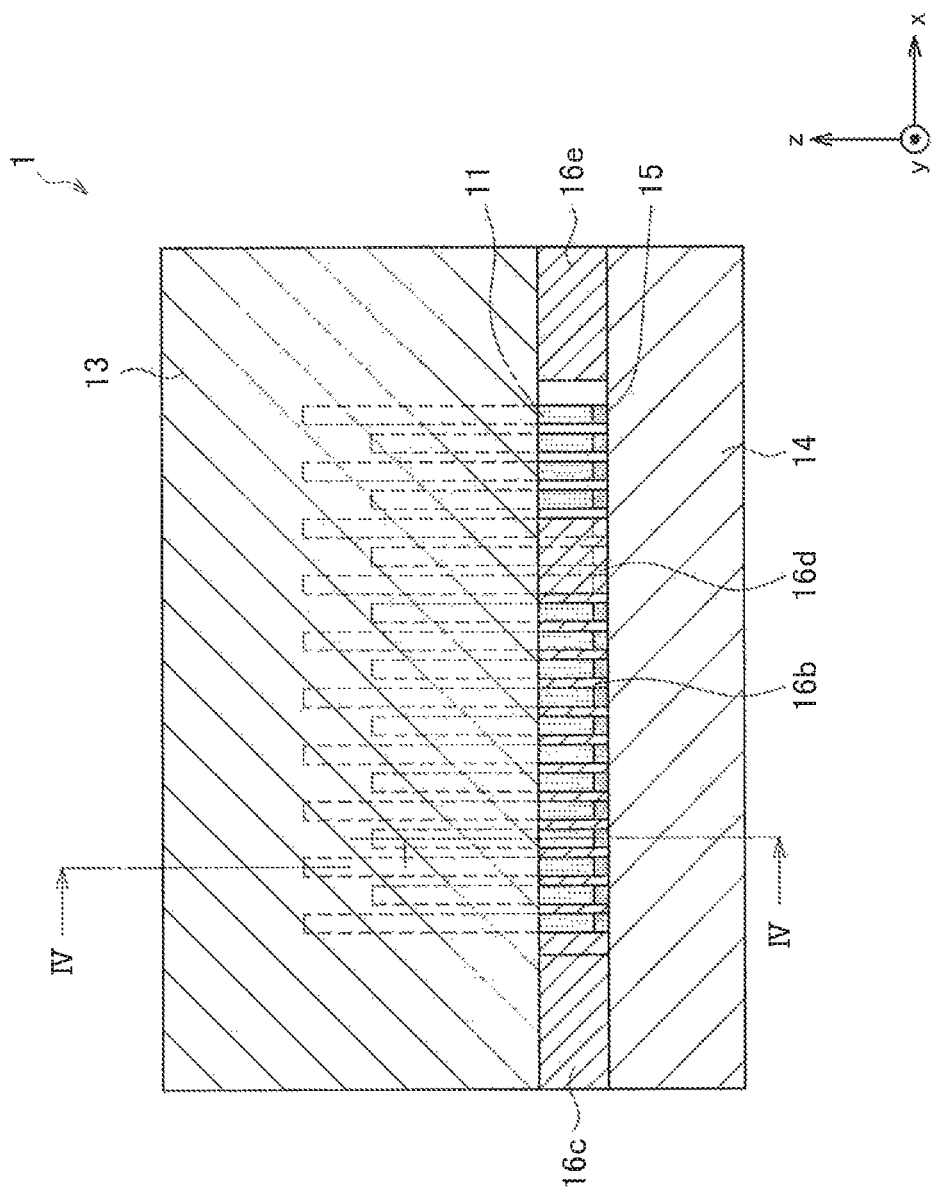
FIG. 4C is a schematic view showing a receptacle-side connector according to the embodiment shown in FIG. 4A when viewed from a positive direction of the y axis.

With reference to FIGS. 4A to 4C, a structure of a connector according to the first embodiment of the present disclosure is explained. With reference to FIGS. 4A to 4C, a structure of a Type A HDMI connector or a Type D HDMI connector is used as an example in explanations of the structure of the connector according to the first embodiment. Note that, the embodiment shown in FIGS. 4A to 4C can be applied to other types of HDMI connectors, and connectors based on another communication method or another communication standard.

FIG. 4A is a cross-sectional view showing a structural example of a receptacle-side connector according to the first embodiment when being cut at a y-z plane through signal pins. FIG. 4B is a cross-sectional view corresponding to an x-y plane of a receptacle-side connector according to the first embodiment and a III-III cross section in FIG. 4A. FIG.

4C is a schematic view showing a receptacle-side connector according to the first embodiment shown in FIG. 4A when viewed from a positive direction of the y axis. In addition to the receptacle-side connector, FIGS. 4A to 4C each show the mounted substrate disposed in the transmitting apparatus and the receiving apparatus and connected to the signal pins of the receptacle-side connector.

Note that, pin arrangement in the receptacle-side connector according to the first embodiment is similar to pin arrangement of the general Type A receptacle-side HDMI connector or the general Type D receptacle-side HDMI connector shown in FIG. 1. Accordingly, as shown in FIG. 1, on the terminal surface of the receptacle-side connector according to the first embodiment, signal pins are arranged in two lines in the z axis direction in zigzag on the terminal surface, in the x axis direction. FIG. 4A shows the cross-sectional view (in other words, cross-sectional view of the IV-IV cross section shown in FIG. 4C) through a signal pin in the upper line (upper direction in the z axis direction) and a signal pin in the lower line (lower direction in the z axis direction). FIG. 4B shows all the signal pins by omitting the dielectric between the signal pins in the upper line and the signal pins in the lower line.

With reference to FIGS. 4A to 4C, the receptacle-side connector 1 according to the first embodiment includes signal pins 11, a dielectric 12, an outer shell (shell) 13, and grounding parts 16a to 16g. Detailed explanations of functions and configurations of the signal pins 11 and the dielectric 12 in the receptacle-side connector according to the first embodiment are omitted since the functions and configurations thereof are similar to the functions and configurations of the signal pins 921 and the dielectric 922 in the general Type A receptacle-side connector 920 or the general Type D receptacle-side connector 920 explained with reference to FIGS. 2A to 2C. That is, in the receptacle-side connector 1 according to the first embodiment, a configuration of a region to be fitted with the plug-side connector is similar to the configuration of a corresponding region of the general receptacle-side connector 920. Accordingly, next, with reference to FIGS. 4A to 4C, there is mainly explained functions and configurations of the shell 13 and the grounding parts 16a to 16g that are different from those of the general receptacle-side connector 920.

As explained above, in the shell 13, a configuration of a region to be fitted with the plug-side connector (not shown) is similar to the configuration of the shell 923 of the general receptacle-side connector 920. That is, the shell 13 covers the signal pins 11 and the dielectric 12. One surface of the shell 13 in the negative direction of the y axis is an open surface open to an outside. An open surface is provided in a shell of a plug-side connector (not shown) corresponding to the open surface of the shell 13. An end of the shell of the plug-side connector (not shown), in which the open surface is provided, is inserted in an opening of the open surface of the shell 13 of the receptacle-side connector 1 from the negative direction of the y axis. Accordingly, the plug-side connector and the receptacle-side connector 1 are fitted. In a predetermined region near the open surface of the shell 13, the signal pin 11 includes an exposed part in which a part of a region of a surface of the signal pin 11 is exposed from the dielectric 12. When the plug-side connector and the receptacle-side connector 1 are fitted, the exposed part of the signal pin 11 contacts a signal pin of the plug-side connector. Accordingly, the plug-side connector and the receptacle-side connector 1 are electrically connected to each other.

With reference to FIGS. 4A to 4C, a mounted substrate 14 connected to the signal pins 11 of the receptacle-side connector 1 is disposed in each of the transmitting apparatus and the receiving apparatus. As shown in FIGS. 4A to 4C, the signal pins 11 stretch toward the positive direction of the y axis in the transmitting apparatus and the receiving apparatus, are bent toward the mounted substrate 14 in the transmitting apparatus and the receiving apparatus, and are connected to the mounted substrate 14. Specifically, a plurality of wiring patterns corresponding to the signal pins 11 are provided on the mounted substrate 14, and the signal pins 11 are connected to the wiring patterns 15 on the mounted substrate 14 in the transmitting apparatus and the receiving apparatus. The wiring patterns 15 stretch toward various circuits for performing predetermined signal processes on the mounted substrate 14 or other substrates. Various signals transmitted via the signal pins 11 are further transmitted to the predetermined circuits by the wiring patterns 15, and signal processes corresponding to the respective signals are appropriately performed in such circuits. As explained above, the signal pin 11 is connected to the wiring pattern 15 on the mounted substrate 14 and transmits a signal to an inside and an outside of any apparatus, the mounted substrate 14 having an end disposed in the apparatus.

Note that, in the first embodiment, the direction in which the wiring patterns are led out on the mounted substrate 14 is different from the direction in which the wiring patterns 925 are led out in the general receptacle-side connector 920 shown in FIGS. 2A to 2C. In the first embodiment, as shown in FIGS. 4A to 4C, the wiring patterns 15 corresponding to the 12 signal pins 11 of #1 to #12 for transmitting differential signals stretch in the positive direction of the y axis on the mounted substrate 14. The other wiring patterns 15 corresponding to the seven signal pins 11 of #13 to #19 stretch in a direction opposite to that direction, in other words, in the negative direction of the y axis, on the mounted substrate 14. Accordingly, as described below, more locations in which the shell 13 and the mounted substrate 14 are grounded are formed in the vicinity of the signal pins 11 for transmitting differential signals so that a grounding area becomes large.

With reference to FIGS. 4A to 4C, the shell 13 according to the first embodiment is formed of an electric conductor and grounded to ground potential on the mounted substrate 14, in a manner that the shell 13 covers the signal pins 11 in a region in which the signal pins 11 stretch toward the mounted substrate 14. As shown in FIGS. 2A to 2C, the signal pins 921 are exposed in the region in which the signal pins 921 stretch toward the mounted substrate 924 in the general receptacle-side connector 920. On the other hand, in the first embodiment as shown in FIGS. 4A to 4C, the shell 13 formed of the electric conductor having the ground potential covers the signal pins 11 in a region in which the signal pins 11 stretch toward the mounted substrate 14. Accordingly, shielding effect on signal pins can be achieved. In addition, the so-called microstrip structure between the signal pins 11 and the shell 13 achieves effect of controlling impedance. Therefore, it is possible to reduce deterioration in signal quality due to disturbance and the like with regard to signals transmitted to the signal pins 1.

As shown in FIGS. 4A to 4C, between the shell 13 and the mounted substrate 14 according to the first embodiment, a grounding parts 16a to 16g for connecting the shell 13 to ground potential am provided. The grounding parts 16a to 16d are, for example, formed of the same dielectric as that of the shell 13, and are grounded to a region having ground potential on the mounted substrate 14. Accordingly, the locations in which the grounding parts 16a to 16d are provided represent grounding locations of the shell 13 and the mounted substrate 14. In FIG. 4B, the regions in which the grounding parts 16a to 16g are provided are boxed by dashed lines. In the example shown in FIG. 4B, the grounding parts 16a, 16b, 16f, 16g are provided at locations corresponding to the grounding parts 926a, 926b, 926c, 926d shown in FIG. 2B, respectively. Accordingly, in comparison with the general shell 923, the shell 13 according to the first embodiment is further grounded to the mounted substrate 14 via the grounding parts 16c, 16d, and 16e. In addition, as shown in FIGS. 4A to 4C, the grounding parts 16c, 16d, and 16e are formed in a part of the region in the direction in which the wiring patterns 15 are led out on the mounted substrate (in other words, the positive direction of the y axis in FIGS. 4A to 4C), with respect to a region corresponding to a location in which the signal pins 1 and the wiring patterns are connected. As described above, in the first embodiment, the grounding parts 16a to 16g are disposed so as to include a part of the region in the direction in which the wiring patterns 15 are led out on the mounted substrate 14 (in other words, the positive direction in the y axis in FIGS. 4A to 4C) and a part of a region in a direction opposite to that direction (in other words, the negative direction of the y axis in FIGS. 4A to 4C).

Figure 5A:
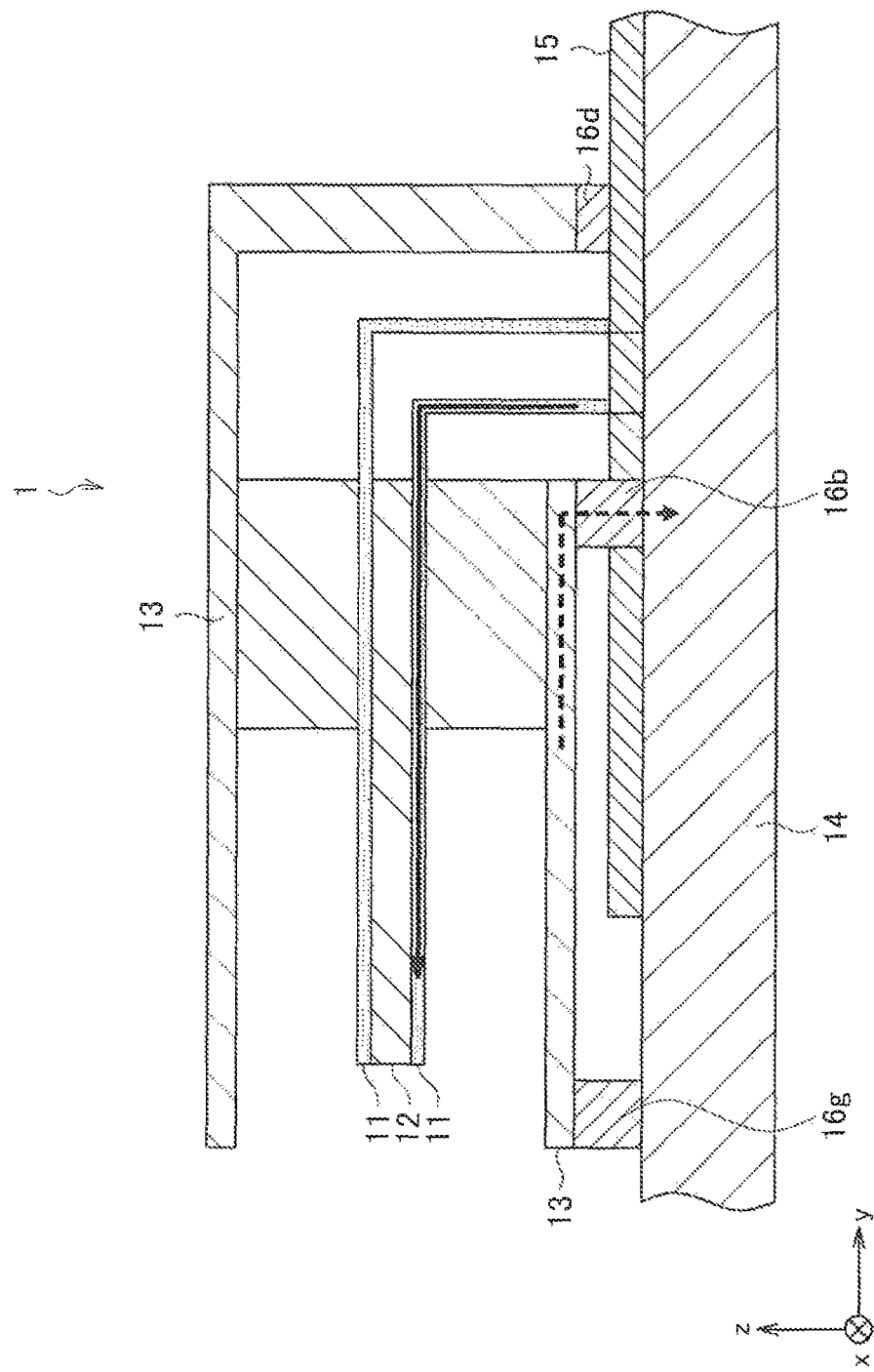
FIG. 5A is an explanatory diagram illustrating EMI suppression effect in a receptacle-side connector 1 according to the embodiment.
Figure 5C:
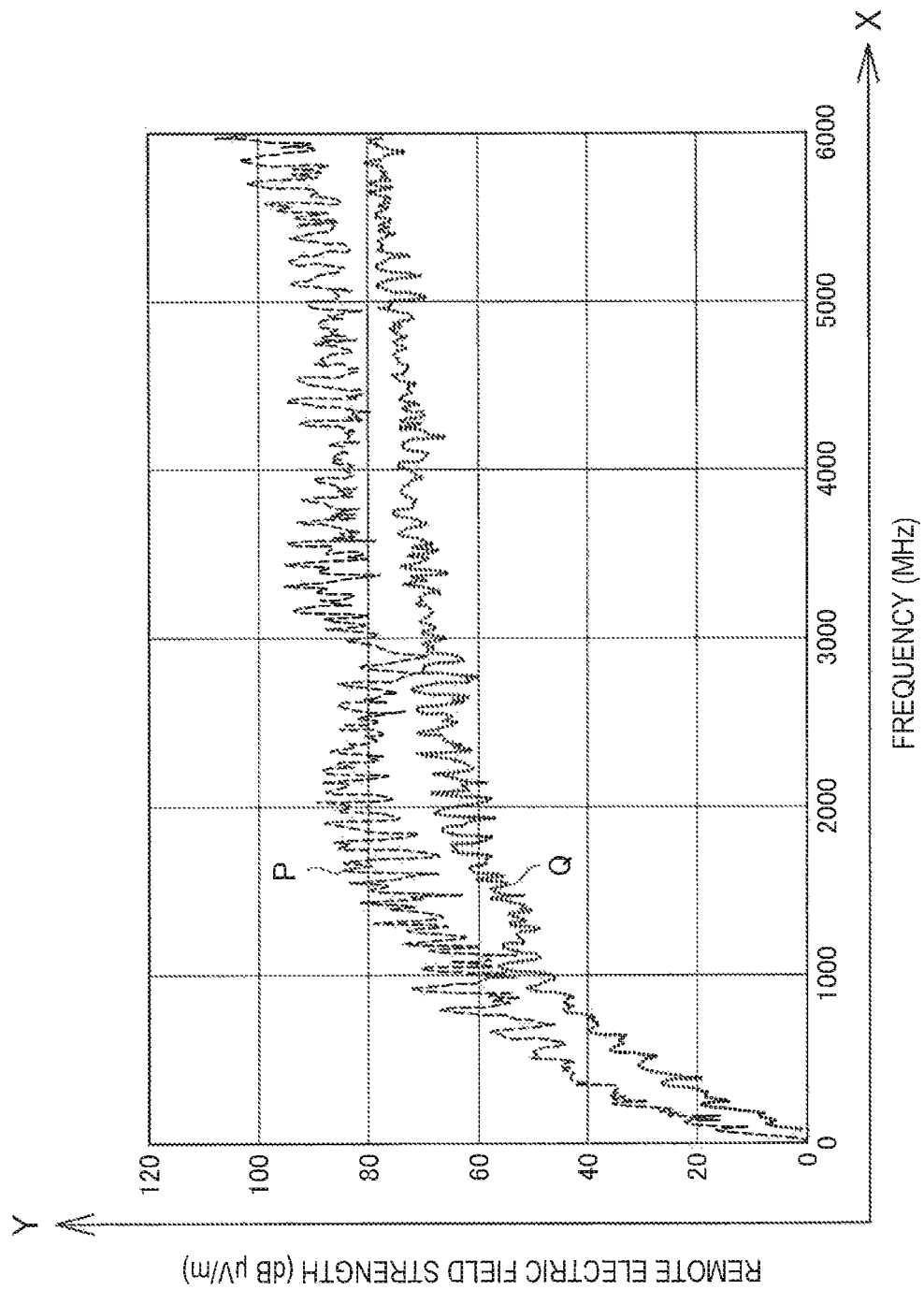
FIG. 5C is a graph showing a result of simulating EMI characteristics of a general Type A HDMI connector and a receptacle-side connector according to a first embodiment.

Here, with reference to FIGS. 5A to 5C, EMI suppression effect in the receptacle-side connector 1 according to the first embodiment is explained. First, with reference to FIGS. 5A and 5B, there is explained a principle capable of suppressing EMI and reducing deterioration in signals by the receptacle-side connector 1 according to the first embodiment. FIG. 5A and FIG. 5B are each an explanatory diagram illustrating EMI suppression effect in the receptacle-side connector 1 according to the first embodiment. Detailed explanations of a configuration of the receptacle-side connector 1 shown in FIGS. 5A and 5B is omitted since the configuration thereof is similar to the configuration of the receptacle-side connector 1 shown in FIG. 4A.

FIG. 5A is an explanatory diagram illustrating EMI in the receptacle-side connector 1 according to the first embodiment. FIG. 5A corresponds to FIG. 3A explaining the EMI in the general receptacle-side connector 920. FIG. 5A shows an arrow representing a differential signal transmitted in a signal pin 11 in the lower line (lower direction in z axis direction). When the signal is transmitted in the signal pin 11 at relatively high speeds as described above, electromagnetic waves are generated by the signal transmission, and an induction current is generated in the shell 13. For example, as shown in FIG. 5A, it is considered that a relatively large induction current is generated at a lower portion of the shell 13 serving as a portion relatively close to the signal pin 11 among portions of the shell 13 when the signal is transmitted in the signal pin 11 in the lower line. In FIG. 5A, the induction current generated in the lower portion of the shell 13 is schematically indicated by a dashed arrow.

As described with reference to FIGS. 4A to 4C, the shell 13 is grounded to the ground potential on the mounted substrate 924 at the grounding parts 16a to 16g in the receptacle-side connector 1 of the HDMI connector according to the first embodiment. Accordingly, as indicated by the dashed arrow n FIG. 5A, the induction current generated in the lower portion of the shell 13 flows to ground via the grounding parts 16b and 16f and the mounted substrate 15, and noise is hardly generated by the induction current, relatively.

On the other hand, FIG. 5B is an explanatory diagram illustrating EMI in the receptacle-side connector 1 according to the first embodiment. FIG. 5B corresponds to FIG. 3B explaining the EMI in the general receptacle-side connector 920. FIG. 5B shows an arrow representing a differential signal transmitted in a signal pin 11 in the upper line (upper direction in z axis direction). As shown in FIG. 5B, it is considered that a relatively large induction current is generated at an upper portion of the shell 13 serving as a portion relatively close to the signal pin 11 among portions of the shell 13 when the signal is transmitted in the signal pin 11 on the upper line. In FIG. 5B, the induction current generated in the upper portion of the shell 13 is schematically indicated by a dashed arrow.

Here, in the general receptacle-side connector 920, as indicated by the dashed arrow in FIG. 3B, a part of the induction current generated in the upper portion of the shell 923 is, for example, reflected by an end part of the shell 923 and flows toward the plug-side HDMI connector as a return current. Accordingly, the part of the induction current becomes a cause of noise in the signal transmission. On the other hand, as explained with reference to FIGS. 4A to 4C, the shell 13 in the receptacle-side connector 1 according to the first embodiment is formed of an electric conductor and grounded to ground potential on the mounted substrate 14, in a manner that the shell 13 covers the signal pins 11 in a region in which the signal pins 11 stretch toward the mounted substrate 14, in contrast to the general receptacle-side connector 920. Accordingly, as indicated by the dashed arrow n FIG. 5B, the induction current generated in the upper portion of the shell 13 flows to ground via the grounding parts 16c, 16d, and 16e and the mounted substrate 14, and noise is hardly generated by the induction current, relatively.

As explained with reference to FIGS. 5A and 5B, the shell 13 covers the signal pins 11 in the region in which the signal pins 11 stretch toward the mounted substrate 14 in the receptacle-side connector 1 according to the first embodiment. Accordingly, a path through which an induction current generated in the shell 13 flows out to the mounted substrate 14 is formed in every portion on the shell 13 including not only a lower portion of the shell 13 but also the upper portion. Therefore, EMI is suppressed, and it is possible to reduce deterioration in quality of signals transmitted to the signal pins 11.

Here, it is desirable that there are the locations in which the shell 13 and the mounted substrate 14 are grounded, in other words, the locations in which the grounding parts 16a to 16g are provided, as match as possible and as close as possible to the signal pins 11 and the wiring patterns 15. However, the grounding parts 16a to 16g have to be provided not to be in contact with the signal pin 11 and the wiring pattern 15, in other words, not to interfere with the connection between the signal pins 11 and the wiring patterns 15. On the other hand, as explained with reference to FIG. 1, the 190 1to #12 signal pins 11 transmits differential signals at relatively high speeds in the pin arrangement of the receptacle-side connector 1 according to the first embodiment. When the differential signals flow in the signal pins 11 at higher speeds (large frequency), the induction current is generated in the shell 13 more easily. Accordingly, in the present embodiment, the locations in which the shell 13 and the mounted substrate 14 are grounded are provided nearer to the signal pins 11 for transmitting differential signals that is supposed to generate relatively large induction currents. Therefore, the EMI suppression effect can be obtained more.

For example, the grounding location of the shell 13 may include a part of the region in the direction in which the wiring patterns 15 connected to the signal pins 11 for transmitting differential signals are led out on the mounted substrate 14 (in other words, the positive direction in the y axis in FIGS. 4A to 4C) and a part of a region in a direction opposite to that direction (in other words, the negative direction of the y axis in FIGS. 4A to 4C), with respect to the location in which the signal pins 11 and the wiring patterns 15 are connected. For example, the grounding locations in the parts of the region in the direction in which the wiring patterns 15 connected to the signal pins 11 for transmitting differential signals are led out on the mounted substrate 14 are the grounding location of the grounding parts 16c, 16d, and 16e shown in FIG. 4B. The grounding location in the parts of the region in the direction opposite to that direction are grounding locations of the grounding parts 16b and 16f shown in FIG. 4B. In this way, by providing the grounding parts 16a to 16g, the grounding locations of the shell 13 can be provided so as to sandwich the region corresponding to locations in which the wiring patterns 15 and the signal pins 11 for transmitting differential signals are connected in the y axis direction.

In addition, for example, a grounding area of the grounding location of the shell 13 in the direction in which the wiring patterns 15 are led out may be smaller than a grounding area of the grounding location of the shell 13 in a direction opposite to that direction. For example, as shown in FIG. 4B, the grounding area of the grounding part 16b may be larger than each grounding area of other grounding parts 16c, 16d, and 16e. In addition, the grounding part 16b having larger grounding area is provided in a location corresponding to the signal pins 11 for transmitting differential signals. By providing the grounding parts 16a to 16g in this way, it is possible to widen the grounding area of the shell 813 in the vicinity of the signal pins 11 for transmitting differential signals.

For example, the plurality of grounding locations of the shell 13 may be locations for sandwiching a region corresponding to a location in which the wiring patterns 15 and the signal pins 11 for transmitting differential signals are connected. For example, as shown in FIG. 4B, the grounding parts 16c, 16d, and 16e are formed so as to sandwich the region corresponding to locations in which the wiring patterns and the signal pins 11 for transmitting differential signals are connected. In this way, by providing the grounding parts 16a to 16g, the grounding locations of the shell 13 can be provided so as to sandwich the region corresponding to locations in which the wiring patterns 15 and the signal pins 11 for transmitting differential signals are connected in the x axis direction.

A computation model of the receptacle-side connector 1 having the configuration as explained above with reference to FIGS. 4A to 4B was generated to perform a simulation of EMI characteristics thereof. With reference to FIG. 5C, a comparison result of EMI characteristics between the general Type A HDMI connector and a Type A HDMI connector to which the connector structure according to the first embodiment has been applied is explained. FIG. 5C is a graph showing a result of simulating EMI characteristics of the general Type A HDMI connector and the connector according to the first embodiment. In FIG. 5C, the horizontal axis (x axis) represents frequency (MHz) of a signal applied to a signal pin, and the vertical axis (y axis) represents remote electric field strength (dBµV/m). In addition, the both relations are plotted. When a value of the remote electric field strength (dBµV/m) represented in the vertical axis is greater, effect of electromagnetic waves generated by signals transmitting in the signal pins is greater, and EMI occurs easily.

In FIG. 5, a curve of P (dashed curve) represents a graph showing a relation between frequencies (MHz) and remote electric field strength (zdBµV/m) in the general Type A HDMI connector, and a curve of Q (dotted curve) represents a graph showing a relation between frequencies (MHz) and remote electric field strength (dBµV/m) in the connector according to the first embodiment. Note that, both the simulation result of the general Type A HDMI connector and the simulation result of the connector according to the first embodiment that are shown in FIG. 5C show simulation results when signals corresponding to the general pin arrangement (that is, pin arrangement in which three sets of differential signal lines are provided) shown in FIG. 1.

With reference to FIG. 5C, values of the remote electric field strength (dBµV/m) of the connector according to the first embodiment are lower than that of the general Type A HDMI connector in all of the simulated frequencies. Thus, the EMI is suppressed and the deterioration in signals is more reduced by the connector structure according to the first embodiment. This is because, as explained with reference to FIGS. 5A to 5B, the shell 13 in the connector according to the first embodiment is formed of an electric conductor and grounded to ground potential on the mounted substrate 14, in a manner that the shell 13 covers the signal pins 11 in the region in which the signal pins 11 stretch toward the mounted substrate 14, and a return current is suppressed.

With reference to FIG. 5C, the EMI suppression effect of the receptacle-side connector 1 having the configuration shown in FIGS. 4A to 4C has been explained. However, the disposition locations and the grounding area of the grounding parts 16a to 16g in the receptacle-side connector 1 according to the present embodiment are not limited to the example shown in FIGS. 4A to 4C. The shell 13 may be grounded to the ground of the mounted substrate 14 at any locations. For example, although the example shown in FIG. 4B illustrates the grounding parts 16c and 16d sandwiching the group of signal pins 11 (12 signal pins 11 of #1 to #12) for transmitting differential signals, the present embodiment is not limited thereto. For example, the grounding parts may be provided in all or a part of the regions between the signal pins 11 for transmitting differential signals. Note that, the grounding parts 16a to 16g have to be provided not to be in contact with the signal pin 11 and the wiring pattern 15, in other words, not to interfere with the connection between the signal pins 11 and the wiring patterns 15. The disposition locations and the grounding area of the grounding parts 16a to 16g may be appropriately adjusted in accordance with shapes of the wiring patterns 15 on the mounted substrate 14. For example, in the example shown in FIGS. 4A to 4C, the wiring patterns 15 connected to the signal pins 1 for transmitting differential signals are led out on the mounted substrate 14 in one direction (positive direction in the y axis). Accordingly, it is difficult to provide the grounding parts 16a to 16g having large grounding area in the direction in which the wiring patterns 15 are led out. Therefore, the area of the grounding part 16b located in an opposite direction of the direction in which the wiring patterns 15 are led out is large. However, the present embodiment is not limited thereto. The wiring patterns 15 may be led out in any direction on the mounted substrate 14. As explained above, even in the case where the shapes of the wiring patterns 15 and the directions in which the wiring patterns 15 are led out on the mounted substrate 14 are not constant, the disposition locations and the grounding area of the grounding parts 16a to 16g may be appropriately set in accordance with the shapes and leading-out locations of the wiring patterns 15.

With reference to FIGS. 4A to 4C and 5A to 5B, the configuration of the receptacle-side connector 1 according to the first embodiment has been explained. As explained above, the shell 13 according to the first embodiment is grounded to ground potential on the mounted substrate 14, in a manner that the shell 13 covers the signal pins 11 in the region in which the signal pins 11 stretch toward the mounted substrate 14. Accordingly, shielding effect on signal pins 11 can be achieved. In addition, the so-called microstrip structure between the signal pins 11 and the shell 13 achieves effect of controlling impedance. Therefore, it is possible to reduce deterioration in signal quality due to disturbance and the like with regard to signals transmitted to the signal pins 11. In addition, in every portion of the shell 13 including not only a lower portion but also an upper portion of the shell 13, a path through which induction current generated in the shell 13 flows out to the mounted substrate 14 is formed. Therefore, EMI is suppressed, and it is possible to further reduce deterioration in quality of signals transmitted to the signal pins.

In the first embodiment, the grounding locations of the shell 13 and the mounted substrate 14 may be appropriately adjusted. For example, the grounding locations of the shell 13 and the mounted substrate 14 may be provided in a manner that the grounding locations sandwich, in the y axis direction, the region corresponding to the locations in which the signal pins 11 and the wiring patterns 15 are connected, in the direction in which the wiring patterns 15 connected to the signal pins 11 for transmitting differential signals on the mounted substrate 14 are lead out and in a direction opposite to the direction. Alternatively, the grounding locations of the shell 13 and the mounted substrate 14 may be provided in a manner that the grounding locations sandwich, in the x axis direction, the region corresponding to the location in which the wiring patterns 15 and the signal pins 11 for transmitting differential signals are connected. Alternatively, the grounding locations may be provided in a manner that the grounding area becomes large insofar as the grounding locations are not in contact with the signal pins 11 and the wiring patterns 15 (insofar as the grounding locations do not interfere with the connection between the signal pins 11 and the wiring patterns 15). Since the grounding locations of the shell 13 and the mounted substrate 14 are provided in the vicinity of the wiring patterns 15 and the signal pins 11 for transmitting differential signals and the larger grounding areas thereof are provided, a path through which induction current generated in the shell 13 by the differential signal flows out to the mounted substrate 14 is formed more certainly to further reduce deterioration in signal quality.

<3. Modification due to Increase in Transmission Data Amount>

Here, there is explained a configuration by which transmission data amounts are increased more in data transmission by an HDMI connector. First, in this item <3. Modification due to Increase in Transmission Data Amount>, a configuration by which transmission data amounts are increased more, signal characteristics in the configuration, and an additional modification and application example of the configuration are explained as a configuration different from the configuration according to the first embodiment of the present disclosure explained in <2. First Embodiment>. Next, the following item <4. Second Embodiment> explains a configuration according to a second embodiment of the present disclosure in which the configuration to be explained in this item <3. Modification due to Increase in Transmission Data Amount> is applied to the configuration according to the first embodiment of the present disclosure explained in <2. First Embodiment>.

[3.1. Study on Increase in Transmission Data Amount]

Figure 6A:
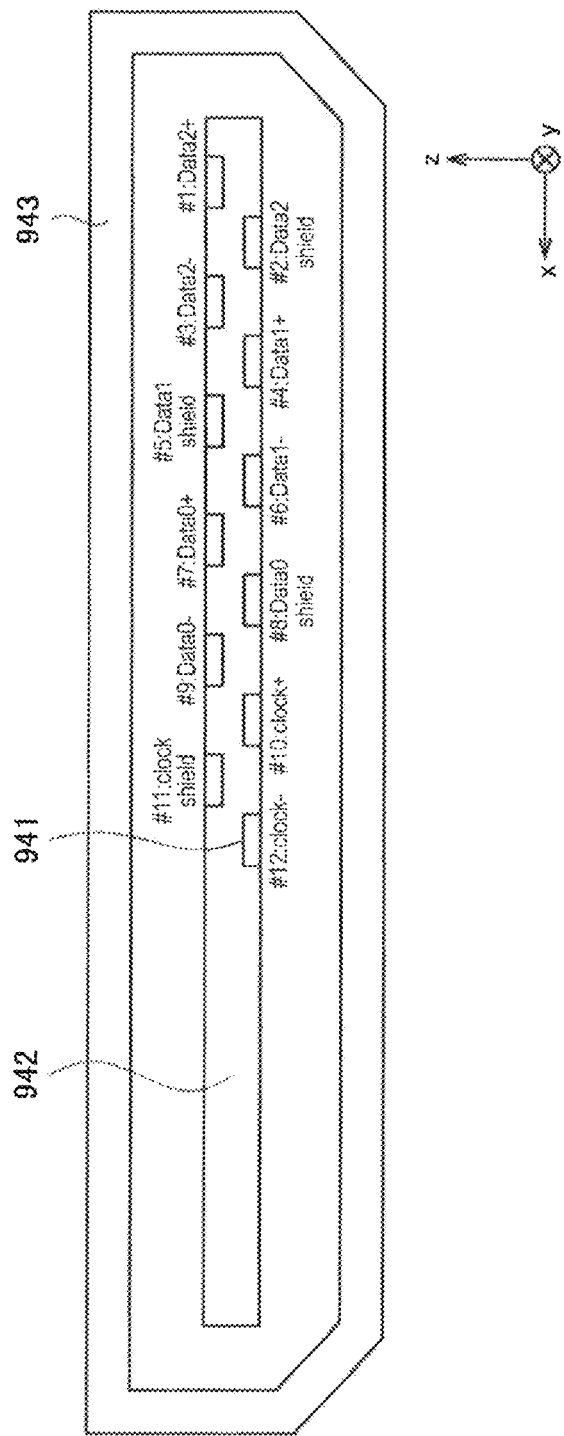
FIG. 6A is a schematic view showing pin arrangement for transmitting a high-speed differential signal in a general Type A HDMI connector or in a general Type D HDMI connector.

First, with reference to FIG. 6A, pin arrangement in a general Type A HDMI connector is explained. Note that, pin arrangement in a Type D HDMI connector is similar to the pin arrangement in the Type A HDMI connector. FIG. 6A is a schematic view showing pin arrangement for transmitting a high-speed differential signal in a general Type A HDMI connector or in a general Type D HDMI connector. Note that, the pin arrangement shown in FIG. 6A is similar to the pin arrangement explained with reference to FIG. 1. However, FIG. 6A shows only 12 signal pins relating to video signal transmission, and the other signal pins are omitted. In addition, FIG. 6A shows a terminal surface of a receptacle-side HDMI connector in an input apparatus.

With reference to FIG. 6A, signal pins 941 are arranged in two lines in zigzag on the terminal surface of the general Type A HDMI connector, the signal pins 941 being embedded in a dielectric 942 covered by an outer shell (shell) 943. To each of the signal pins 941, a different kind of signal is applied, and FIG. 6A shows the kinds of signals.

Specifically, "Data2+", "Data2 Shield", and "Data2−" are allocated to the signal pins #1, #2, and #3, respectively. In a similar way, "Data1+", "Data1 Shield", and "Data1−" are allocated to the signal pins #4, #5, and #6, respectively. In addition, in a similar way, "Data0+", "Data0 Shield", and "Data0−" are allocated to the signal pins #7, #8, and #9, respectively. In addition, "clock+", "clock Shield", and "clock−" are allocated to the signal pins #10, #11, and #12, respectively.

That is, each of the data lines (Data0/1/2) and the clock is constituted by three lines including differential lines Datai+, Datai−, and Datai Shield (i=0, 1, 2). When data is transmitted, the differential lines Datai+ and Datai− generate coupling between differential signals (differential coupling is generated). By using Data0/1/2, a HDMI source device transmits, to a HDMI sink device, each of digital video data sets (video data) of R (red), G (green), and B (blue) as serial data at maximum 3.425 Gbps, and pixel clock (maximum 340.25 MHz) that is 10-frequency division of the serial video data as clock.

Here, as a way to transmit more video signals, change in allocation of signal pins can be considered. Specifically, in FIG. 6A, it can be considered that "Data2 Shield", "Data1 Shield", and "Data0 Shield" that are signal pins used as shields of differential line (differential data lane) pairs, and "clock+", "clock−", and "clock Shield" that are signal pins for transmitting clock signals are used as signal pins corresponding to new data lines.

Figure 6B:
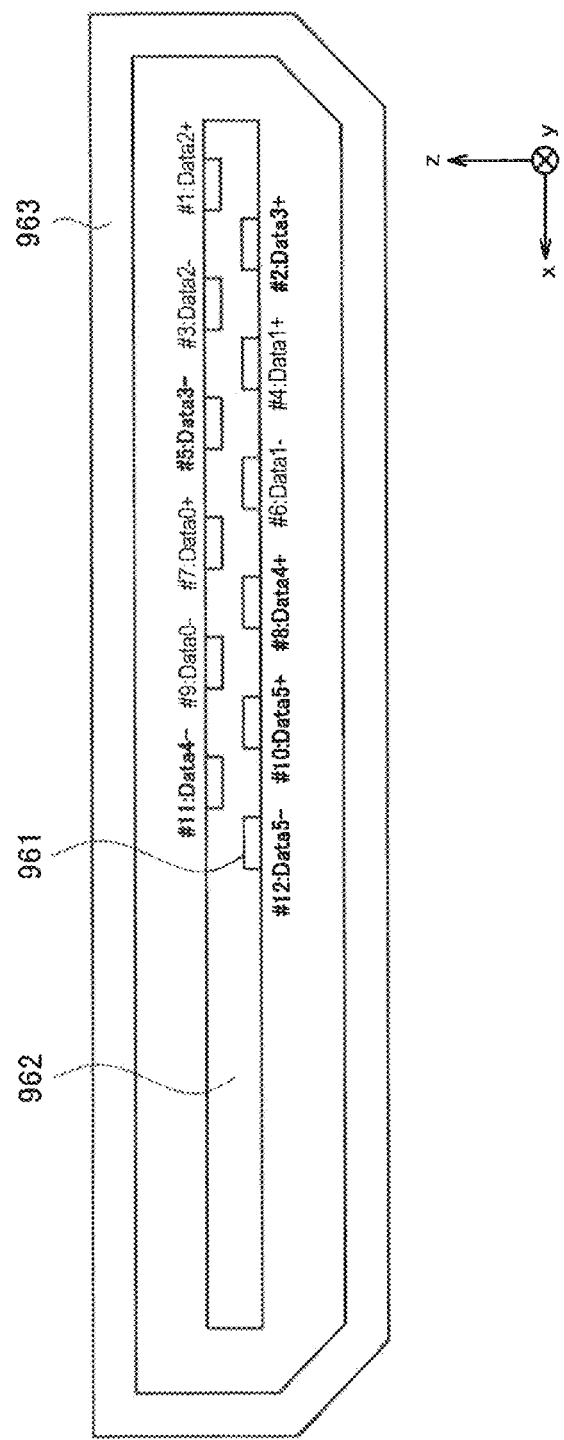
FIG. 6B is a schematic view showing an example of pin arrangement in which high-speed differential data lines are newly added in a Type A HDMI connector or in a Type D HDMI connector.

FIG. 6B shows an example of such way to change allocation of signal pins. FIG. 6B is a schematic view showing an example of pin arrangement in which high-speed differential data lines are newly added in a Type A HDMI connector or in a Type D HDMI connector.

With reference to FIG. 6B, new differential line pairs "Data3+", "Data3−", "Data4+", and "Data4−" are respectively allocated to the signal pins #2, #5, #8, and #11 that are used as the shields in FIG. 6A. In addition, a new differential line pair "Data5+" and "Data5−" are respectively allocated to the signal pins #10 and #12 that are used as the clock in FIG. 6A.

A shield of a cable can be secured by connecting a drain wire of an STP cable to a shell part of the plug-side connector and by connecting and grounding shell parts of the receptacle-side connectors of the source device and the sink device, the drain wire being connected as a shield in the general signal pin arrangement as shown in FIG. 6A. With regard to the clock, the sink device extracts bit clock from data in an individual data lane, the frequency of the extracted bit clock is divided by 10, and the sink device generates pixel clock by itself.

As explained above, by expanding the number of the differential line pairs from three to six, the data transmission amounts can be doubled while keeping the transmission speed of the individual line the same. However, signals to be transmitted may deteriorate in the pin arrangement shown in FIG. 6B.

It is because, with regard to the new defined signal pins "Data3+", "Data3−", "Data4+", and "Data4−", physical distances between the differential lines to be paired are more separated than the initial differential line pairs, as shown in FIG. 6B. Accordingly, in the new defined signal pins, coupling is less likely to occur between differential signals, and impedance mismatches may occur.

Moreover, there is no line functioning as a shield between each of the differential line pairs. Accordingly, each of the differential line pairs is likely to be affected by crosstalk from adjacent lines, and it is highly possible that signals deteriorate.

As a measure against the deterioration in signals, for example, shapes of the signal pins and positions where the signal pins are disposed in the connector are improved so as to reduce the deterioration in the signals. Specifically, for example, wiring width of the signal pins is narrowed. Accordingly, intervals between the signal pins are relatively widened, and the crosstalk effect is reduced.

Alternatively, for example, the deterioration in the signals can be reduced by stretching the signal pins near a ground conductor that constitutes a periphery of the connector and by transmitting differential signals applied to the signal pins with single end.

Here, the HDMI connectors include different types of connectors from Type A to Type E. The Type C HDMI connector and the Type D HDMI connector are referred to as a mini-HDMI connector and a micro-HDMI connector, respectively. In addition, the Type C HDMI connector and the Type D HDMI connector are smaller than a standard Type A HDMI connector. For example, an area of a terminal surface of the Type A HDMI connector is set to be 14 mm×4.5 mm, an area of a terminal surface of the Type C HDMI connector is set to be 10.5 mm×2.5 mm, and an area of a terminal surface of the Type D HDMI connector is set to be 5.8 mm×2.0 mm.

Thus, the measure against the deterioration in signals is effective in a case where a size of a connector is comparatively large like the Type A HDMI connector and shapes of signal pins and signal pin arrangement can be freely changed. However, in a case where a size of a connector is comparatively small like the Type C HDMI connector or the Type D HDMI connector, shapes of signal pins and signal pin arrangement are less freely changed, and the measure may not be sufficiently effective for reducing the deterioration in signals.

As explained above, a conclusion of the study is that a way to change allocation of signal pins in an HDMI connector can be considered for increasing the data transmission amounts. However, signals may deteriorate due to increase in the number of data lines allocated to the signal pins. It is difficult for a relatively small HDMI connector such as the Type C HDMI connector or the Type D HDMI connector to achieve sufficient effect by the way to change shapes of the signal pins or signal pin arrangement position so as to reduce the deterioration in signals. Accordingly, a more versatile way to reduce deterioration in signals has been desired, the way being applicable to more diverse types of connectors.

On the basis of the above-described study, the present inventors have arrived at the connector, data receiving apparatus, data transmitting apparatus, and data transmitting and receiving system capable of increasing the data transmission amounts and reducing deterioration in signal quality more. Next, preferred embodiments thereof are explained.

[3.2. First Modification]

First, a structure of a connector according to a first modification of the present disclosure is explained. Note that, the connector according to the first modification corresponds to a connector in which a configuration for increasing data transmission amounts and reducing deterioration in signals more is applied to the Type C HDMI connector.

The Type C HDMI connector has different signal pin arrangement position on a terminal surface from that of the Type A HDMI connector shown in FIGS. 6A and 6B. Here, with reference to FIGS. 7A and 7B, pin arrangement in the Type C HDMI connector is explained. FIG. 7A is a schematic view showing pin arrangement for transmitting a high-speed differential signal in a general Type C HDMI connector. FIG. 7B is a schematic view showing an example of pin arrangement in which high-speed differential data lines are newly added in a Type C HDMI connector. Note that, FIGS. 7A and 7B show only signal pins relating to video signal transmission, and the other signal pins are not shown. In addition, FIGS. 7A and 7B show terminal surfaces of receptacle-side connectors.

In the following explanation about pin arrangement in the Type C HDMI connector, differences from the pin arrangement in the Type A HDMI connector that has been explained with reference to FIGS. 6A and 6B are mainly explained, and detailed explanations about overlapping configuration and function are omitted.

First, with reference to FIG. 7A, signal pins 971 are embedded in a dielectric 972 covered by an outer shell (shell) 973, in a terminal surface of the general Type C HDMI connector. However, in contrast to the pin arrangement in the general Type A HDMI connector shown in FIG. 6A, the signal pins 971 are arranged in a line on the terminal surface of the general Type C HDMI connector in an x axis direction. In addition, a different kind of signal is applied to each of the signal pins 971, and FIG. 7A shows the kinds of signals.

Specifically, "Data2 Shield", "Data2+", and "Data2−" are allocated to the signal pins #1, #2, and #3, respectively. In a similar way, "Data1 Shield", "Data1+", and "Data1−" are allocated to the signal pins #4, #5, and #6, respectively. In addition, in a similar way, "Data0 Shield", "Data0+", and "Data0−" are allocated to the signal pins #7, #8, and #9, respectively. In addition, "clock Shield", "clock+", and "clock-" are allocated to the signal pins #10, #11, and #12, respectively.

That is, each of the data lines (Data0/1/2) and the clock is constituted by three lines including differential lines Datai+, Datai−, and Datai Shield (i=0, 1, 2). When data is transmitted, the differential lines Datai+ and Datai− generates coupling between differential signals (differential coupling is generated). Note that, functions of the data lines (Data0/1/2) and the clock are similar to those in pin arrangement in the general Type A HDMI connector shown in FIG. 6A. Accordingly, detailed explanation is omitted here.

Next, with reference to FIG. 7B, the number of data lines allocated to the signal pins are increased in the pin arrangement in the connector according to the first modification of the present disclosure, in comparison with the pin arrangement in the general Type C HDMI connector shown in FIG. 7A.

Specifically, new differential line pairs "Data3+", "Data3−", "Data4+", and "Data4−" are respectively allocated to the signal pins #1, #4, #7, and #10 that are used as the shields in FIG. 7A. In addition, a new differential line pair "Data5+" and "Data5−" are respectively allocated to the signal pins #11 and #12 that are used as the clock in FIG. 7A. As explained above, by expanding the number of the differential line pairs from three to six, the data transmission amounts can be doubled while keeping the transmission speed of the individual line the same. Note that, the way to secure the shields in the cable and the way to generate the clock are similar to those of the general Type A HDMI connector explained with reference to FIG. 6B. Accordingly, detailed explanation is omitted here.

With reference to FIGS. 7A and 7B, pin arrangement in the Type C HDMI connector has been explained. Here, when the pin arrangement in which the data lines are newly added as shown in FIG. 7B is applied to the Type C HDMI connector having a general connector structure, deterioration in signals occurs like the Type A HDMI connector explained in [3.1. Study on Increase in Transmission Data Amount]. On the other hand, a connector structure (to be described later) according to the first modification of the present disclosure can reduce the deterioration in signals even in a case of pin arrangement in which data lines are newly added as shown in FIG. 7B.

In order to clearly explain the structure of the connector according to the first modification, a structural example of the general Type C HDMI connector is firstly explained in (3.2.1. Configuration of General Type C Connector). Next, in (3.2.2. Structural Example of Connector according to First Embodiment), a structural example of the connector according to the first modification of the present disclosure and differences in structure from the general Type C HDMI connector are explained. Subsequently, characteristics of signals transmitted in the both structures are compared in (3.2.3. Comparison of Characteristic), and effect to reduce deterioration in signals in the connector according to the first embodiment is explained.

(3.2.1. Configuration of General Type C Connector)

Figure 8A:
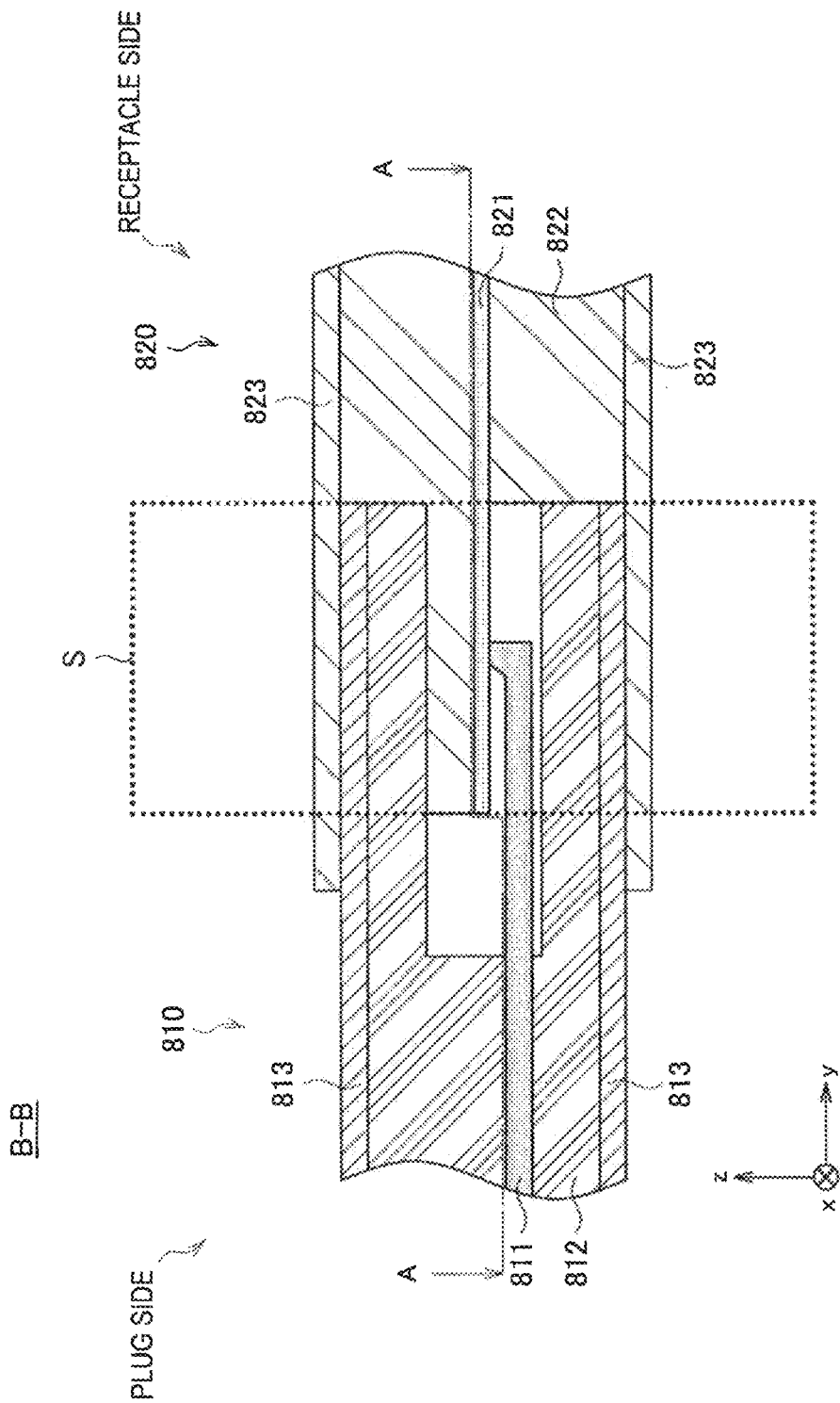
FIG. 8A is a cross-sectional view showing a structural example of general Type C HDMI connectors when being cut at a cross section constituted by a y axis and a z axis through signal pins.
Figure 8B:
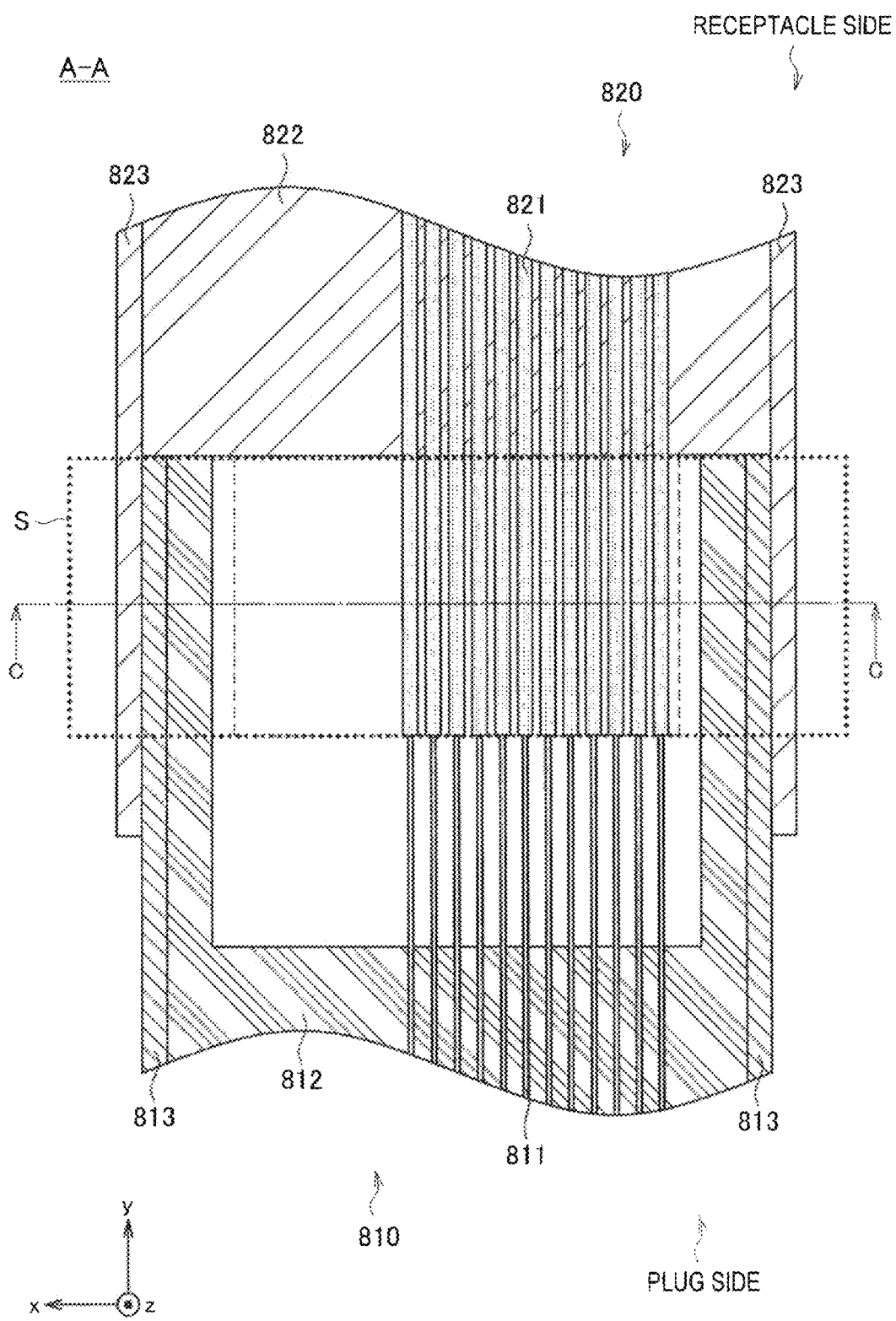
FIG. 8B is a cross-sectional view of the general Type C HDMI connectors corresponding to an A-A cross section in FIG. 3A, the A-A cross section being constituted by an x axis and the y axis.

First, with reference to FIGS. 8A to 8C, a structural example of the general Type C HDMI connectors is explained. FIG. 8A is a cross-sectional view showing a structural example of a general Type C HDMI connectors when being cut at a cross section constituted by a y axis and a z axis through signal pins. FIG. 8B is a cross-sectional view of the general Type C HDMI connectors corresponding to an A-A cross section in FIG. 8A, the A-A cross section being constituted by an x axis and the y axis. FIG. 8C is a cross-sectional view of the general Type C HDMI connectors corresponding to a C-C cross section in FIG. 8B, the C-C cross section being constituted by the x axis and the z axis. Note that, in FIGS. 8A to 8C, the plug-side connector and the receptacle-side connector are fitted with each other.

First, a structure of the plug-side connector is explained. With reference to FIGS. 8A to 8C, a plug-side connector 810 of the general Type C HDMI connector includes signal pins 811, a dielectric 812, and an outer shell (shell) 813. The signal pins 811 extend in the first direction, in other words, the y axis direction. Parts of the signal pins 811 are embedded in the dielectric 812.

The shell 813 covers the signal pins 811 and the dielectric 812. One surface of the shell 813 in the positive direction of the y axis is an open surface open to an outside. As shown in FIGS. 8A to 8C, the plug-side connector 810 and a receptacle-side connector 820 (to be described later) are connected via the open surface of the shell 813. In addition, the shell 813 is formed of an electric conductor. Potential of the shell 813 is fixed to, for example, the ground potential via the receptacle-side connector 820 (to be described later).

In a predetermined region near the open surface of the shell 813, tips of the signal pins 811 are exposed from the dielectric 812. The exposed part constitutes a protrusion protruded toward the open surface of the shell 813. When the plug-side connector 810 and the receptacle-side connector 820 (to be described later) are fitted with each other, the protrusion of the signal pins 811 contacts signal pins 821 of the receptacle side connector 820 (to be described later). Accordingly, the plug-side connector 810 and the receptacle-side connector 820 (to be described later) are electrically connected to each other. Note that, a contact part may be provided on a part of a region of the protrusion of the signal pins 811, the contact part further protruding toward the signal pins 821 of the receptacle-side connector 820. Thus, the signal pins 811 of the plug-side connector 810 and the signal pins 821 of the receptacle-side connector may contact to each other via the contact part.

Next, a structure of the receptacle-side connector is explained. With reference to FIGS. 8A to 8C, the receptacle-side connector 820 of the general Type C HDMI connector includes the signal pins 821, a dielectric 822, and an outer shell (shell) 823. The signal pins 821 extend in the first direction, in other words, the y axis direction. Parts of the signal pins 811 are embedded in the dielectric 822.

The shell 823 covers the signal pins 821 and the dielectric 822. One surface of the shell 823 in the negative direction of the y axis is an open surface open to an outside. In addition, the shell 823 is formed of an electric conductor. Potential of the shell 823 is fixed to, for example, the ground potential.

An area of an opening of the open surface of the shell 823 is slightly larger than the cross-sectional area of the open surface of the shell 813 of the plug-side connector 810. As shown in FIGS. 8A to 8C, an end provided with the open surface of the shell 813 of the plug-side connector 810 is inserted into the opening of the open surface of the shell 823 of the receptacle-side connector 820, and the plug-side connector 810 and the receptacle-side connector 820 are fitted with each other. Note that, a region indicated by a dotted line in FIGS. 8A and 8B represents a fitting part S of the plug-side connector 810 and the receptacle-side connector 820.

In a predetermined region near the open surface, the signal pins 821 include an exposed part in which parts of regions of surfaces of the signal pins 821 is exposed from the dielectric 822. When the plug-side connector 810 and the receptacle-side connector 820 are fitted with each other, the exposed part of the signal pins 821 contacts the protrusion (contact part) of the signal pins 811 of the plug-side connector 810.

With reference to FIGS. 8A to 8C, a structure of the general Type C HDMI connector has been explained.

(3.2.2. Configuration of Connector According to First Embodiment)

Figure 9B:
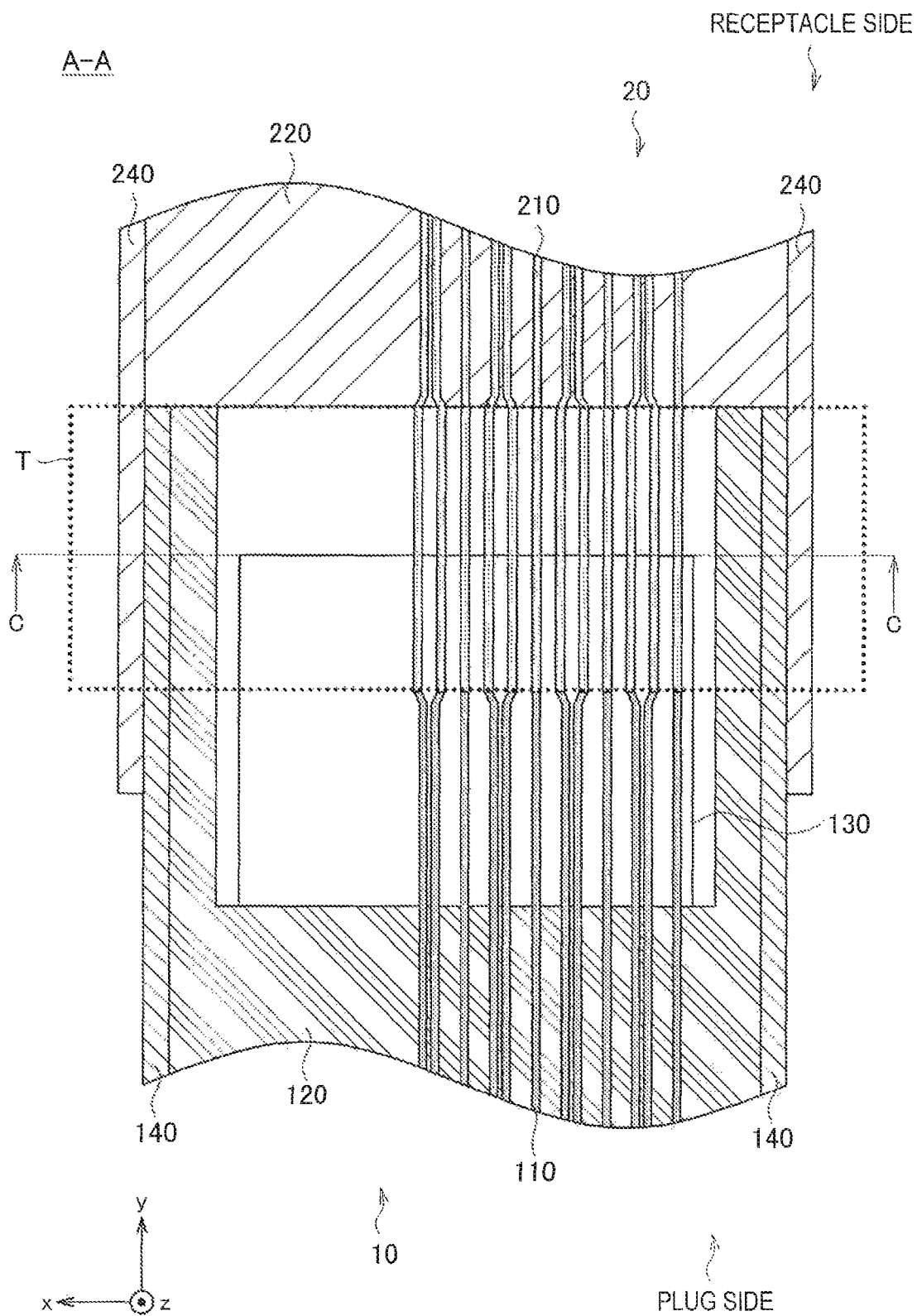
FIG. 9B is a cross-sectional view of the connectors according to the first modification corresponding to an A-A cross section in FIG. 4A, the A-A cross section being constituted by an x axis and the y axis.

Next, with reference to FIGS. 9A to 9C, a structural example of connectors according to the first modification of the present disclosure is explained. FIG. 9A is a cross-sectional view showing a structural example of connectors according to the first modification when being cut at a cross section constituted by a y axis and a z axis through signal pins. FIG. 9B is a cross-sectional view of the connectors according to the first modification corresponding to an A-A cross section in FIG. 9A, the A-A cross section being constituted by an x axis and the y axis. FIG. 9C is a cross-sectional view of the connectors according to the first modification corresponding to a C-C cross section in FIG. 9B, the C-C cross section being constituted by the x axis and the z axis. Note that, in FIGS. 9A to 9C, a plug-side connector and a receptacle-side connector are fitted with each other.

First, a structure of the plug-side connector is explained. With reference to FIGS. 9A to 9C, a plug-side connector 10 according to the first modification includes signal pins 110, a dielectric 120, a substrate 130, and an outer shell (shell) 140.

The signal pins 110 extend in a first direction, in other words, a y axis direction. In addition, the signal pins 110 are formed as a wiring pattern on a surface of the substrate 130 formed of dielectric.

The shell 140 covers the signal pins 110 and the substrate 130. One surface of the shell 140 in the positive direction of the y axis is an open surface open to an outside. As shown in FIGS. 9A to 9C, the plug-side connector 10 and a receptacle-side connector 20 (to be described later) are connected via the open surface of the shell 140. In addition, the shell 140 is formed of an electric conductor. Potential of the shell 140 is fixed to, for example, ground potential via the receptacle-side connector 20 (to be described later).

An electric conductor layer having ground potential is formed on a rear surface of the substrate 130, in other words, an opposite surface of a surface on which the signal pins 110 are formed. With reference to FIGS. 9A to 9C, according to the present embodiment, a surface of a shell 140 that faces the rear surface of the substrate is thicker than other surfaces, and is in contact with the rear surface of the substrate 130. Thus, the electric conductor layer formed on the rear surface of the substrate 130 is integrated with the shell 140. Note that, in the present embodiment, it is only necessary to form the electric conductor layer having ground potential on the rear surface of the substrate 130. The structure of the electric conductor layer is not limited to the above example. Accordingly, the surface of the shell 140 is not necessarily thickened. For example, the electric conductor layer formed on the rear surface of the substrate 130 may be electrically connected to the shell 140 through a via hole or the like.

In addition, the dielectric may be stacked above (in positive direction of the z axis) the signal pins 110 formed on the substrate 130. Note that, when the dielectric 120 is formed, the dielectric 120 does not cover the entire surfaces of the signal pins 110, and parts of regions of the signal pins 110 are exposed in a predetermined region near the open surface of the shell 140. When the plug-side connector 10 and the receptacle-side connector 20 (to be described later) are fitted with each other, the exposed parts of the signal pins 110 of the plug-side connector contact signal pins 210 (wiring pattern) of the receptacle side connector 20. Accordingly, the plug-side connector 10 and the receptacle-side connector 20 (to be described later) are electrically connected to each other. Note that, contact parts may be provided on parts of regions of the exposed parts of the signal pins 110, the contact parts protruding toward the signal pins 210 of the receptacle-side connector 20. Thus, the signal pins 110 of the plug-side connector 10 and the signal pins 210 of the receptacle-side connector 20 may contact to each other via the contact parts.

Next, a structure of the receptacle-side connector is explained. With reference to FIGS. 9A to 9C, the receptacle-side connector 20 according to the first modification includes signal pins 210, a dielectric 220, a substrate 230, and an outer shell (shell) 240.

The signal pins 210 extend in a first direction, in other words, the y axis direction. In addition, the signal pins 210 are formed as a wiring pattern on a surface of the substrate 230 formed of dielectric.

The shell 240 covers the signal pins 210 and the substrate 230. One surface of the shell 240 in the negative direction of the y axis is an open surface open to an outside. In addition, the shell 240 is formed of an electric conductor. Potential of the shell 240 is fixed to, for example, ground potential.

An area of an opening of the open surface of the shell 240 is slightly larger than the cross-sectional area of the open surface of the shell 140 of the plug-side connector 10. As shown in FIGS. 9A to 9C, an end provided with the open surface of the shell 140 of the plug-side connector 10 is inserted into the opening of the open surface of the shell 240 of the receptacle-side connector 20, and the plug-side connector 10 and the receptacle-side connector 20 are fitted with each other. Note that, regions indicated by dotted lines in FIGS. 9A and 9B represent a fitting part T of the plug-side connector 10 and the receptacle-side connector 20.

An electric conductor layer having ground potential is formed on a rear surface of the substrate 230, in other words, an opposite surface of a surface on which the signal pins 210 are formed. With reference to FIGS. 9A to 9C, according to the present embodiment, a surface of a shell 240 that faces the rear surface of the substrate 230 is thicker than other surfaces, and is in contact with the rear surface of the substrate 230. Thus, the electric conductor layer formed on the rear surface of the substrate 230 is integrated with the shell 240. Note that, in the present embodiment, it is only necessary to form the electric conductor layer having ground potential on the rear surface of the substrate 230. The structure of the electric conductor layer is not limited to the above example. Accordingly, the surface of the shell 240 is not necessarily thickened. For example, the electric conductor layer formed on the rear surface of the substrate 230 may be electrically connected to the shell 240 through a via hole or the like.

In addition, the dielectric 220 may be stacked above (in positive direction of the z axis) the signal pins 210 formed on the substrate 230. Note that, when the dielectric 220 is formed, parts of regions of the signal pins 210 are exposed in a predetermined region near the open surface of the shell 240. The exposed parts of the signal pins 210 of the receptacle-side connector 20 contact the exposed parts and/or the contact parts of the signal pins 110 (wiring pattern) of the receptacle side connector 10. Accordingly, the plug-side connector 10 and the receptacle-side connector 20 are electrically connected to each other.

With reference to FIG. 9B, among the signal pins 110 of the plug-side connector 10 and the signal pins 210 of the receptacle-side connector, intervals between pairs of the signal pins 110 and 210 that transmit differential signals and adjacently extend are shorter than intervals from other signal pins 110 and 210 adjacent to the pairs of the signal pins 110 and 210. Note that, the intervals of the signal pins 110 and the intervals of the signal pins 210 may be identical in the fitting part T. On the other hand, in a region other than the fitting part T, the intervals between the pairs of the signal pins 110 and 210 that transmit the differential signal and adjacently extend may be shorter than the intervals from other signal pins 110 and 210 adjacent to the pairs of the signal pins 110 and 210.

The wiring intervals between the signal pins 110 and the wiring intervals between the signal pins 210 in the fitting part T may be similar to the wiring intervals of the signal pins 811 and the wiring intervals of the signal pins 821 in the fitting part S shown in FIGS. 8A to 8C. Thus, the signal pins of the connector according to the first modification and the signal pins of the general Type C HDMI connector may have identical wiring intervals in the fitting parts.

As explained with reference to FIGS. 9A to 9C, the connector according to the first modification and the general Type C HDMI connector are different as follows: The connector according to the first modification are formed of the dielectric, and includes signal pins (wiring pattern corresponding to the signal pins) on one surface and the substrate, in which the electric conductor layer having the ground potential is formed, on the other surface. In addition, among the signal pins in the connector according to the first modification, the intervals between pairs of the signal pins that transmit the differential signals and adjacently extend are shorter than the intervals from other signal pins adjacent to the pairs of the signal pins. Next, effects of the connector according to the first modification achieved due to such configuration are explained.

As explained above, in the connectors 10 and 20 according to the first modification, signal pins 110 and 210 are formed on the substrates 130 and 230 formed of the dielectric, and the electric conductor layers having the ground potential are formed on the opposite sides of the surfaces of the substrates 130 and 230 on which the signal pins 110 and 210 are formed. Accordingly, the connectors according to the first modification have configurations in which ground planes (electric conductor layers), dielectric layers (substrate 130 and 230), and wiring (signal pins 110 and 210) are stacked in this order. According to such configurations, an electromagnetic field due to current (signal) flowing in the signal pins 110 and 210 is trapped between the substrates 130 and 230 and the electric conductors, and the so-called microstripline (microstrip structure) is formed. Thus, in the connector according to the first modification, it is possible to reduce effects of the current (signal) flowing through the signal pins 110 and 210 on other signal pins 110 and 210, and the deterioration in signals can be reduced.

In addition, as explained above, among the signal pins 110 and 210 in the connectors 10 and 20 according to the first modification, intervals between pairs of the signal pins 110 and 210 that transmit differential signals and adjacently extend may be shorter than intervals from other signal pins 110 and 210 adjacent to the pairs of the signal pins 110 and 210. Since the intervals between pairs of signal pins 110 and 210 that transmit differential signals to be paired are narrowed more, an electromagnetic field due to current (signal) flowing in the pairs of the signal pins 110 and 210 is trapped between the pairs of signal pins 110 and 210 and between the substrates 130 and 230 and the electric conductors, and so-called differential stripline (differential strip structure) is formed. Note that, a return path of the differential coupling is secured on the ground plane at a rear surface of the wiring surface. Accordingly, since the coupling is generated between the differential data lines, it is possible to narrow the wiring width and the wiring intervals between the signal pins, while the differential impedance is maintained. Thus, intervals from a different kind of adjacent signal wiring can be widened. Accordingly, the crosstalk can be reduced and signal quality can be improved. Thus, in the connectors according to the first modification, it is possible to further reduce effects of the current (signal) flowing through the pair of the signal pins 110 and 210 that transmit a differential signal, on other signal pins 110 and 210. In addition, the deterioration in signals can be reduced more.

Note that, in a case where the pin arrangement shown in FIG. 7B in which the data lines are newly added is applied to the connector according to the first modification, signal pins to which a pair of differential signals "Data3+" and "Data3−", and a pair of differential signals "Data4+" and "Data4−" are allocated are not arranged at positions where the pairs of the differential signals are next to each other, from among the newly added pairs of the differential signals. Thus, in the connector according to the first modification, pairs of adjacent signal pins to which a "Data0" and "Data0−" pair, a "Data1+" and "Data1−" pair, a "Data2+" and "Data2−" pair, and a "Data5+" and "Data5−" pair are applied transmit signals using the differential striplines. On the other hand, pairs of nonadjacent signal pins to which a "Data3+" and "Data3−" pair and a "Data4+" and "Data4−" pair are applied transmit signals using single-ended microstriplines.

In addition, as explained above, the connector according to the first modification of the present disclosure can be more effective in the case of the pin arrangement as shown in FIG. 7B in which the data lines are newly added. However, the connector according to the first embodiment also can be applied to the general pin arrangement as shown in FIG. 7A. Even if the connector according to the first modification of the present disclosure is applied to the general pin arrangement shown in FIG. 7A, effects of current (signals) flowing through the signal pins 110 and 210 on other signals 110 and 210 and deterioration in the signals can be reduced by forming a microstripline and a differential stripline with regard to each signal pin.

Note that, as explained with reference to FIG. 9B, the intervals between the signal pins 110 and the intervals between the signal pins 210 in the fitting part T of the connectors according to the first modification of the present disclosure may be identical to the intervals between the signal pins 811 and the intervals between the signal pins 821 in the fitting part S of the general Type C HDMI connectors. According to such configuration, it is possible to ensure compatibility between the connector according to the first modification and the general Type C HDMI connector. Thus, when the connector according to the first modification and the general Type C HDMI connector are fitted with each other, predetermined signal pins defined by the HDMI standard are electrically connected. Accordingly, the connector according to the first modification also can be applied to a case where signals transmission corresponding to the general pin arrangement shown in FIG. 7A are performed.

Figure 10:
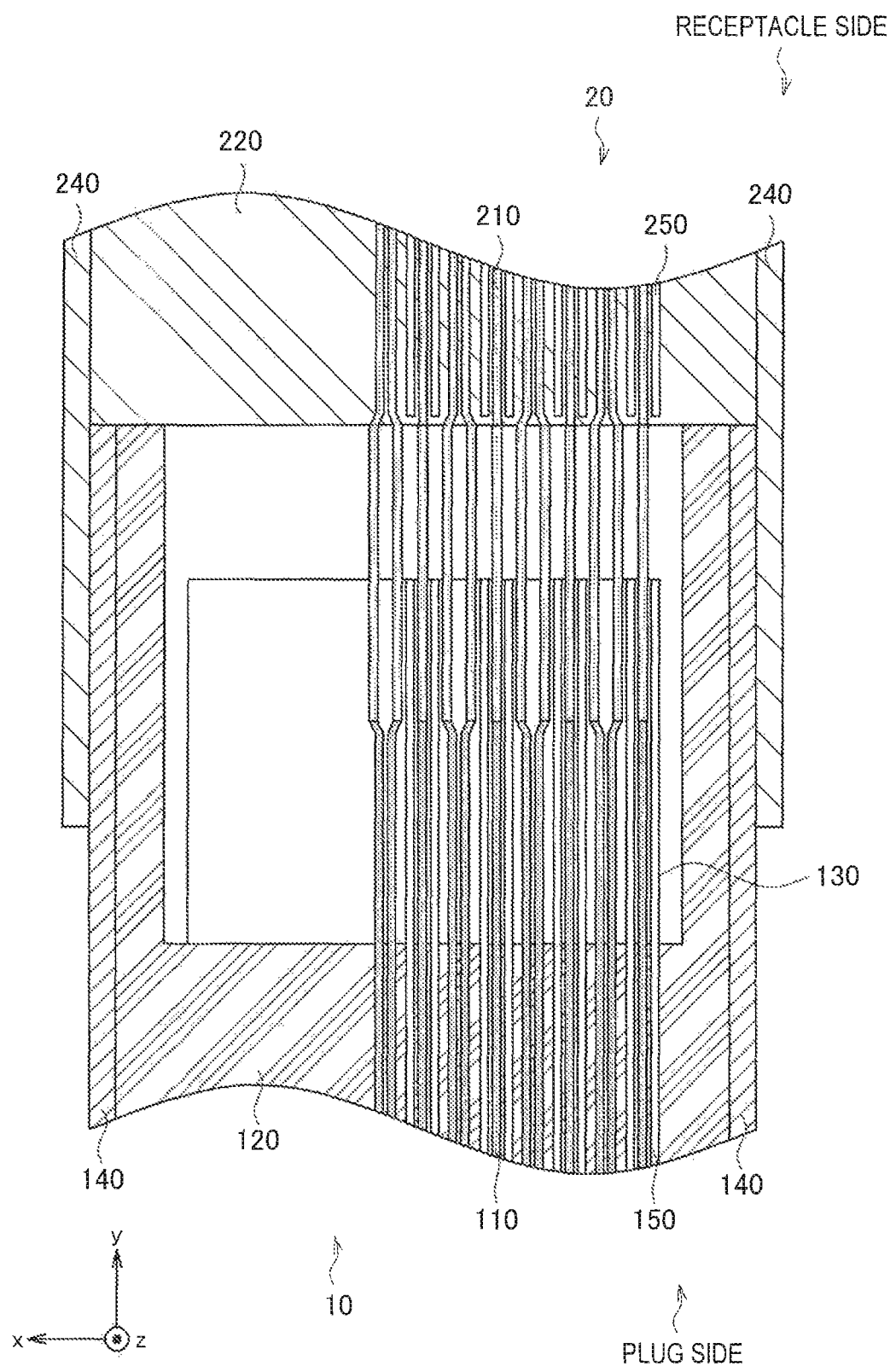
FIG. 10 is an explanatory diagram illustrating a configuration in which guard lines are disposed.

Here, with reference to FIG. 10, a modification of connectors according to the first modification of the present disclosure is explained. In the connector according to the first modification of the present disclosure, guard lines having ground potential may further extend at positions for sandwiching a signal pin in a manner that the guard lines are substantially parallel to the signal pin. In addition, the guard lines may be disposed so as to sandwich a signal pin that transmits a signal with single end. FIG. 10 is an explanatory diagram illustrating a configuration in which guard lines are disposed.

FIG. 10 shows a configuration in which guard lines are newly disposed in the connectors according to the first modification shown in FIG. 9B. Thus, FIG. 10 shows the configuration in which guard lines are provided in the connector according to the first modification when viewed from the positive direction of the z axis. With reference to FIG. 10, for example, guard lines 150 are disposed so as to sandwich a signal pin 110 that transmits a signal by single coupling in a plug-side connector 10. For example, in a similar way, guard lines 250 are disposed so as to sandwich a signal pin 210 that transmits a signal with single end in a receptacle-side connector 20. Potential of the guard lines 150 and 250 are set to the ground potential. Since the guard lines 150 and 250 are provided, it is possible to reduce effects of the current (signal) flowing through the signal pins 110 and 210 on other signal pins 110 and 210, and the deterioration in signals can be reduced.

(3.2.3. Comparison of Characteristic)

Next, a result of comparison between a characteristic of a signal flowing through a signal pin in the general Type C HDMI connector structure shown in FIGS. 8A to 8C and a characteristic of a signal flowing through a signal pin in the connector structure according to the first modification of the present disclosure shown in FIGS. 9A to 9C is explained. Note that, the following FIGS. 11A to 11B, FIGS. 12A to 12B, FIGS. 13A to 13B, and FIGS. 14A to 14E each show a result of flowing a signal corresponding to pin arrangement in which data lines are newly added as shown in FIG. 7B.

First, with reference to FIGS. 11A to 11B and FIGS. 12A to 12B, difference in electric field distribution near signal pins between the general Type C HDMI connector and the connector according to the first modification is explained.

Figure 12B:
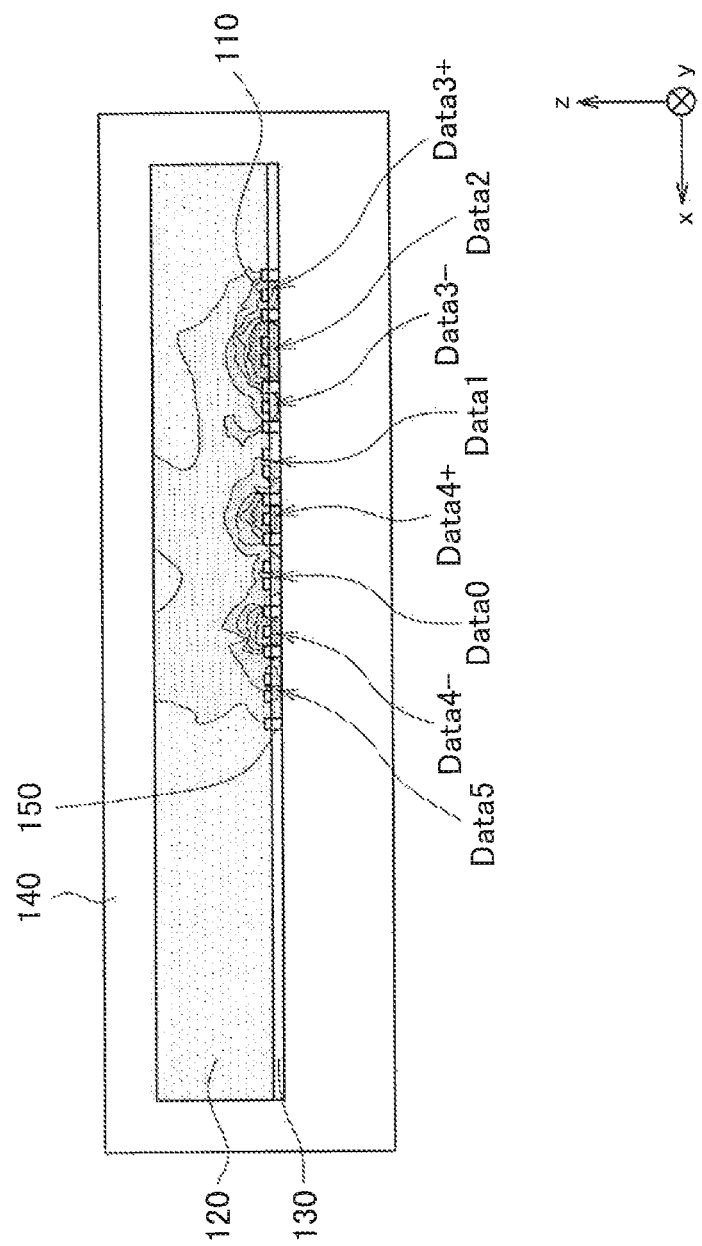
FIG. 12B is a contour map of an electric field showing electric field distribution in the connector structure according to the first modification.

FIGS. 11A to 11i and FIGS. 12A to 12B each show electric field distribution near signal pins in a case where a predetermined signal for transmitting a video signal decided by the HDMI standard is applied to each connector. FIGS. 11A and 11B are each a contour map of an electric field showing electric field distribution in the general Type C HDMI connector structure. FIGS. 12A and 12B are each a contour map of an electric field showing electric field distribution in the connector structure according to the first modification. In FIGS. 11A to 11B and FIGS. 12A to 12B, strength of the electric field distribution is schematically represented by shades of hatching. A dark hatched region represents a region in which the electric field is concentrated.

FIG. 11A is a contour map of an electric field at a cross-section corresponding to FIG. 8A, in the general Type C HDMI connector structure. FIG. 11B is a contour map of an electric field at a D-D cross-section shown in FIG. 11A.

FIG. 12A is a contour map of an electric field at a cross-section corresponding to FIG. 9A, in the connector structure according to the first modification. FIG. 12B is a contour map of an electric field at a D-D cross-section shown in FIG. 12A. Note that, the contour maps of the electric field shown in FIGS. 12A and 12B determine the electric field distribution of the connector structure according to the first modification in which the guard lines are further provided as shown in FIG. 10.

The contour maps of the electric fields in FIGS. 11A to 11B and FIGS. 12A to 12B each show a simulation result of an electric field distribution near the signal pins in a case where a model in which permittivity corresponding to each region (signal pin, substrate, outer shell, dielectric, or the like) at each cross-section described above is set is formed, and a predetermined signal when a video signal decided by the HDMI standard is transmitted is applied.

With reference to FIG. 11A, in the general Type C HDMI connector structure, there is few difference in the electric field distribution between a front surface (surface that stretches in the y axis direction and that is positioned in the positive direction of the z axis) and a rear surface (surface that stretches in the y axis direction and that is positioned in the negative direction of the z axis) of each of the signal pins 811 and 821. On the other hand, with reference to FIG. 11B, in the general Type C HDMI connector structure, electric field is concentrated and coupling occurs between a part of the signal pins 110 as shown in a region E for example. However, in a region F (region across "Data0−", "Data4−", and "Data5+") and a region G (region across "Data1−", "Data4+", and "Data0+"), electric fields are also concentrated in regions other than a differential signal pair, and current (signal) flowing through signal pins 811 affects other signal pins 811.

On the other hand, with reference to FIG. 12A, in the connector structure according to the first modification, electric field is concentrated between the signal pins 110 and 210 and the substrates 130 and 230, and the so-called microstripline is formed. In addition, with reference to FIG. 12B, in the connector structure according to the first modification, electric fields are concentrated between the adjacently disposed pairs of signal pins 110 and 210 "Data0", "Data1", "Data2", and "Data5", and the so-called differential striplines are formed. With regard to the signal pins 110 and 210 "Data3−", "Data3+", "Data4−", and "Data4+", electric fields are concentrated in the substrate between the signal pins 110 and 210 and a GND conductor (shell 140), and a single-ended electric field is formed. Accordingly, effects of current (signal) flowing through signal pins 110 and 210 on other signal pins 110 and 210 are reduced.

Next, with reference to FIGS. 13A to 13B and FIGS. 14A to 14E, difference in signal transmission characteristics as represented by an eye pattern and crosstalk, between the general Type C HDMI connector and the connector according to the first modification is explained.

Figure 13A:
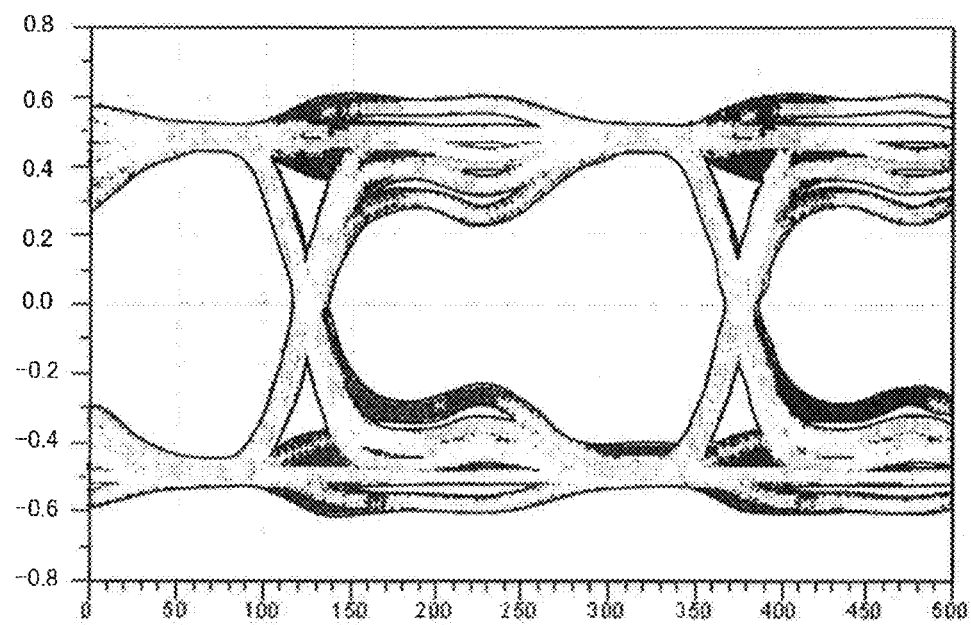
FIG. 13A is a voltage characteristic diagram showing an eye pattern of a general Type C HDMI connector structure.
Figure 13B:
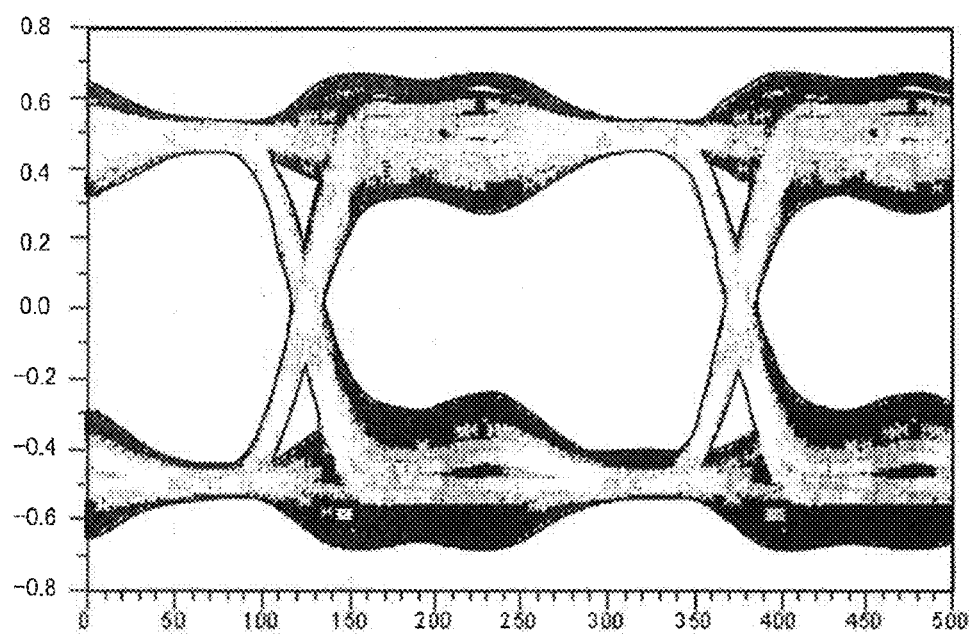
FIG. 13B is a voltage characteristic diagram showing an eye pattern of the general Type C HDMI connector structure.

FIGS. 13A and 13B are each a voltage characteristic diagram showing an eye pattern of the general Type C HDMI connector structure shown in FIGS. 8A to 8C. FIG. 13A shows an eye pattern of the "Data 2" line shown in FIG. 7B and FIG. 13B shows an eye pattern of the "Data 4" line shown in FIG. 7B.

Figure 14A:
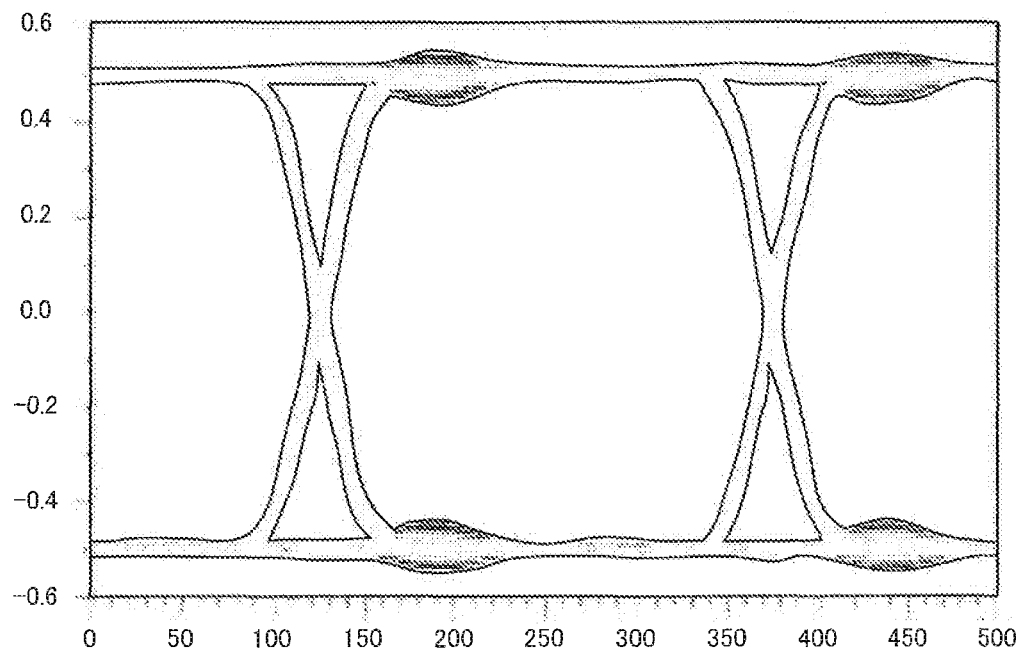
FIG. 14A is a voltage characteristic diagram showing an eye pattern of a connector structure according to the first modification.
Figure 14B:
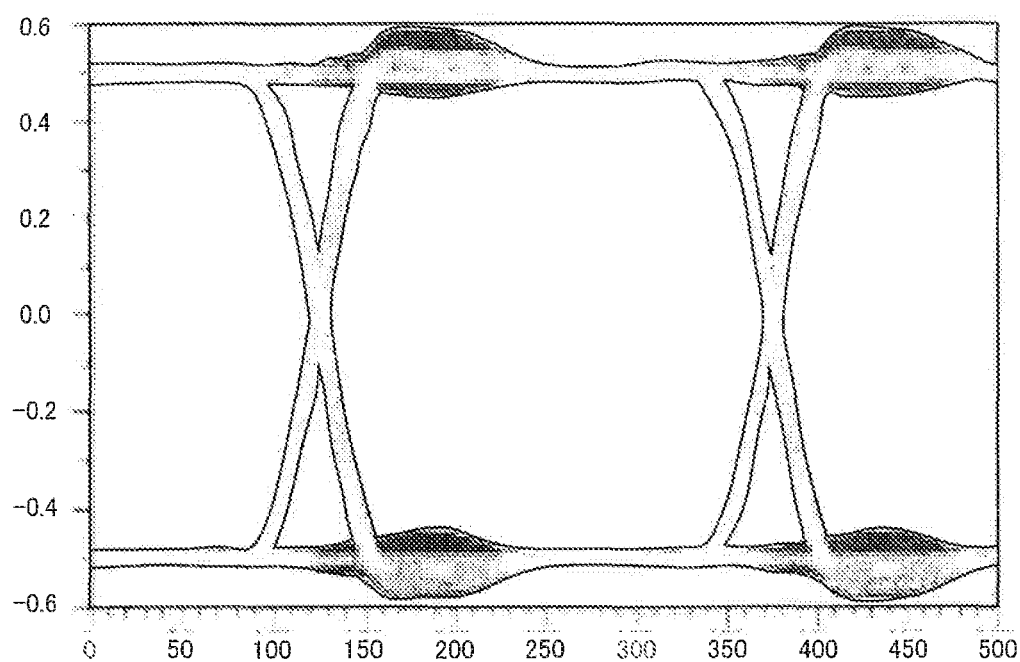
FIG. 14B is a voltage characteristic diagram showing an eye pattern of the connector structure according to the first modification.

FIGS. 14A and 14B are each a voltage characteristic diagram showing an eye pattern of the connector structure according to the first modification shown in FIGS. 9A to 9C. FIG. 14A shows an eye pattern of the "Data 2" line shown in FIG. 7B and FIG. 14B shows an eye pattern of the "Data 4" line shown in FIG. 7B.

Figure 14C:
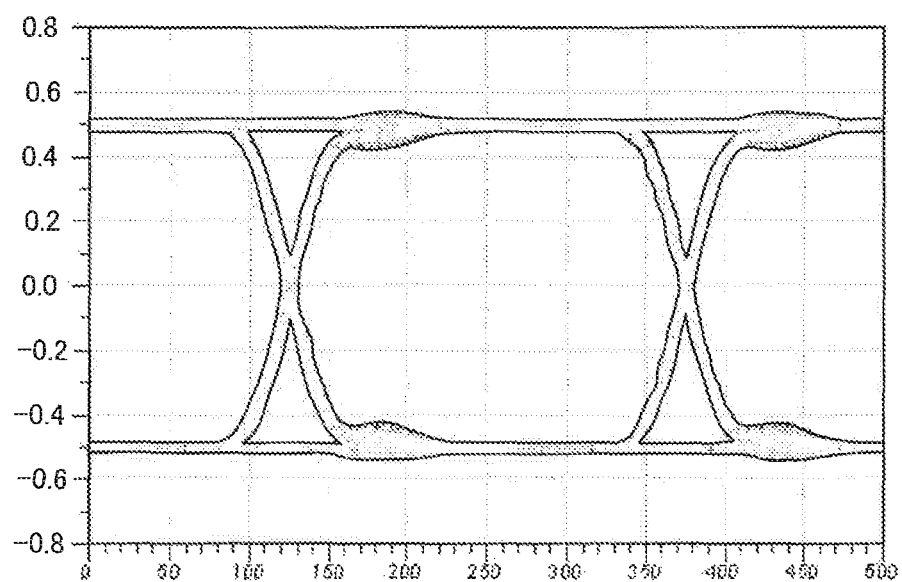
FIG. 14C is a voltage characteristic diagram showing an eye pattern of a connector structure according to the first modification in which guard lines are further arranged.
Figure 14D:
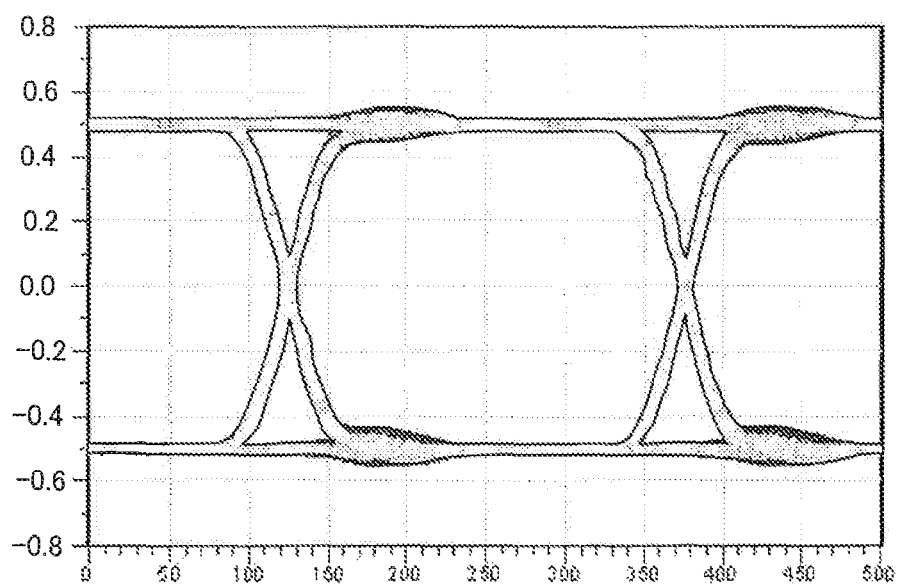
FIG. 14D is a voltage characteristic diagram showing an eye pattern of a connector structure according to the first modification in which guard lines are further arranged.
Figure 14E:
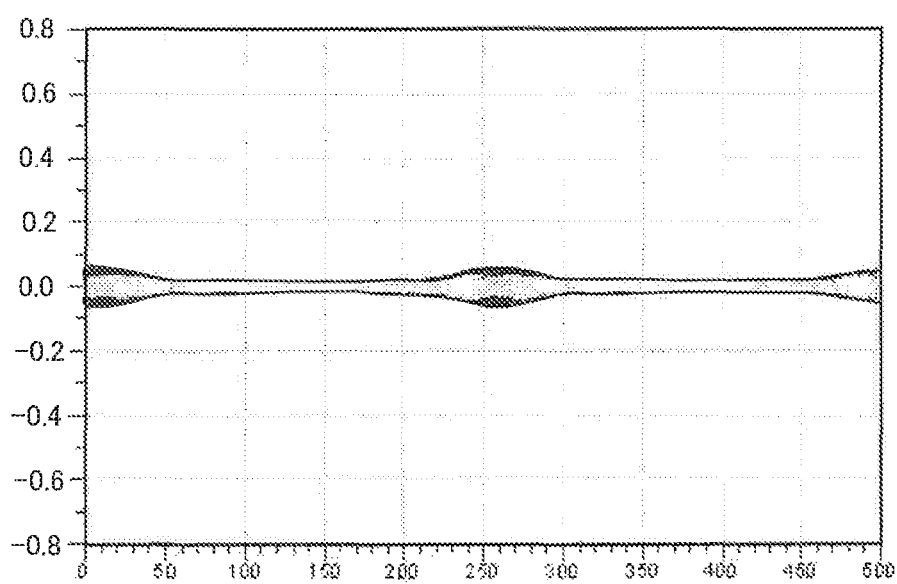
FIG. 14E is a voltage characteristic diagram showing a crosstalk characteristic of a connector structure according to the first modification in which guard lines are further arranged.

FIGS. 14C and 14D is each a voltage characteristic diagram showing an eye pattern of a connector structure according to the first modification in which guard lines are further arranged as shown in FIG. 10. FIG. 14C shows an eye pattern of the "Data 2" line shown in FIG. 7B and FIG. 14D shows an eye pattern of the "Data 4" line shown in FIG. 7B. FIG. 14E is a voltage characteristic diagram showing a crosstalk characteristic of a connector structure according to the first modification in which guard lines are further arranged as shown in FIG. 10.

In FIGS. 13A to 13B and FIGS. 14A to 14E, the eye pattern corresponding to "Data2" represents a transmission characteristic of data lines (existing data lines) that already exist in the general pin arrangement shown in FIG. 7A, and the eye pattern corresponding to "Data4" represents a transmission characteristic of data lines (new data lines) that are newly added in the pin arrangement in which data lines are newly added as shown in FIG. 7B.

When the FIGS. 13A and 13B are compared and FIGS. 14A and 14B are compared, the signal transmission characteristic is improved due to the connector structure according to the first modification, in addition to the existing data line "Data2" and the new data line "Data4". Thus, the deterioration in signals is reduced by the connector structure according to the first modification.

When the FIGS. 14A and 14B are compared and FIGS. 14C and 14D are compared, the signal transmission characteristic is further improved by providing the guard lines 150, in addition to the existing data line "Data2" and the new data line "Data4". Thus, the deterioration in signals is reduced by further providing the connector structure according to the first modification with the guard lines 150. In addition, with reference to FIG. 14E, a good crosstalk characteristic can be obtained in the connector structure according to the first modification.

[3.3. Second Modification]

Next, a structure of a connector according to a second modification of the present disclosure is explained. Note that, the connector according to the second modification corresponds to a connector in which a configuration for increasing data transmission amounts and reducing deterioration in signals more is applied to the Type D HDMI connector.

As explained above, the Type D HDMI connector has pin arrangement shown in FIGS. 6A and 6B. Here, when the pin arrangement in which the data lines are newly added as shown in FIG. 6B is applied to the Type D HDMI connector, deterioration in signals occurs like the Type A HDMI connector explained in [3.1. Study on Increase in Transmission Data Amount]. On the other hand, a connector structure (to be described later) according to the second modification of the present disclosure can reduce the deterioration in signals even in a case of pin arrangement in which data lines are newly added as shown in FIG. 6B.

In order to clearly explain the structure of the connector according to the second modification, a structural example of the general Type D HDMI connector is firstly explained in (3.3.1. Configuration of General Type D Connector). Next, in (3.3.2. Configuration of Connector according to Second Modification), a structural example of the connector according to the second modification of the present disclosure and differences from the general Type D HDMI connector are explained. Subsequently, characteristics of signals transmitted in the both structures are compared in (3.3.3. Comparison of Characteristic), and effect to reduce deterioration in signals in the connector according to the second modification is explained.

As shown in FIGS. 6A and 6B, signal pins are arranged along the x axis direction in two lines in the z axis direction in zigzag on the terminal surface, in the pin arrangement according to the general Type D HDMI connector. In addition, in a vertical direction of FIGS. 6A and 6B, signal pins formed on the upper line (upper direction in the z axis direction) and signal pins formed on the lower line (lower direction in the z axis direction) are horizontal line symmetry although disposition positions in the x axis are different. Accordingly, with regard to the following FIGS. 15A to 15C and FIGS. 16A to 16C, structures of signal pins at a lower side in the z axis direction (signal pins formed at the lower line in FIGS. 6A and 6B) are mainly explained. An explanation of the signal pins at the upper side in the z axis direction (signal pins formed at the upper line in FIGS. 6A and 6B) is omitted since the signal pins correspond to a structure obtained by folding the structure of the signal pins at the lower side.

(3.3.1. Configuration of General Type D Connector)

First, with reference to FIGS. 15A to 15C, a structural example of a general Type D HDMI connectors is explained. FIG. 15A is a cross-sectional view showing a structural example of general Type D HDMI connectors when being cut at a cross section constituted by a y axis and a z axis through signal pins. FIG. 15B is a cross-sectional view of the general Type D HDMI connectors corresponding to an A-A cross section in FIG. 15A, the A-A cross section being constituted by an x axis and the y axis. FIG. 15C is a cross-sectional view of the general Type D HDMI connectors corresponding to a C-C cross section in FIG. 15B, the C-C cross section being constituted by the x axis and the z axis. Note that, in FIGS. 15A to 15C, a plug-side connector and a receptacle-side connector are fitted with each other.

First, a structure of the plug-side connector is explained. With reference to FIGS. 15A to 15C, a plug-side connector 910 of the general Type D HDMI connector includes signal pins 911, a dielectric 912, and an outer shell (shell) 913. The signal pins 911 extend in the first direction, in other words, the y axis direction. Parts of the signal pins 811 are embedded in the dielectric 912.

The shell 913 covers the signal pins 911 and the dielectric 912. One surface of the shell 913 in the positive direction of the y axis is an open surface open to an outside. As shown in FIGS. 15A to 15C, the plug-side connector 910 and a receptacle-side connector 920 (to be described later) are connected via the open surface of the shell 913. In addition, the shell 913 is formed of an electric conductor. Potential of the shell 813 is fixed to, for example, the ground potential via the receptacle-side connector 920 (to be described later).

In a predetermined region near the open surface of the shell 913, tips of the signal pins 911 are exposed from the dielectric 912. The exposed parts constitute bent parts bent toward the positive direction of the z axis at a predetermined angle. When the plug-side connector 910 and the receptacle-side connector 920 (to be described later) are fitted with each other, the bent parts of the signal pins 911 contact signal pins 921 of the receptacle side connector 920 (to be described later). Accordingly, the plug-side connector 910 and the receptacle-side connector 920 (to be described later) are electrically connected to each other.

Note that, the signal pins 921 at the upper side in the z axis direction have a structure that is horizontal line symmetrical to the signal pins at the lower side as described above. Accordingly, bent parts of the signal pins 921 are formed so as to be bent toward the negative direction of the z axis at the predetermined angle.

Next, a structure of the receptacle-side connector is explained. With reference to FIGS. 15A to 15C, the receptacle-side connector 920 of the general Type D HDMI connector includes the signal pins 921, a dielectric 922, and an outer shell (shell) 923. The signal pins 921 extend in the first direction, in other words, the y axis direction. Parts of the signal pins 921 are embedded in the dielectric 922.

The shell 923 covers the signal pins 921 and the dielectric 922. One surface of the shell 923 in the negative direction of the y axis is an open surface open to an outside. In addition, the shell 923 is formed of an electric conductor. Potential of the shell 923 is fixed to, for example, the ground potential.

An area of an opening of the open surface of the shell 923 is slightly larger than the cross-sectional area of the open surface of the shell 913 of the plug-side connector 910. As shown in FIGS. 15A to 15C, an end provided with the open surface of the shell 913 of the plug-side connector 910 is inserted into the opening of the open surface of the shell 923 of the receptacle-side connector 920, and the plug-side connector 910 and the receptacle-side connector 920 are fitted with each other. Note that, regions indicated by dotted lines in FIGS. 15A and 15B represent a fitting part U of the plug-side connector 910 and the receptacle-side connector 920.

In a predetermined region near the open surface of the shell 923, the signal pins 921 include exposed parts in which parts of regions of surfaces of the signal pins 921 are exposed from the dielectric 922. When the plug-side connector 910 and the receptacle-side connector 920 are fitted with each other, the exposed parts of the signal pins 921 contact the bent parts of the signal pins 911 of the plug-side connector 910.

Note that, as described above, in the general Type D connector, structural elements similar to the signal pins 911 and 921 and the dielectrics 912 and 922 are additionally and horizontal-line symmetrically provided inside the shells 913 and 923 as signal pins 911 and 921 and dielectrics 912 and 922 at the upper side in the z axis direction.

With reference to FIGS. 15A to 15C, a structure of the general Type D HDMI connector has been explained.

(3.3.2. Configuration of Connector According to Second Modification)

Figure 16B:
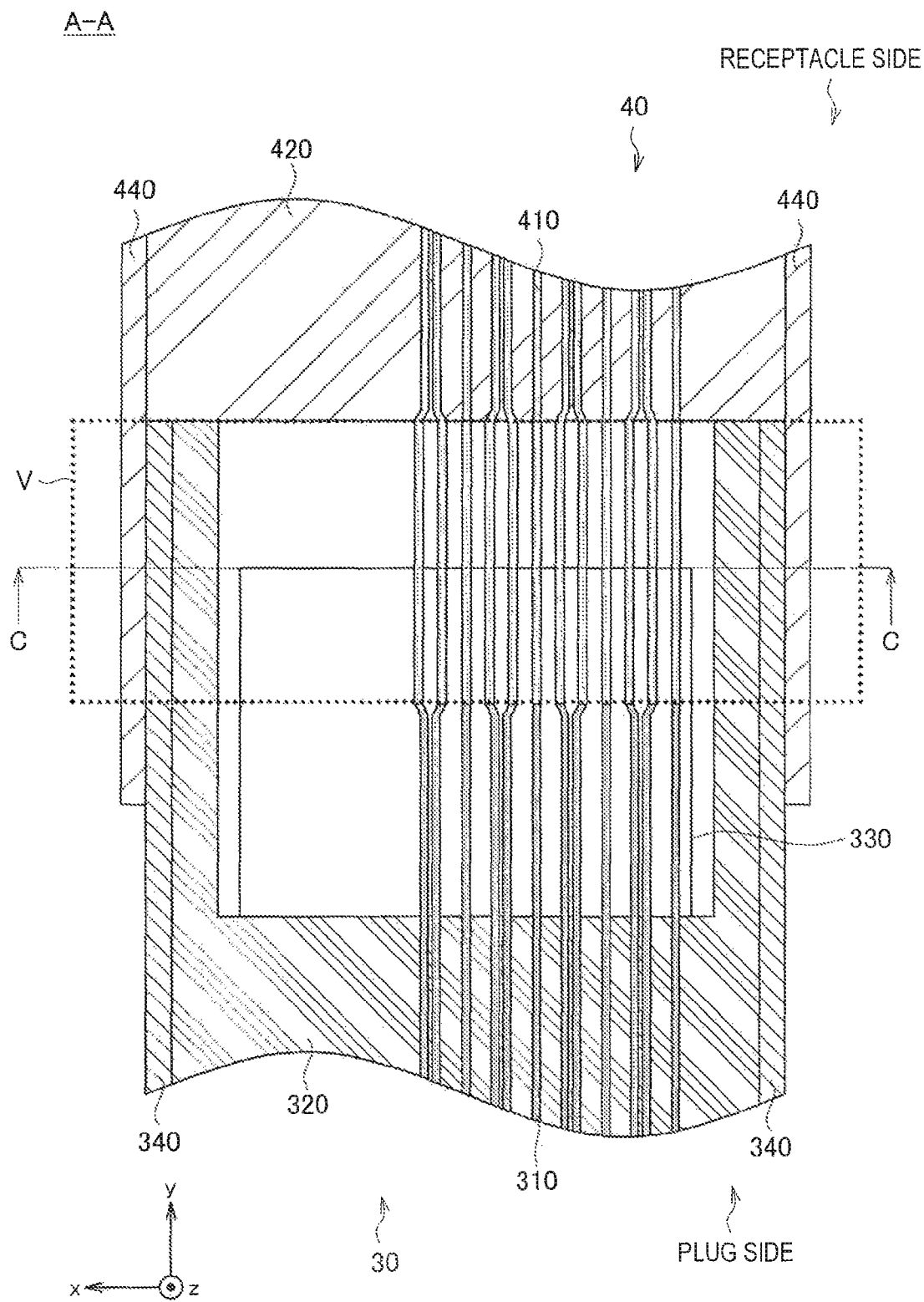
FIG. 16B is a cross-sectional view of the connectors according to the second modification corresponding to an A-A cross section in FIG. 11A, the A-A cross section being constituted by an x axis and the y axis.
Figure 16C:
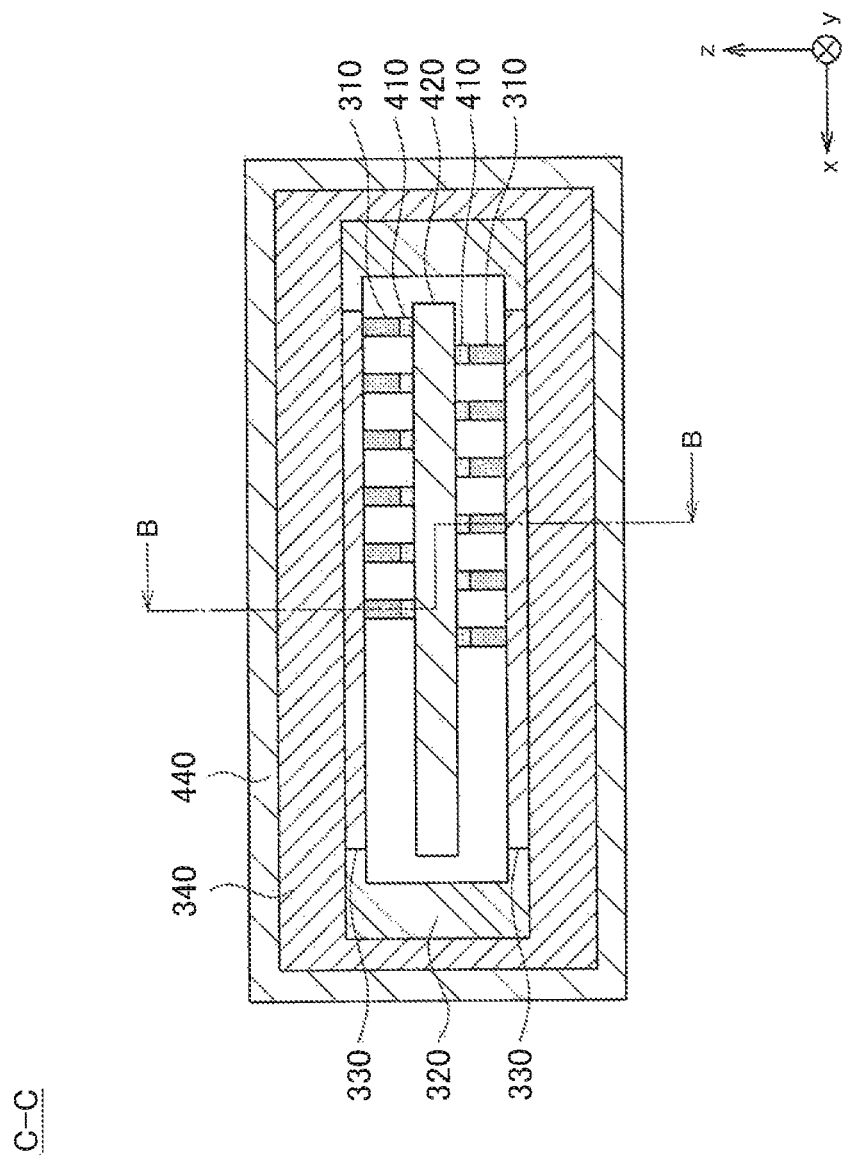
FIG. 16C is a cross-sectional view of the connectors according to the second modification corresponding to a C-C cross section in FIG. 11B, the C-C cross section being constituted by the x axis and the z axis.

Next, with reference to FIGS. 16A to 16C, a structural example of connectors according to the second modification of the present disclosure is explained. FIG. 16A is a cross-sectional view showing a structural example of connectors according to the second modification of the present disclosure when being cut at a cross section constituted by a y axis and a z axis through signal pins. FIG. 16B is a cross-sectional view of the connectors according to the second modification corresponding to an A-A cross section in FIG. 16A, the A-A cross section being constituted by an x axis and the y axis. FIG. 16C is a cross-sectional view of the connectors according to the second modification corresponding to a C-C cross section in FIG. 16B, the C-C cross section being constituted by the x axis and the z axis.

First, a structure of the plug-side connector is explained. With reference to FIGS. 16A to 16C, a plug-side connector 30 according to the second modification includes signal pins 310, dielectrics 320, substrates 330, and an outer shell (shell) 340.

The signal pins 310 extend in a first direction, in other words, a y axis direction. In addition, the signal pins 310 are formed as a wiring pattern on surfaces of the substrates 330 formed of dielectric.

The shell 340 covers the signal pins 310 and the substrates 330. One surface of the shell 340 in the positive direction of the y axis is an open surface open to an outside. As shown in FIGS. 16A to 16C, the plug-side connector 30 and a receptacle-side connector 40 (to be described later) are connected via the open surface of the shell 340. In addition, the shell 340 is formed of an electric conductor. Potential of the shell 340 is fixed to, for example, the ground potential via the receptacle-side connector 40 (to be described later).

Electric conductor layers having ground potential are formed on rear surfaces of the substrates 330, in other words, opposite surfaces of surfaces on which the signal pins 310 are formed. With reference to FIGS. 16A to 16C, according to the present embodiment, a surface of a shell 340 that faces the rear surfaces of the substrates 330 is thicker than other surfaces, and is in contact with the rear surfaces of the substrates 330. Thus, the electric conductor layers formed on the rear surfaces of the substrates 330 are integrated with the shell 340. Note that, in the present embodiment, it is only necessary to form the electric conductor layers having ground potential on the rear surfaces of the substrates 330. The structures of the electric conductor layers are not limited to the above example. Accordingly, the surface of the shell 340 is not necessarily thickened. For example, the electric conductor layers formed on the rear surfaces of the substrates 330 may be electrically connected to the shell 340 through via holes or the like.

In addition, the dielectrics 320 may be stacked above (in positive direction of the z axis) the signal pins 310 formed on the substrate 330. Note that, when the dielectrics 320 are formed, the dielectrics 320 do not cover the entire surfaces of the signal pins 310. Parts of regions of surfaces of the signal pins 310 are exposed in a predetermined region near the open surface of the shell 340. When the plug-side connector 30 and the receptacle-side connector 40 (to be described later) are fitted with each other, the exposed parts of the signal pins 310 of the plug-side connector contact signal pins 410 of the receptacle side connector 40. Accordingly, the plug-side connector 30 and the receptacle-side connector 40 (to be described later) are electrically connected to each other. Note that, contact parts may be provided on parts of regions of the exposed parts of the signal pins 310, the contact part protruding toward the signal pins 410 of the receptacle-side connector 40. Thus, the signal pins 410 of the plug-side connector 30 and the signal pins 410 of the receptacle-side connector 40 may contact to each other via the contact parts.

Next, a structure of the receptacle-side connector is explained. With reference to FIGS. 16A to 16C, the receptacle-side connector 40 according to the second modification includes a signal pins 410, a dielectric 420, substrates 430, and an outer shell (shell) 440.

The signal pins 410 extend in a first direction, in other words, a y axis direction. In addition, the signal pins 410 are formed as a wiring pattern on surfaces of the substrates 430 formed of dielectric.

The shell 440 covers the signal pins 410 and the substrates 430. One surface of the shell 440 in the negative direction of the y axis is an open surface open to an outside. In addition, the shell 440 is formed of an electric conductor. Potential of the shell 440 is fixed to, for example, the ground potential.

An area of an opening of the open surface of the shell 440 is slightly larger than the cross-sectional area of the open surface of the shell 340 of the plug-side connector 30. As shown in FIGS. 16A to 16C, an end provided with the open surface of the shell 340 of the plug-side connector 30 is inserted into the opening of the open surface of the shell 440 of the receptacle-side connector 40, and the plug-side connector 30 and the receptacle-side connector 40 are fitted with each other. Note that, regions indicated by dotted lines in FIGS. 16A and 16B represent a fitting part V of the plug-side connector 30 and the receptacle-side connector 40.

Electric conductor layers having ground potential are formed on rear surfaces of the substrates 430, in other words, opposite surfaces of surfaces on which the signal pins 410 are formed. With reference to FIGS. 16A to 16C, according to the present embodiment, a surface of a shell 440 that faces the rear surfaces of the substrates 430 is thicker than other surfaces, and is in contact with the rear surfaces of the substrates 430. Thus, the electric conductor layers formed on the rear surfaces of the substrates 430 are integrated with the shell 440. Note that, in the present embodiment, it is only necessary to form the electric conductor layers having ground potential on the rear surfaces of the substrates 430. The structure of the electric conductor layers is not limited to the above example. Accordingly, the surface of the shell 440 is not necessarily thickened. For example, the electric conductor layers formed on the rear surfaces of the substrates 430 may be electrically connected to the shell 440 through via holes or the like.

In addition, the dielectric 420 may be stacked above (in positive direction of the z axis) the signal pins 410 formed on the substrate 430. Note that, when the dielectric 420 is formed, parts of regions of the signal pins 410 are exposed in a predetermined region near the open surface of the shell 440. The exposed parts of the signal pins 410 of the receptacle-side connector 40 contact the exposed parts and/or the contact parts of the signal pins 310 of the receptacle side connector 30. Accordingly, the plug-side connector 30 and the receptacle-side connector 40 are electrically connected to each other.

Note that, as described above, structural elements similar to the signal pins 310 and 410, the dielectrics 320 and 420, the substrates 330 and 430, and the electric conductor layers are additionally and horizontal-line symmetrically provided inside the shells 340 and 440 as signal pins 310 and 410, dielectrics 320 and 420, substrates 330 and 430, and an electric conductor layers at the upper side in the z axis direction, in the connectors according to the second modification. Thus, the connector structure according to the second modification corresponds to a structure having two sets of the signal pins 110 and 210, the dielectrics 120 and 220, the substrates 130 and 230, and the electric conductor layers that are in the connector structure according to the above-explained first modification.

With reference to FIG. 16B, among the signal pins 310 of the plug-side connector 30 and the signal pins 410 of the receptacle-side connector 40, intervals between pairs of the signal pins 310 and 410 that transmit differential signals and adjacently extend may be shorter than intervals from other signal pins 310 and 410 adjacent to the pairs of the signal pins 310 and 410. Note that, the intervals between the signal pins 310 and the intervals between the signal pins 410 may be identical in the fitting part V. On the other hand, in a region other than the fitting part V, the intervals between pairs of the signal pins 310 and 410 that transmit differential signals and adjacently extend may be shorter than the intervals from other signal pins 310 and 410 adjacent to the pairs of the signal pins 310 and 410.

The wiring intervals between the signal pins 310 and the wiring intervals between the signal pins 410 in the fitting part V may be similar to the wiring intervals of the signal pins 911 and the wiring intervals of the signal pins 921 in the fitting part U shown in FIGS. 15A to 15C. Thus, the signal pins of the connector according to the second modification and the signal pins of the general Type D HDMI connector may have identical wiring intervals in the fitting parts.

As explained with reference to FIGS. 16A to 16C, the structure of the connector according to the second modification and the structure of the general Type D HDMI connector are different as follows: The connector according to the second embodiment includes the substrates that are formed of the dielectric and that include signal pins (wiring pattern corresponding to the signal pins) on one surfaces and include the electric conductor layers having the ground potential on the other surfaces. In addition, among the signal pins in the connector according to the second modification, the intervals between the pairs of the signal pins that transmit differential signals and adjacently extend are shorter than the intervals from other signal pins adjacent to the pairs of the signal pins. In a way similar to the connector according to the first modification, the connector according to the second modification has such configuration and achieves the following effects.

As explained above, in the connectors 30 and 40 according to the second modification, signal pins 310 and 410 are formed on the substrates 330 and 430 formed of the dielectric, and the electric conductor layers having the ground potential are formed on the opposite sides of the surfaces of the substrates 330 and 430 on which the signal pins 310 and 410 are formed. Accordingly, the connectors according to the second modification have configurations in which ground planes (electric conductor layers), dielectric layers (substrate 330 and 430), and wirings (signal pins 310 and 410) are stacked in this order. According to such configurations, an electromagnetic field due to current (signal) flowing through the signal pins 310 and 410 is trapped between the substrates 330 and 430, and the so-called microstripline (microstrip structure) is formed. Thus, in the connectors according to the second modification, it is possible to reduce effects of the current (signal) flowing through the signal pins 310 and 410 on other signal pins 310 and 410, and the deterioration in signals can be reduced.

In addition, as explained above, among the signal pins 310 and 410 in the connectors 30 and 40 according to the second modification, the intervals between pairs of the signal pins 310 and 410 that transmit differential signals and adjacently extend may be shorter than the intervals from other signal pins 310 and 410 adjacent to the pairs of the signal pins 110 and 410. Since the intervals between the pair of signal pins 310 and 410 that transmit differential signals to be paired are narrowed more, an electromagnetic field due to current (signal) flowing through the pair of signal pins 310 and 410 is trapped between the pairs of signal pins 310 and 410 and between the substrates 330 and 430, and so-called differential stripline (differential strip structure) is formed. Note that, a return path of the differential coupling is secured on the ground plane at a rear surface of the wiring surface. Accordingly, since the coupling is generated between the differential data lines, it is possible to narrow the wiring width and the wiring intervals between the signal pins, while the differential impedance is maintained. Thus, intervals from a different kind of adjacent signal wirings can be widened. Accordingly, the crosstalk can be reduced and signal quality can be improved. Thus, in the connectors according to the second modification, it is possible to further reduce effects of the current (signal) flowing through the pair of the signal pins 310 and 410 that transmit a differential signal, on other signal pins 310 and 410. In addition, the deterioration in signals can be reduced.

Note that, in a case where the pin arrangement shown in FIG. 1B in which the data lines are newly added is applied to the connector according to the second modification, signal pins to which a pair of differential signals "Data3+" and "Data3−", and a pair of differential signals "Data4+" and "Data4−" are allocated are not arranged at a positions where the pairs of the differential signals are next to each other, among the newly added pairs of the differential signals. Thus, in the connectors according to the second modification, pairs of adjacent signal pins to which a "Data0" and "Data0−" pair, a "Data1+" and "Data1−" pair, a "Data2+" and "Data2−" pair, and a "Data5+" and "Data5−" pair are applied transmit signals using the differential striplines. On the other hand, pairs of nonadjacent signal pins to which a "Data3+" and "Data3" pair and a "Data4+" and "Data4−" pair are applied may transmit signals using single-ended microstrip lines.

In addition, as explained above, the connector according to the second modification of the present disclosure can be more effective in the case of the pin arrangement as shown in FIG. 6B in which the data lines are newly added.

However, the connector according to the first embodiment also can be applied to the general pin arrangement as shown in FIG. 6A. Even if the connector according to the second modification of the present disclosure is applied to the general pin arrangement shown in FIG. 6A, effects of current (signals) flowing through the signal pins 310 and 410 on other signals 310 and 410 and deterioration in the signals can be reduced by forming a microstripline and a differential stripline with regard to each signal pin.

Note that, as explained with reference to FIG. 16B, the intervals between the signal pins 310 and the intervals between the signal pins 410 in the fitting part V of the connectors according to the second modification of the present disclosure may be identical to the intervals between the signal pins 911 and the intervals between the signal pins 921 in the fitting part U of the general Type D HDMI connectors. According to such configuration, it is possible to ensure compatibility between the connector according to the second modification and the general Type D HDMI connector. Thus, when the connector according to the second modification and the general Type D HDMI connector are fitted with each other, predetermined signal pins defined by the HDMI standard are electrically connected. Accordingly, the connector according to the second modification also can be applied to a case where signals transmission corresponding to the general pin arrangement shown in FIG. 6A are performed.

In a way similar to the modification of the connector according to the first modification, guard lines having ground potential may further extend at positions for sandwiching a signal pin in a manner that the guard lines are substantially parallel to the signal pin, in the connector according to the second modification of the present disclosure. In addition, the guard lines may be disposed so as to sandwich a signal pin that transmits a signal with single end. Note that, as described above, the connector according to the second modification shown in FIGS. 16A to 16C corresponds to a structure having two sets of the signal pins, the substrate, and the electric conductor layer that are in the connector structure according to the first modification shown in FIGS. 9A to 9C. Accordingly, in a case where the guard lines are provided in the connector according to the second modification, the configuration of the signal pins (wiring pattern) on the substrate is similar to the connector according to the first modification. Thus, as shown in FIG. 10, in both the plug-side connector and the receptacle-side connector according to the second modification, guard lines may be disposed so as to sandwich a signal pin that transmits a signal with single end. In addition, potential of the guard lines is set to the ground potential. Since the guard lines are provided, it is possible to reduce effects of the current (signal) flowing through the signal pins 310 and 410 on other signal pins 310 and 410, and the deterioration in signals can be reduced.

The effects of the connector according to the second modification have been explained. As explained above, even if the connector includes a plurality of sets of the signal pins, the substrate and the electric conductor layer (microstrip structure), the connector can achieve the effects similar to the first modification.

(3.3.3. Comparison of Characteristic)

Next, a result of comparison between a characteristic of a signal flowing through a signal pin in the general Type D HDMI connector structure shown in FIGS. 15A to 15C and a characteristic of a signal flowing through a signal pin in the connector structure according to the second modification of the present disclosure shown in FIGS. 16A to 16C is explained. Note that, the following FIGS. 17A to 17B, FIGS. 18A to 18B, FIGS. 19A to 19B, and FIGS. 20A to 20C each show a result of flowing a signal corresponding to pin arrangement in which data lines are newly added as shown in FIG. 6B.

First, with reference to FIGS. 17A to 17B and FIGS. 18A to 18B, difference in electric field distribution near signal pins between a general Type D HDMI connector and the connector according to the second modification is explained.

FIGS. 17A to 17B and FIGS. 18A to 18B each show electric field distribution near signal pins in a case where a predetermined signal for transmitting a video signal decided by the HDMI standard is applied to each connector. FIGS. 17A and 17B are each a contour map of an electric field showing electric field distribution in the general Type D HDMI connector structure. FIGS. 18A and 18B are each a contour map of an electric field showing electric field distribution in the connector structure according to the second modification. In FIGS. 17A to 17B and FIGS. 18A to 18B, strength of the electric field distribution is schematically represented by shades of hatching. A dark hatched region represents a region in which the electric field is concentrated.

FIG. 17A is a contour map of an electric field at a cross-section corresponding to FIG. 15A, in the general Type D HDMI connector structure. FIG. 17B is a contour map of an electric field at a D-D cross-section shown in FIG. 17A.

FIG. 18A is a contour map of an electric field at a cross-section corresponding to FIG. 16A, in the connector structure according to the second modification. FIG. 18B is a contour map of an electric field at a D-D cross-section shown in FIG. 18A. Note that, the contour maps of the electric fields shown in FIGS. 18A and 18B determine the electric field distribution of the connector structure according to the second modification in which the guard lines are further provided as shown in FIG. 10.

The contour maps of the electric fields in FIGS. 17A to 17B and FIGS. 18A to 18B each show a simulation result of an electric field distribution near the signal pins in a case where a model in which permittivity corresponding to each region (signal pin, substrate, outer shell, dielectric, or the like) at each cross-section described above is set is formed, and a predetermined signal when a video signal decided by the HDMI standard is transmitted is applied.

With reference to FIG. 17A, in the general Type D HDMI connector structure, there is few difference in the electric field distribution between a front surface (surface that stretches in the y axis direction and that is positioned in the positive direction of the z axis) and a rear surface (surface that stretches in the y axis direction and that is positioned in the negative direction of the z axis) of each of the signal pins 310 and 410. On the other hand, with reference to FIG. 17B, in the general Type D HDMI connector structure, as shown in a region H (region across "Data1+", "Data1−", and "Data4+") and a region I (region near Data4−), electric fields are also concentrated in regions other than a differential signal pair, and current (signal) flowing through signal pins 310 affects other signal pins 310.

On the other hand, with reference to FIG. 18A, in the connector structure according to the second modification, electric field is concentrated between the signal pins 310 and 410 and the shells 340 and 440, in other words, electric field is concentrated in the substrates 330 and 430. Accordingly, the so-called microstripline is formed. In addition, with reference to FIG. 18B, in the connector structure according to the second modification, electric fields are concentrated between an actuation signal pair of the adjacently disposed signal pins 310 and 410 of "Data1", and the so-called differential stripline is formed. In the signal pins 310 and 410 of "Data4−" and "Data4+", electric fields are concentrated between the signal pins 310 and 410 and the shells 340 and 440, in other words, electric fields are concentrated in the substrate 330 and 430, and single-ended electric field distribution is formed. Accordingly, effect of current (signal) flowing through signal pins 310 and 410 on other signal pins 310 and 410 is reduced.

Next, with reference to FIGS. 19A to 19B and FIGS. 20A to 20C, difference in signal transmission characteristics as represented by an eye pattern and crosstalk, between the general Type D HDMI connector and the connector according to the second modification is explained.

Figure 19A:
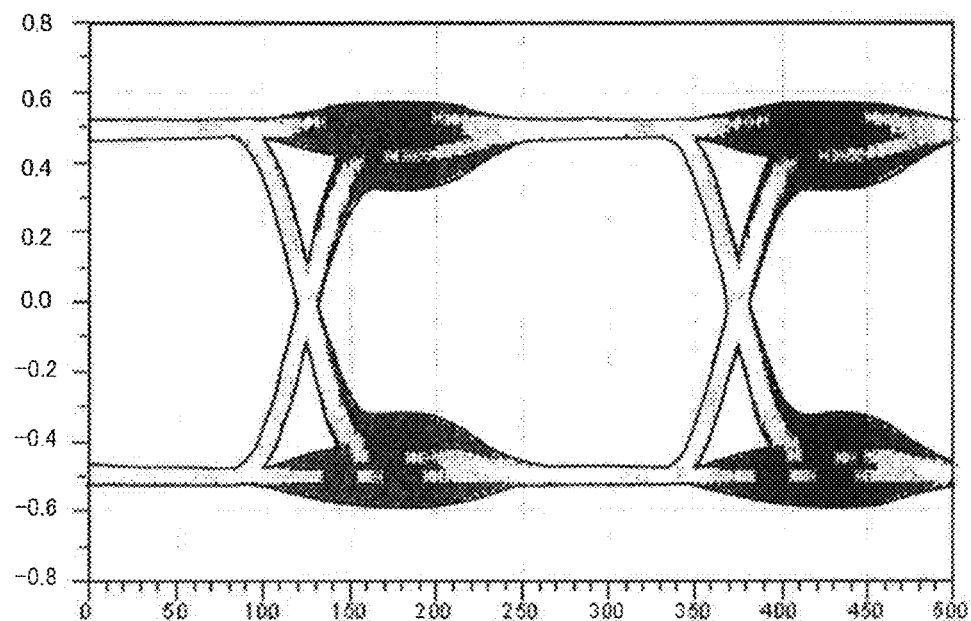
FIG. 19A is a voltage characteristic diagram showing an eye pattern of a general Type D HDMI connector structure.
Figure 19B:
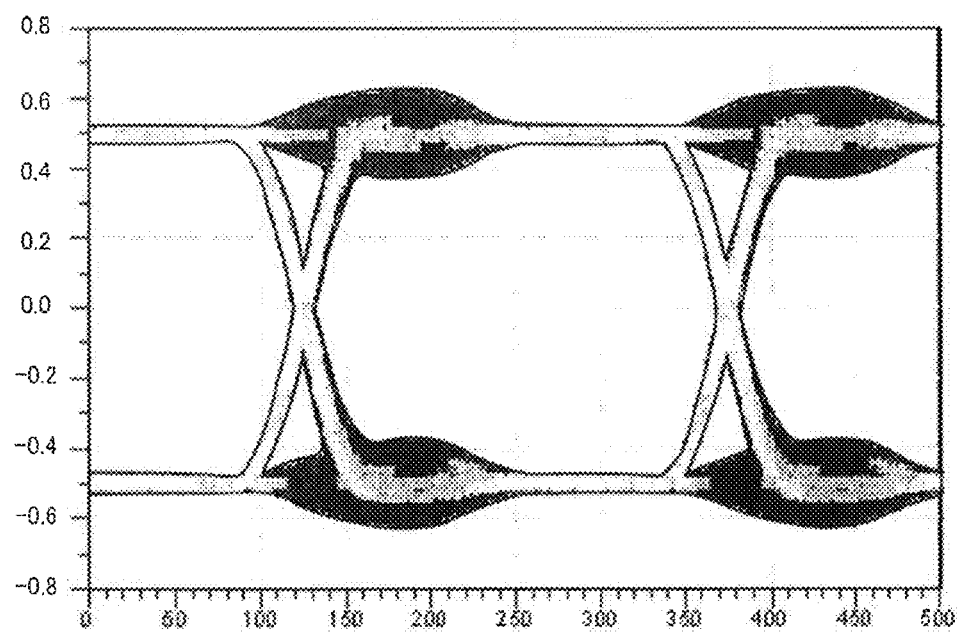
FIG. 19B is a voltage characteristic diagram showing an eye pattern of a general Type D HDMI connector structure.

FIGS. 19A and 19B are each a voltage characteristic diagram showing an eye pattern of the general Type D HDMI connector structure shown in FIGS. 15A to 15C. FIG. 19A shows an eye pattern of the "Data 1" line shown in FIG. 6B and FIG. 19B shows an eye pattern of the "Data 4" line shown in FIG. 6B.

Figure 20A:
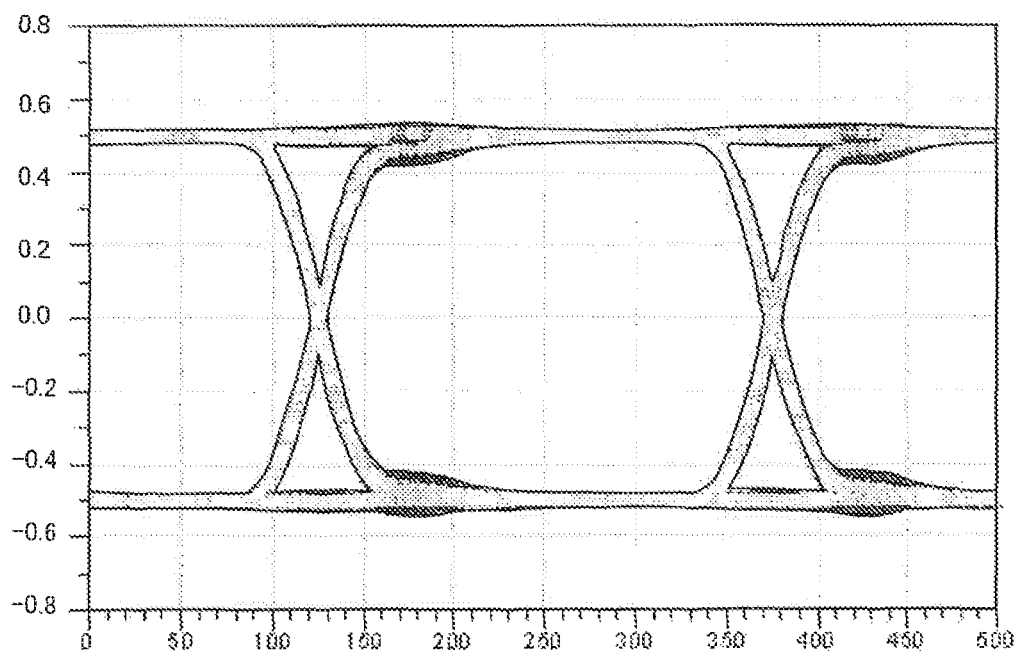
FIG. 20A is a voltage characteristic diagram showing an eye pattern of a connector structure according to the second modification in which guard lines are further arranged.
Figure 20B:
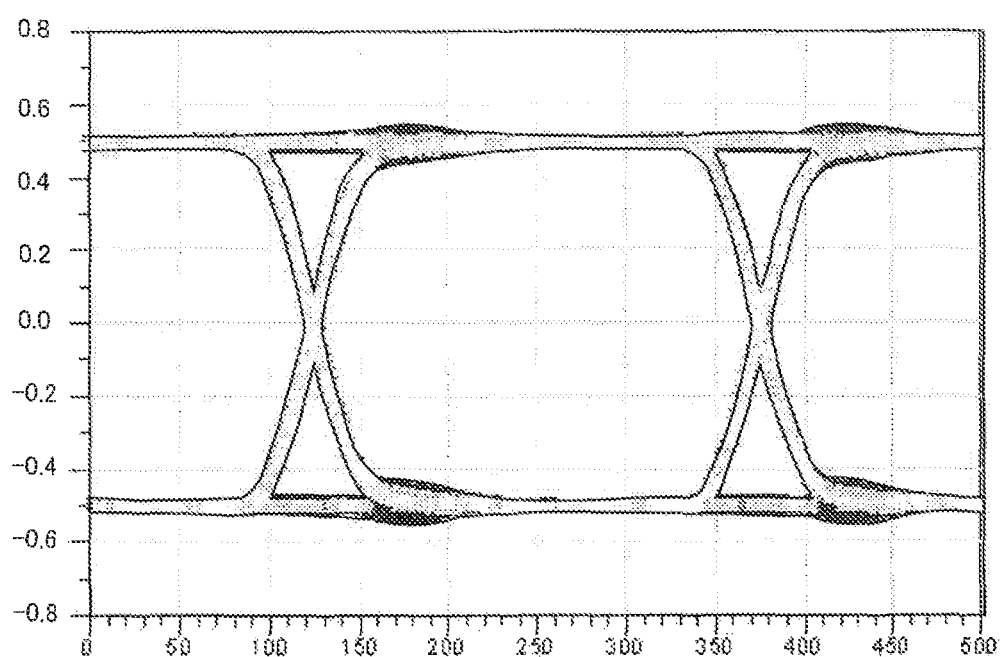
FIG. 20B is a voltage characteristic diagram showing an eye pattern of a connector structure according to the second modification in which guard lines are further arranged.
Figure 20C:
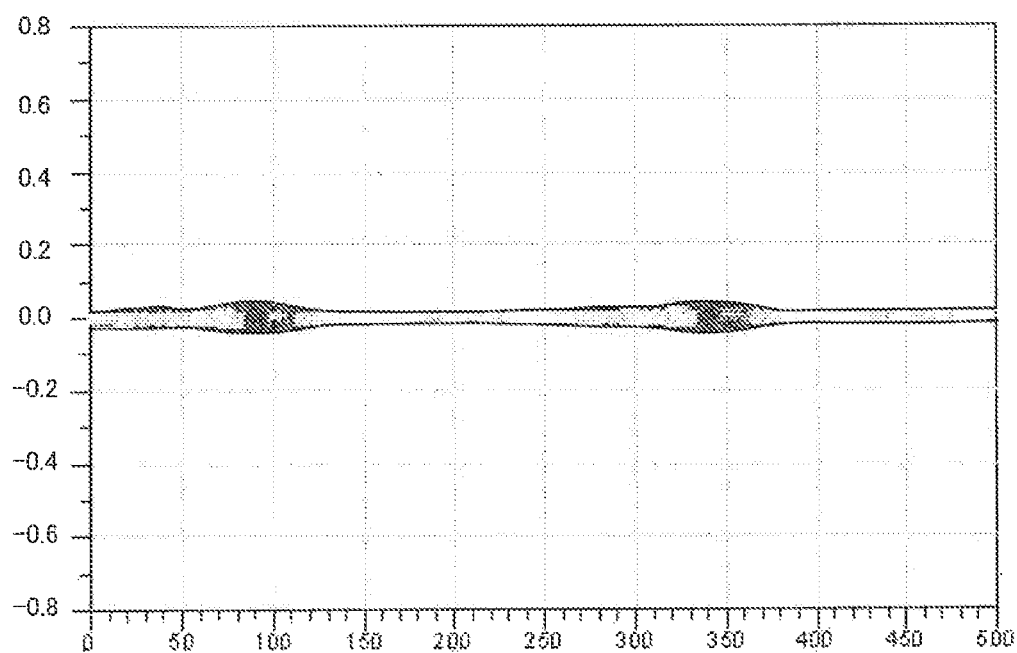
FIG. 20C is a voltage characteristic diagram showing a crosstalk characteristic of a connector structure according to the second modification in which guard lines are further arranged.

FIGS. 20A and 20B are each a voltage characteristic diagram showing an eye pattern of a connector structure according to the second modification in which guard lines are further arranged as shown in FIG. 10. FIG. 20A shows an eye pattern of the "Data 1" line shown in FIG. 6B and FIG. 20B shows an eye pattern of the "Data 4" line shown in FIG. 6B. FIG. 20C is a voltage characteristic diagram showing crosstalk of a connector structure according to the second modification in which guard lines are further arranged as shown in FIG. 10, for example.

In FIGS. 19A to 19B and FIGS. 20A to 20C, the eye pattern corresponding to "Data1" represents a transmission characteristic of data lines (existing data lines) that already exist in the general pin arrangement shown in FIG. 6A, and the eye pattern corresponding to "Data4" represents a transmission characteristic of data lines (new data lines) that is newly added in the pin arrangement in which data lines are newly added as shown in FIG. 6B.

When the FIGS. 19A and 19B, and FIGS. 20A and 20B are compared, the signal transmission characteristic is improved due to the connector structure according to the second modification, in addition to the existing data line "Data1" and the new data line "Data4". Thus, the deterioration in signals is reduced by the connector structure according to the second modification. In addition, with reference to FIG. 20C, a good crosstalk characteristic can be obtained in the connector structure according to the second modification.

[3.4 Further Modifications of First and Second Modifications]

Next, further modifications of connectors according to the first and second modifications of the present disclosure are explained.

(3.4.1. Expansion of Cross-Sectional Area of Signal Pin)

First, with reference to FIGS. 21A to 21D, a modification in which a cross-sectional area of a signal pin is expanded is explained. In the following explanations with reference to FIGS. 21A to 21D, the configuration of the connector according to the first modification corresponding to the Type C HDMI connector is used as an example. However, the present modification in which a cross-sectional area of a signal pin is expanded can be applied to another connector having a different configuration. Accordingly, the modification explained in this item (3.4.1. Expansion of Cross-sectional Area of Signal Pin) can be applied to any of the configuration according to the first embodiment of the present disclosure explained in <2. First Embodiment>, the configurations according to the first and second modifications according to the present disclosure explained in [3.2. First Modification] and [3.3. Second Modification], and the configuration according to the second embodiment of the present disclosure (to be described later in <4. Second Embodiment>).

FIG. 21A is a schematic view showing an example of related signal pin arrangement in a modification in which a cross-sectional area of a signal pin is expanded, the modification being one of modifications according to the present disclosure. Note that, FIG. 21A shows only signal pins arranged at and near the most end part of the terminal surface of the connector, the signal pins being necessary for explaining the present modification. The other signal pins are not shown in FIG. 21A. In addition, FIG. 21A shows the terminal surface of the plug-side connector.

For example, with reference to FIG. 21A, wiring width of an HPD signal pin positioned at the most end part of the terminal surface is larger than wiring width of other signal pins 991. The wiring width of the signal pin 991 arranged at the most end part of the terminal surface is expanded toward the outer shell (shell) 993 in the positive direction of the x axis. Accordingly, the wiring width can be expanded without changing wiring intervals between the signal pins 991.

Note that, as described above, the connector according to the first modification corresponding to the Type C HDMI connector is used as an example in FIG. 21A. Thus, the signal pins are arranged in one line in the x axis direction. Accordingly, FIG. 21A shows the HPD signal pin as the signal pin that is positioned at the most end part of the terminal surface and whose wiring width may be expanded. Alternatively, with regard to another kind of connector, the signal pin that is positioned at the most end part of the terminal surface and whose cross-sectional area is expanded may be a signal pin to which any kind of signal is applied. For example, in Type A, Type D and Type E HDMI connectors, signal pins are arranged in two lines in the x axis direction in zigzag. Therefore, cross-sectional areas of power signal pins (+5V power pins) may be expanded in addition to the HPD signal pins.

FIG. 21B is a schematic view showing a structural example of the connectors shown in FIG. 21A when being cut at a cross section constituted by a y axis and a z axis through signal pins. FIG. 21C is a schematic view of the connectors shown in FIG. 21A corresponding to an A-A cross section in FIG. 21B, the A-A cross section being constituted by an x axis and the y axis. FIGS. 21B and 21C correspond to FIGS. 16A and 16B explained with regard to the first modification. Accordingly, a detailed explanation of the configuration already explained with reference to FIGS. 16A and 16B is omitted. In FIGS. 21B and 21C, respective structural elements of the connector are schematically shown so as to simplify the explanation of the present modification.

In FIGS. 21B and 21C, outer shells of a plug-side connector and a receptacle-side connector are not shown so as to simplify the explanation. In addition, so as to simplify the explanation, FIG. 21C shows only the signal pins arranged at and near the signal pin that is positioned at the end part in the connector and whose cross-sectional area is expanded. Other signal pins are not shown in FIG. 21C.

With reference to FIGS. 21B and 21C, cross-sectional areas of signal pins 110 and 210 to which the HPD signals are applied are expanded in the plug-side connector 10 and the receptacle-side connector 20. The direction in which the cross-sectional areas of the signal pins 110 and 210 are expanded may be a direction toward the outer shell in the positive direction of the x axis as shown in FIGS. 21A and 21C, or may be the z axis direction as shown in FIG. 21B.

However, as shown in FIG. 21B, when the plug-side connector 10 and the receptacle-side connector 20 are fitted with each other, the width (height) of the signal pins 110 and 210 in the z axis direction is not changed at the fitting part, so as to keep the contact of the signal pin 110 of the plug-side connector and the signal pin 210 of the receptacle-side connector 20. Since the width (height) of the signal pins 110 and 210 in the z axis direction is not changed in the fitting part, connection between the connector to which the present modification is applied and a connector to which the present modification is not applied can be ensured.

With reference to FIG. 21B, the signal pin 110 of the plug-side connector 10 stretches in the negative direction of the y axis, and is connected to wiring in a cable. On the other hand, the signal pin 210 of the receptacle-side connector 20 stretches in the positive direction of the y axis, and is connected to a predetermined substrate in the receiving apparatus or the transmitting apparatus.

Thus, in the present modification, the cross-sectional area of the signal pin 110 is expanded in the plug-side connector 10, and the signal pin 110 is directly connected to the wiring in the cable. In addition, the cross-sectional area of the signal pin 210 is expanded in the plug-side connector 20, and the signal pin 210 is connected to the substrate in the apparatus.

As explained above, the cross-sectional area of the signal pin 110 is expanded in the present modification. Accordingly, it is possible to flow larger current through the signal pin while attenuation is suppressed more, and reliability of the connector is improved. Here, the HPD signal pin and the power signal pin are power-supply-voltage application pins to which +5V power-supply voltage is applied. As explained above, more effect of the present modification can be obtained by applying the present modification to the power-supply-voltage application pin to which relatively high voltage is applied, such as the HPD signal pin and/or the power signal pin.

In addition, as described in the following [3.5. Application Example], apparatuses connected via an HDMI connector are able to have a function of supplying power to each other by using the signal pins. The present modification can be appropriately applied to signal pins serving as a power supply path during power supply between such apparatuses.

Moreover, with regard to the present modification, cross-sectional areas of signal pins may be expanded only in a region other than the fitting part of the plug-side connector and the receptacle-side connector. FIG. 21D shows a modification in which wiring width of signal pins are expanded only in a region other than a fitting part of a plug-side connector and a receptacle-side connector. FIG. 21D is a schematic view showing a modification, in which cross-sectional areas of a signal pins are expanded only in a region other than the fitting part, of the connectors corresponding to FIG. 21C.

With reference to FIG. 21D, in a fitting part, cross-sectional areas of a signal pin 110 of the plug-side connector 10 and a signal pin 210 of the receptacle-side connector 20 is not changed also in the x axis direction. Thus, the fitting part secures dimension and shape of the signal pins according to the standard to which the connectors belong, and connection to a general connector conforming to the same standard is also secured.

(3.4.2. Mounting of Device on Substrate)

As shown in FIGS. 9A to 9C and FIGS. 16A to 16C, the connectors according to the first modification and the second modification of the present disclosure include substrates 130, 230, 330, and 430 in the connectors. As described above, the signal pins 110, 210, 310, and 410 are formed on front surfaces of the substrate 130, 230, 330, and 430. However, free regions in which the signal pins 110, 210, 310, and 410 are not formed also exist. With regard to the connectors according to the first modification and the second modification of the present disclosure, various kinds of devices (circuits) that act on transmission of signals in the signal pins may be mounted in the free regions in the front surfaces of the substrates 130, 230, 330. 430. Note that, the modification shown in this item (3.4.2. Mounting of Device on Substrate) can be applied to any configuration in which there is a substrate in a connector.

With reference to FIGS. 22 and 23A to 23C, a modification in which various kinds of devices are mounted on substrates is explained. Note that, in the following explanation with reference to FIGS. 22 and 23A to 23C, the connectors according to the first modification of the present disclosure are used as an example. However, the present modification can also be applied to the connector according to the second modification of the present disclosure and a connector according to the second embodiment (to be described later) of the present disclosure.

In FIG. 22, various kinds of devices (circuits) are mounted in free regions of front surfaces of the substrates of the connectors according to the first modification of the present disclosure. FIG. 22 is a schematic view showing a configuration example of a modification in which a device is provided on a substrate, the modification being one of modifications of the present disclosure.

As shown in FIG. 22, a device 160 that acts on transmission of signals in the signal pins 110 may be mounted in the region in which the signal pins 110 are not formed (free region) in the front surfaces of the substrate 130 in the plug-side connector 10. On the other hand, a device that acts on transmission of signals in the signal pins 210 may be mounted in the region in which the signal pins 210 are not formed (free region) in the front surfaces of the substrate 230 in the receptacle-side connector 20, although the device is not shown in FIG. 17.

Hereinafter, a specific configuration example of the devices provided in the free regions of the substrates 130 and 230 according to the present modification is explained with reference to FIGS. 23A to 23C.

For example, an AC/DC conversion circuit that converts AC transmission into DC transmission of signals to be transmitted by the signal pins may be provided in the free regions of the front surfaces pf the substrates 130 and 230. FIG. 23A shows an example of a circuit configuration of such AC/DC conversion circuit. FIG. 23A is a schematic view showing an example of a circuit configuration of an AC/DC conversion circuit that is a specific example of the device according to the modification shown in FIG. 22.

With reference to FIG. 23A, for example, a data transmitting apparatus 510 that performs AC coupling transmission and a data receiving apparatus 520 that performs DC coupling transmission are connected via a cable 530. The data transmitting apparatus 150 includes a differential driver 511 and a DC component removal filter (capacitor) 512, and can transmit a predetermined DC signal generated by the differential driver 511 to the data receiving apparatus 520 that is a connection partner, via the DC component removal filter 512.

The data receiving apparatus 520 includes a differential receiver 521 and a pull-up register 522 for DC bias, and can receive the DC signal transmitted from the data receiving apparatus 520.

Here, connectors 10 and 20 are provided between the data transmitting apparatus 510 and the cable 530. In addition, registers 531 for generating common-mode voltages and a switch 532 are provided in free regions of substrates 130 and 230 of the connector 10 and 20.

The registers 531 for generating common-mode voltages are voltage shift registers for removing, by using the AC coupling transmission, a common-mode component which occurs in bias voltage applied by the pull-up register 522 for DC bias of the receiving device. The switch 532 causes the registers 531 for generating common-mode voltages to operate as terminators for reducing output voltage to 0 level, while the signal transmission is not performed.

As explained above, since a circuit such as a level shift register is provided in the free regions of the substrates 130 and 230 of the connectors 10 and 20, a function of ensuring the compatibility for performing the AC coupling transmission with regard to a DC coupling interface in the cable is achieved, necessity for mode conversion in the transmitting apparatus and the receiving apparatus is removed, and connection of the transmitting apparatus and the receiving apparatus is facilitated.

Alternatively, for example, a register holding information on characteristics of signals to be transmitted by signal pins and a communication circuit may be provided in the free regions of the front surfaces of the substrates 130 and 230, the communication circuit notifying any apparatus connected via the connector of the information held by the register. An example of configurations of such register and communication circuit is shown in FIG. 23B. FIG. 23B is a schematic view showing an example of configurations of a register and a communication circuit that are specific examples of the device according to the modification shown in FIG. 22.

Figure 23B:
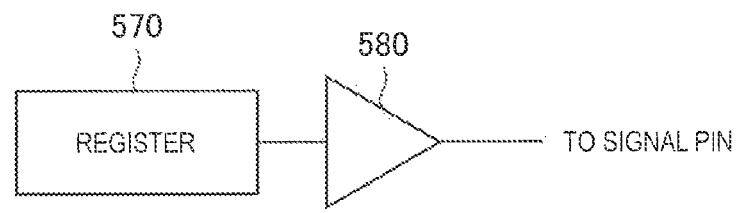
FIG. 23B is a schematic view showing an example of configurations of a register and a communication circuit that are specific examples of the device according to the modification shown in FIG. 22.

With reference to FIG. 23B, a capability register 570 and a communication circuit 580 may be provided in the free regions of the front surface of the substrates 130 and 230. The capability register 570 has information on characteristics of signals transmitted by the signal pins 110 and 210. The information on characteristics of signals transmitted by the signal pins 110 and 210 may be information on bands of the signals, for example. Thus, the capability register 570 can hold information on performance and characteristics of the connector (cable) in which the capability register 570 is mounted.

Via the signal pins 110 and 210, the communication circuit 580 can notify a connection partner apparatus of the information on the characteristic of the signal that the capability register 570 holds. The communication circuit 580 may be an I2C circuit, for example. However, a kind of the communication circuit 580 is not specifically limited, and every known communication circuit may be used.

As described above, since the register and the communication circuit are provided in the connectors, the connection partner apparatus can be notified of the information on performance and characteristics of the connectors (cable) via the communication circuits, the information being held by the register. Accordingly, it is possible to decide a data transmission method in accordance with the characteristics of the cable between the apparatuses connected via the connectors, and more secure data transmission with less transmission deterioration is achieved.

In addition, the capability register 570 may hold authentication data of the connector (cable) in which the capability register 570 is mounted. By using the authentication data, it can be determined whether the connector and the cable are official products between apparatuses connected via the connector.

In addition, memory may be mounted in the free regions of the front surface of the substrates 130 and 230. The memory may temporarily store various kinds of information on data transmission. Since the memory is mounted in the connector, temporal communication using the information stored in the memory is possible between the apparatuses connected via the connector.

For example, a battery for supplying a power signal may be provided in the free regions of the surfaces of the substrates 130 and 230. An example of a configuration of such battery is shown in FIG. 23C. FIG. 23C is a schematic view showing an example of a configuration of a battery that is a specific example of the device according to the modification shown in FIG. 22.

Figure 23C:
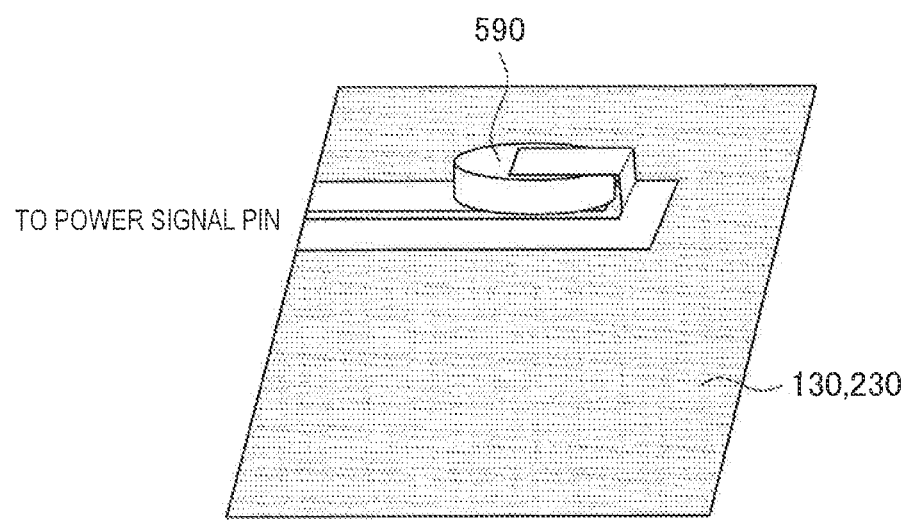
FIG. 23C is a schematic view showing an example of a configuration of a battery that is a specific example of the device according to the modification shown in FIG. 22.

As shown in FIG. 23C, a battery 590 is mounted in the free region of the front surfaces of the substrates 130 and 230. Voltage corresponding to power-supply voltage may be supplied from the battery 590 to at least any one of the signal pins 110 and 210. Since the battery 590 is mounted in the free region of the front surface of the substrates 130 and 230 and supplies power, the apparatus connected via the connector in which the battery 590 is mounted can execute only a minimal function, for example, in a case where the power supply from the apparatus is stopped due to some kind of trouble.

The battery 590 may be a rechargeable secondary battery. In the case where the battery 590 is a secondary battery, the battery 590 may be charged by power supply from the apparatus connected via the connector in which the battery 590 is mounted.

Note that, an equalizer corresponding to the characteristics of the connector (cable) may be provided in the free region of the front surface of the substrates 130 and 230. Since the equalizer is provided in the free region of the front surfaces of the substrates 130 and 230, more stable data transmission can be achieved.

The modification in which various kinds of devices are mounted on the substrates has been described, the modification being one of the modifications of the present disclosure. By mounting the various kinds of devices in the free regions of the substrates, the connectors themselves can perform various kinds of signal processing. Accordingly, it is possible to simplify the signal processing in the transmitting apparatus and the receiving apparatus that are connected via the connectors.

Note that, the above-explained device is an example of devices to be mounted on the substrates, and the present modification is not limited thereto. As the device 160 provided on the substrate in the connector, any device may be mounted.

[3.5. Application Example]

Next, an application example of the connectors according to the first modification and the second modification of the present disclosure to a data receiving apparatus and/or a data transmitting apparatus is explained. Note that, the application example (to be described later) can be applied to not only the connectors according to the first and second modification of the present disclosure, but also the connector according to the first embodiment of the present disclosure and the connector according to the second embodiment (to be described later) of the present disclosure.

Diverse applications have been developed with regard to communication between apparatuses that use HDMI interfaces. The connectors according to the first embodiment of the present disclosure explained in <2. First Embodiment>, the connectors according to the first and second modifications of the present disclosure explained in [3.2. First Modification] and [3.3. Second Modification], and the connector according to the second embodiment of the present disclosure (to be described later in <4. Second Embodiment>) can be suitably applied to various kinds of applications with regard to communication between apparatuses that use the HDMI interfaces. In the following, "CEC" and "power supply control" are used as examples of the applications in the communication between the apparatuses that use the HDMI interfaces. Note that, the connectors according to the first embodiment, the second embodiment, the first modification, and the second modification are not limited thereto, and can be applied to all other applications with regard to communication between the apparatuses that use the HDMI interfaces.

(3.5.1. CEC Control)

First, the CEC control is explained. In a transmission line of the HDMI standard, a line that is capable of bi-directionally transmitting control data and that is referred to as a Consumer Electrics Control (CEC) line is prepared for control between a source device and a sink device, in addition to a video data transmission line. By using the CEC line, it is possible to control a partner's device. In addition, when executing the CEC control, it is possible to automatically perform whether control using a CEC line of a HDMI cable can be executed, in a device on the basis of processing performed at connection authentication using a DDC line.

In the following explanation of the CEC, a case where the source device is a disc recorder and the sink device is a television receiver is used as a specific example. The disc recorder and the television receiver include any of the connector according to the first embodiment of the present disclosure, the connector according to the second embodiment (to be described later), the connector according to the first modification, and the connector according to the second modification, as a receptacle-side connector. In addition, an HDMI cable for connecting the disc recorder and the television receiver includes any of the connector according to the first modification of the present disclosure, the connector according to the second modification, and the general HDMI connector, as a plug-side connector. Note that, the pin arrangement of the plug-side connector and the receptacle-side connector is unified into any of the general pin arrangement shown in FIG. 6A or FIG. 7A, and the pin arrangement in which the data lines shown in FIG. 6B or FIG. 7B are added.

Figure 24:
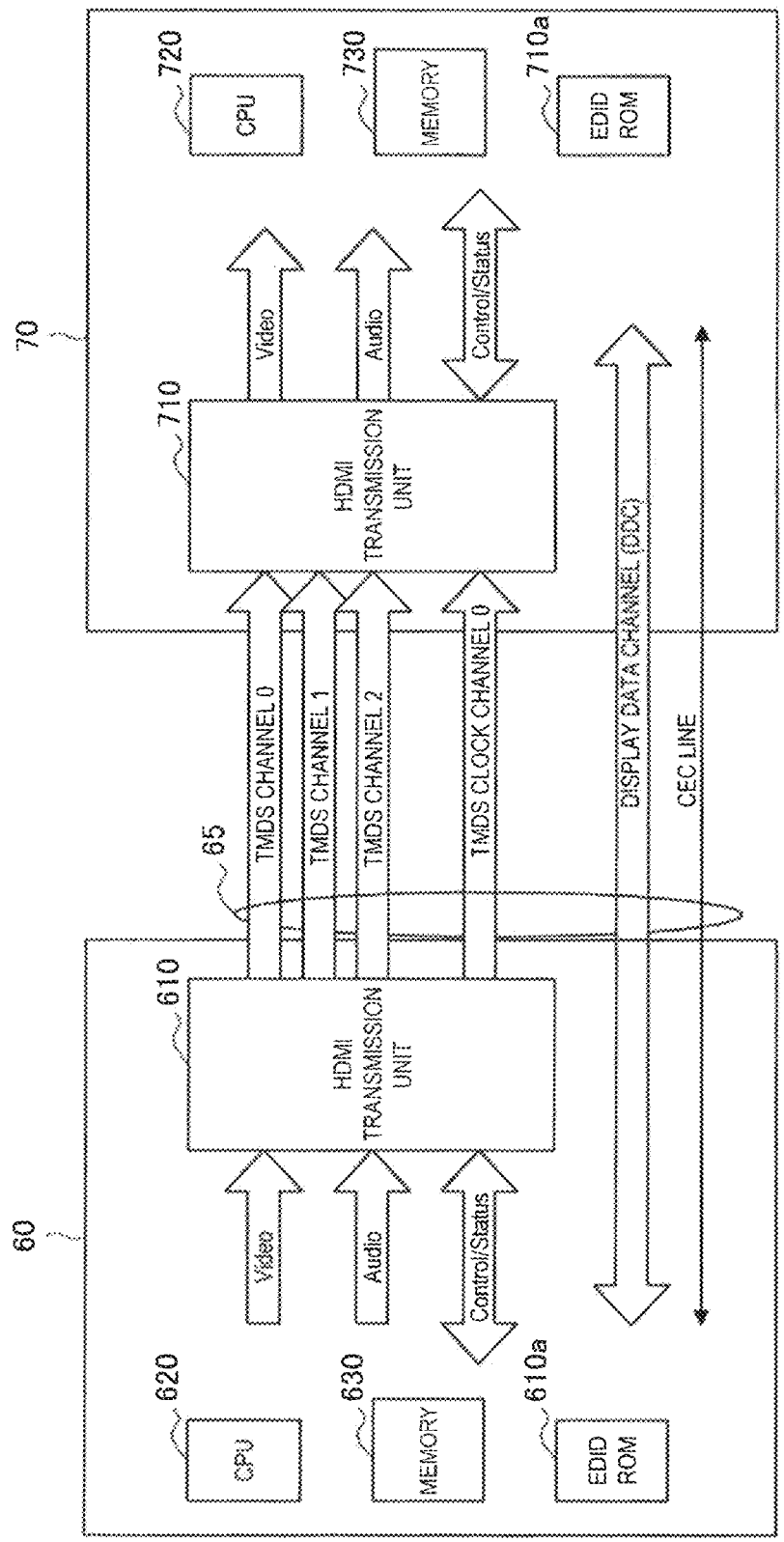
FIG. 24 is an explanatory diagram illustrating a data configuration example of each channel transmitted between a disc recorder and a television receiver by a HDMI cable.

First, with reference to FIG. 24, a data configuration example of each channel transmitted between a disc recorder 60 and a television receiver 70 via an HDMI cable 65 is explained. In the HDMI standard, three channels including a channel 0 (Data0), a channel 1 (Data1), and a channel 2 (Data2) are prepared as channels for transmitting video data, and a clock channel (clock) for transmitting pixel clock is further prepared. In addition, a DDC and CEC are prepared as a power transmission line and a control-data transmission channel. The Display Data Channel (DDC) is mainly a data channel for display control, and Consumer Electrics Control (CEC) is mainly a data channel for transmitting control data used for controlling a partner's device connected via the cable.

Configurations of respective channels are explained. The channel 0 transmits pixel data of B data (blue data), vertical synchronization data, horizontal synchronization data, and auxiliary data. The channel 1 transmits pixel data of G data (green data), two kinds of control data (CTL0 and CTL1), and auxiliary data. The channel 2 transmits pixel data of R data (red data), two kinds of control data (CTL2 and CTL3), and auxiliary data. Note that, under the HDMI standard, primary color data that is subtractive mixture of cyan, magenta and yellow can be transmitted instead of the blue data, the green data, and the red data.

The CEC serving as the control data transmission channel is a channel in which data transmission is bi-directionally performed at a clock frequency lower than the channels (channels 0, 1, and 2) for transmitting the video data.

A configuration of data to be transmitted by channels (channel 0, channel 1, channel 2, clock channel, and DDC) other than the CEC may be identical to a configuration of data to be transmitted through an HDMI scheme in practical use, or may be a configuration of data corresponding to the pin arrangement in which the data lines are added as shown in FIG. 6A or FIG. 7B.

The source device 60 and the sink device 70 include HDMI transmission units 610 and 710 for performing data transmission, and EDID ROM 610a and 710 a serving as storage units for storing Enhanced Extended Display Identification Data (E-EDID) information. The E-EDID information stored in the EDID ROM 610a and 710a is information in which a format of video data (that is, displayable or recordable data) treated by devices is written. However, in the present example, the E-EDID information is expanded, and information on details of the devices, specifically, control function corresponding information is stored. In a case where connection via the HDMI cable 1 is detected in the present example, storage information of E-EDID ROM 610a or 710a of the partner's devices is read out, and collation of the E-EDID information is performed.

The source device 60 and the sink device 70 include CPUs 620 and 720 that are control units for performing operation control of the entire source device 60 and the entire sink device 70. In addition, the source device 60 and the sink device 70 include memory 630 and 730 for temporarily storing programs to be executed by the CPUs 620 and 720 and various kinds of information to be processed by the CPUs 620 and 720. Data to be transmitted via the DDC line and the CEC line of the HDMI cable 65 is transmitted and received under control of the CPUs 620 and 720.

Figure 25:
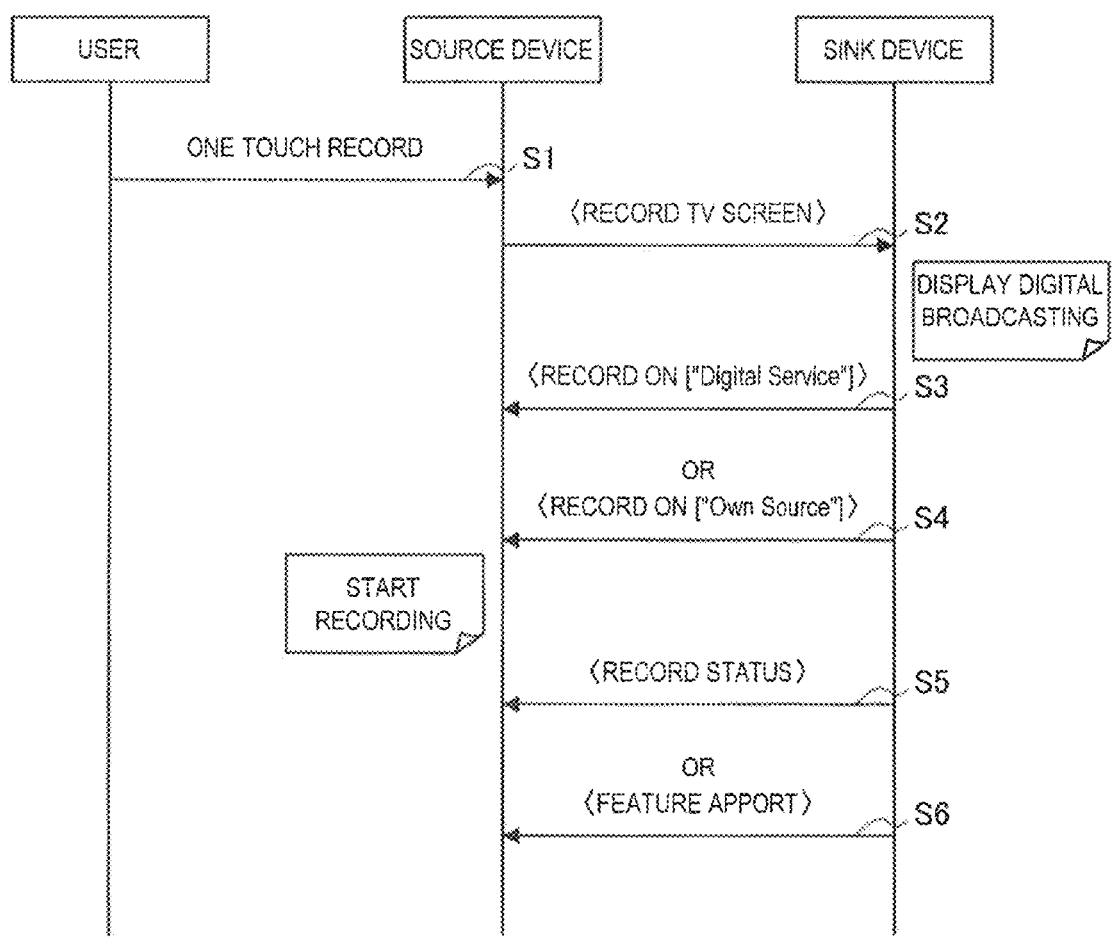
FIG. 25 is a sequence diagram showing a sequence example of CEC in a case where a source device and a sink device are connected.

Next, FIG. 25 shows a sequence example of the CEC control in a case where the source device and the sink device are connected. Here, "Record TV Screen" that is an optional function based on the CEC standard is used for an explanation.

When a user's operation gives an instruction of content for executing program recording of a same channel as a screen of the television receiver, to the disc recorder that is the source device connected via the HDMI cable 65 (Step S1), the source device transmits a "Record TV Screen" command to the sink device via the CEC line, and gives a request to the sink device (Step S2).

In response to the request in Step S2, the sink device replies service information of currently displayed digital broadcasting program (Step S3). Alternatively, the sink device replies information indicating that the source device is a video source (Step S4) in a case where the program that is being displayed by the sink device is input from the source device via the HDMI cable 65. In response to the reply in Step S3 or S4, the source device returns a status of recording execution to the sink device (Step S5), or returns a massage that the function is not executed to the sink device (Step S6).

Note that, it is also possible to perform the user operation in Step S1 on the sink device (television receiver).

Next, with reference to the flowchart in FIG. 21, a process example when devices are connected via the HDMI cable 65 is explained.

Figure 26:
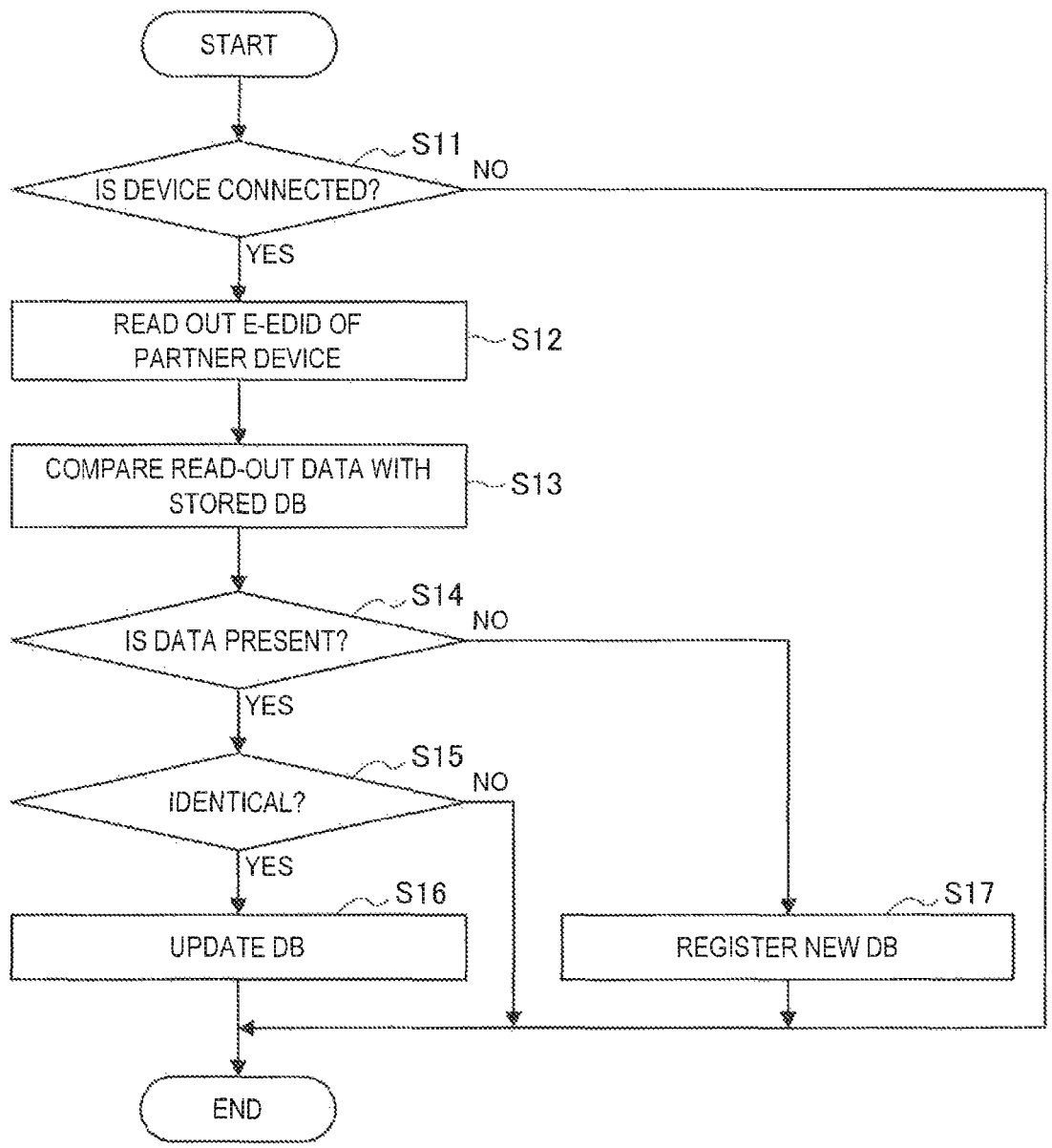
FIG. 26 is a flowchart showing a CEC compliance check procedure in each device in a case where the devices connected via an HDMI cable are detected.

FIG. 26 shows a CEC compliance check process procedure in each device in a case where the device connected via an HDMI cable is detected. In the present example, the check process is performed by both the source device and the sink device.

The process of the flowchart in FIG. 26 is explained. As a function decided by the HDMI status, there is a function referred to as hot plug detect. The function detects connection between the source device and the sink device since the source device observes voltage of an HIPD terminal pulled up to a power source of +5V in the sink device, the voltage being transmitted from the source device, and the voltage becomes "H" voltage when the source device is connected to the HDMI connector.

By using the function, it is determined whether a device is connected via the HDMI cable 65 (Step S11). In a case where the device connection has not been detected, the process ends. In a case where the device connection has been detected, E-EDID data stored in EDID ROM of a partner device is read out using the DDC line (Step S12). Subsequently, the read-out data is compared with E-EDID database stored in the own device (Step S13).

On the basis of the comparison, it is determined whether (Step S14). In a case where the data is not present, the device is determined to be a newly connected device, and the newly read-out E-EDID data is registered in the database (Step S17). In a case where the data is present, it is subsequently determined whether the data are identical to each other (Step S15). In a case where the data are identical to each other, it is determined that a CEC compliance of the partner device is not changed. Accordingly, the process ends. In a case where the data are different, a new data is overwritten and updated in the database storing the read-out data (Step S16), and the process ends. As described above, it is possible to recognize the latest CEC compliance status since each device reads out E-EDID data of each connected device.

With reference to FIGS. 24 to 26, the example of the CEC control of communication between the devices using the HDMI interface has been explained. When the connector according to the first embodiment of the present disclosure, the connector according to the second embodiment (to be described later), the connector according to the first modification, or the connector according to the second modification is used for connectors of the source device 60, the sink device 70 and the HDMI cable 65, it is possible to reduce the deterioration in signals even if larger amounts of data are transmitted at higher speed. Thus, more reliable CEC control can be performed.

Note that, details of the CEC control can be referred to by JP 4182997B.

(3.5.2. Power Supply Control)

Next, the power supply control is explained. In the HDMI standard, power-supply voltage and electric current are prescribed so as to supply power to a device connected via an HDMI connector. For example, under the HDMI standard, +5V power can be supplied from the source device to the sink device by 55 mA at a minimum and by 500 mA at a maximum. In addition, with regard to the receiving apparatus and the transmitting apparatus that are connected via the HDMI connector, the transmitting apparatus transmits, to the receiving apparatus, request information for requesting power supply. According to the transmitting of the request information, the receiving device can supply power to an internal circuit in the transmitting apparatus via the HDMI cable.

Note that, in the following explanation of power supply, the source device and the sink device include any of the connector according to the first embodiment of the present disclosure, the connector according to the second embodiment (to be described later), the connector according to the first modification, and the connector according to the second modification, as receptacle-side connectors. In addition, an HDMI cable for connecting the source device and the sink device includes any of the connector according to the first modification of the present disclosure, the connector according to the second modification, and the general HDMI connector, as a plug-side connector. Note that, the pin arrangement of the plug-side connector and the receptacle-side connector is unified into any of the general pin arrangement shown in FIG. 6A or FIG. 7A, and the pin arrangement in which the data lines shown in FIG. 6B or FIG. 7B are added.

Figure 27:
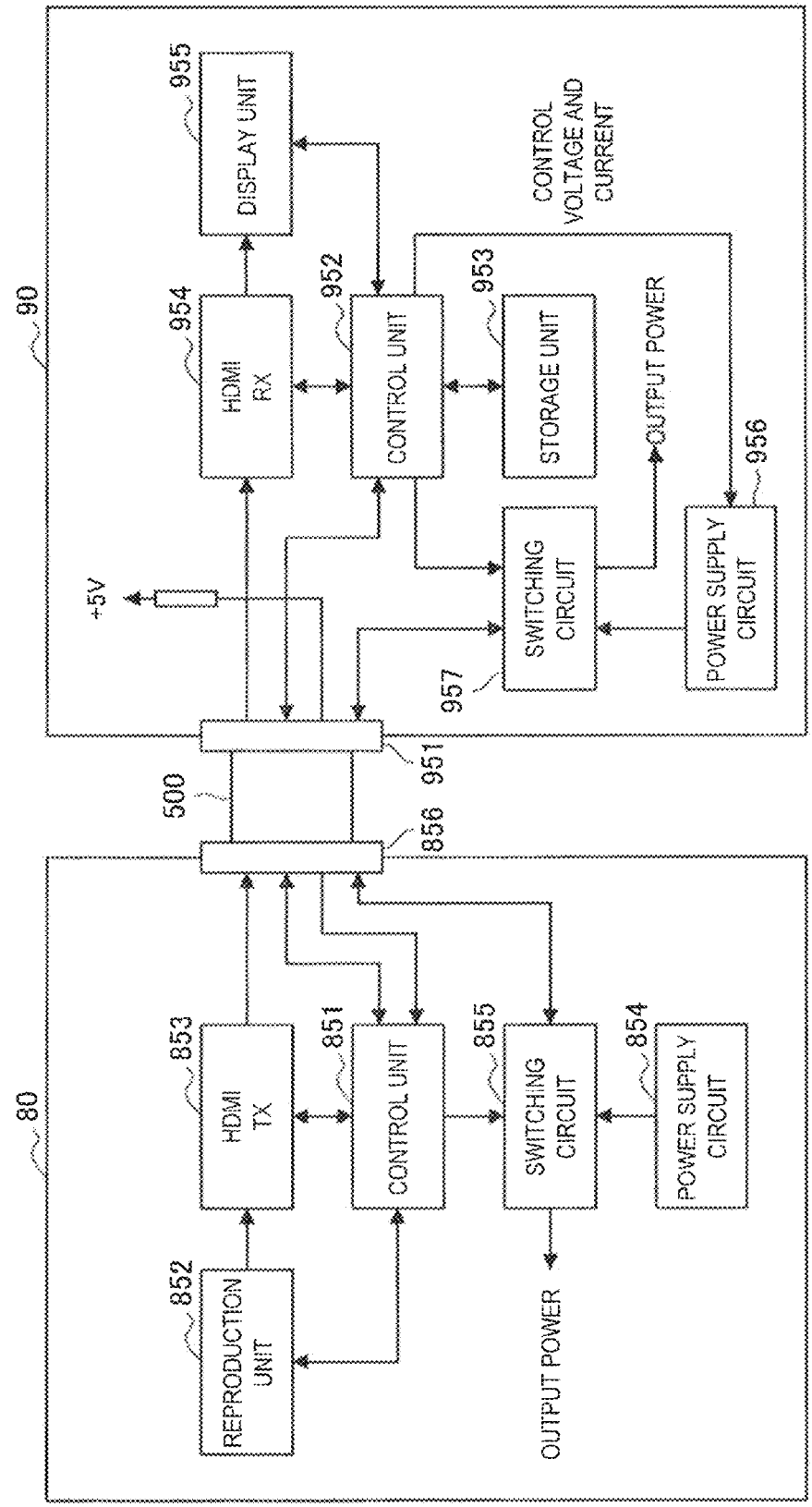
FIG. 27 is a functional block diagram showing a configuration example of a communication system including a source device and a sink device, in power supply control.
Figure 28:
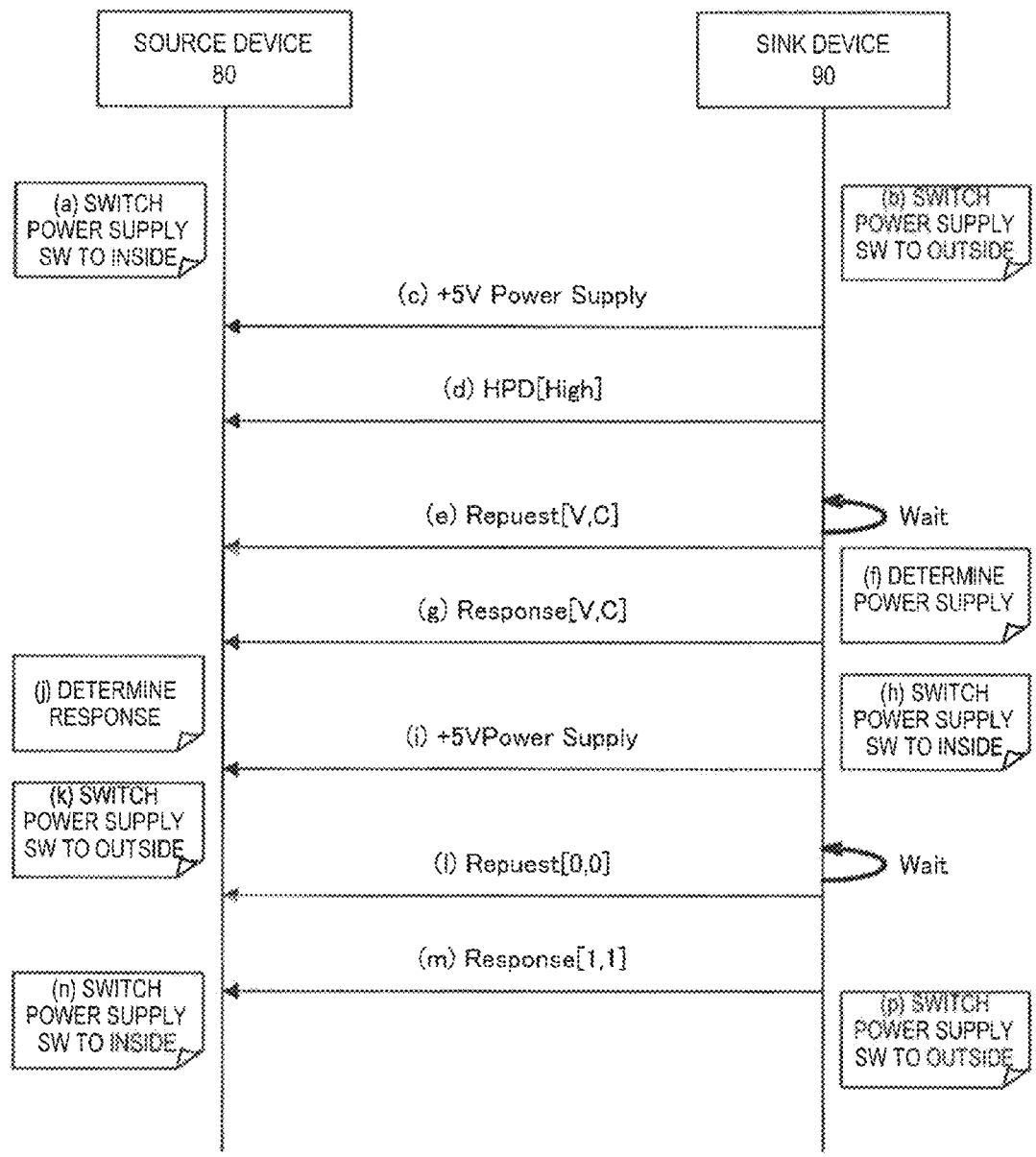
FIG. 28 is a sequence diagram showing a control sequence in power supply control.

Here, with reference to FIGS. 27 and 28, an embodiment of power supply control is explained. FIG. 27 shows a configuration example of a communication system as an embodiment.

The communication system includes a source device 80 and a sink device 90. The source device 80 and the sink device 90 are connected via an HDMI cable 500. For example, although an imaging unit and a recoding unit are not shown in FIG. 22, the source device 80 is a battery-powered mobile device such as a digital camera recorder or a digital still camera, and the sink device 90 is a television including a power supply circuit with sufficient performance.

The source device 80 includes a control unit 851, a reproduction unit 852, an HDMI transmitter (HDMI source) 853, a power supply circuit 854, a switching circuit 855, and HDMI connector 856. The control unit 851 controls operation of the reproduction unit 852, the HDMI transmitter 853, and the switching circuit 855. From a recording medium (not shown), the reproduction unit 852 reproduces a baseband image data (uncompressed video signals) of predetermined content and audio data (audio signals) attached to the image data, and supplies to the HDMI transmitter 853. The control unit 851 controls selection of reproduction content in the reproduction unit 852 on the basis of a user's operation.

Through communication compliant with the HDMI, the HDMI transmitter (HDMI source) 853 transmits the baseband image and audio data that are supplied from the reproduction unit 852 from the HDMI connector 856 to the sink device 90 in one direction via the HDMI cable 500.

The power supply circuit 854 generates power to be supplied to the internal circuit of the source device 80 and the sink device 90. The power supply circuit 854 is, for example, a battery circuit that generates power from a battery. The switching circuit 855 selectively supplies the power generated by the power supply circuit 854 to the internal circuit and the sink device 90, and selectively supplies the power supplied from the sink device 90 to the internal circuit. The switching circuit 855 constitutes a power supply unit and a power switching unit.

The sink device 90 includes an HDMI connector 951, a control unit 952, a storage unit 953, an HDMI receiver (HDMI sink) 954, a display unit 955, a power supply circuit 956, and a switching circuit 957. The control unit 952 controls operation of the HDMI receiver 954, the display unit 955, the power supply circuit 956, and the switching circuit 957. The storage unit 953 is connected to the control unit 952. The storage unit 953 stores information necessary for control performed by the control unit 952, such as Enhanced extended display identification (E-EDID).

Through communication compliant with the HDMI, the HDMI receiver (HDMI sink) 954 receives the baseband image and audio data that are supplied to the HDMI connector 951 via the HDMI cable. The HDMI receiver 954 supplies the received image data to the display unit 955. In addition, the HDMI receiver 954 supplies the received audio data, for example, to a speaker (not shown). Details of the HDMI receiver 954 are described later.

The power supply circuit 956 generates power to be supplied to the internal circuit of the sink device 90 and the source device 80. The power supply circuit 956 is, for example, a power supply circuit with sufficient performance for generating power (AC power) from an AC power. The switching circuit 957 selectively supplies power generated in the power supply circuit 956 to the internal circuit and the source device 80, and selectively supplies power to be supplied from the source device 80 to the sink device 90 to the internal circuit. The switching circuit 957 constitutes a power supply unit.

Next, with reference to FIG. 28, a control sequence in power supply control is explained.

With reference to FIG. 28, first, (a) the switching circuit 855 of the source device 80 is switched to a state in which power from the power supply circuit 854 of the source device 80 is supplied to the internal circuit and the HDMI connector 856 of the source device 80. In addition, (b) the switching circuit 957 of the sink device 90 is switched to a state in which power from the power supply circuit 854 of the source device 80 is supplied to the internal circuit of the sink device 90 via the HDMI cable 500. When the sink device 90 is connected to the source device 80 via the HDMI cable 500 in the state of (a) and (b), (c) +5V power is supplied from the power supply circuit 854 of the source device 80 to the internal circuit of the sink device 90 via the HDMI cable 500. Note that, to the internal circuit of the source device 80, +5V power is supplied from the power supply circuit 854 of the source device 80.

(d) In this case, voltage of a pin 19 (HPID) of the HDMI connector of the sink device 90 becomes high, and correspondingly voltage of a pin 19 (HPD) of the HDMI connector 856 of the source device 80 becomes high. Thus, the control unit 851 of the source device 80 can recognize the connection to the sink device 90.

(e) Subsequently, on the basis of a user operation, information on remaining amount of battery constituting the power supply circuit 854, or the like, the source device 80 transmits a <Request Power Supply> command that is a power supply request, to the sink device 90 via the CEC line.

(f) The sink device 90 determines whether it is possible to supply a voltage value and a current value that are requested by the <Request Power Supply> command, and (g) transmits a <Response Power Supply> command that is a power supply response including a result of the determination to the source device 80 via the CEC line.

(h) In a case where it is possible to supply the requested voltage value and current value, the sink device 90 controls the voltage value and the current value of the power supply from the power supply circuit 956 in a manner that the voltage value and the current value of the power supply from the power supply circuit 956 correspond to the voltage value and the current value that have been requested by the source device 80, and switches the switching circuit 957 to a state in which the power from the power supply circuit 956 of the sink device 90 is supplied to the internal circuit and the HDMI connector 951 of the sink device 90. (i) Accordingly, power from the power supply circuit 956 of the sink device 90 is supplied to the source device 80 via the HDMI cable.

(j) The source device 80 determines the <Response Power Supply> command transmitted from the sink device 90. (k) In a case where a response indicates that supply is possible, the source device 80 switches the switching circuit 855 to a state in which power from the power supply circuit 956 of the sink device 90 is supplied to the internal circuit of the source device 80 via the HDMI cable 500. Thus, the power supplied from the sink device 90 is supplied to the internal circuit of the source device 80.

(l) Subsequently, when the power in the source device 80 becomes not necessary, the source device 80 transmits, to the sink device 90, a <Request Power Supply> command indicating that the power supply is not necessary. (m) The sink device 90 detects the <Request Power Supply> command, and returns a <Response Power Supply> command to the source device 80. (n) Correspondingly, the source device 80 puts the switching circuit 855 back to the state of (a), and (q) the sink device 90 puts the switching circuit 957 back to the state of (b). Accordingly, the power supply states of the source device 80 and the sink device 90 are put back to the initial states.

With reference to FIGS. 27 to 28, the power supply control in the communication between the devices using the HDMI interfaces has been explained. When the connector according to the first embodiment of the present disclosure, the connector according to the second embodiment (to be described later), the connector according to the first modification, or the connector according to the second modification is used for connectors of the source device 80, the sink device 90 and the HDMI cable 500, it is possible to reduce the deterioration in signals even if larger amounts of data are transmitted at higher speed. Thus, more reliable power supply control can be performed. In addition, the reliability can be improved more by applying the modification explained in (3.4.1. Expansion of Cross-sectional Area of Signal Pin) to the signal pins used as the power supply path during the power supply control.

Note that, details of the power supply control can be referred to by JP 2009-44706A for example.

<4. Second Embodiment>

The second embodiment of the present disclosure has a configuration obtained by applying the configuration according to the first modification or the second modification explained in <3. Modification due to Increase in Transmission Data Amount> to the configuration according to the first embodiment of the present disclosure explained in <2. First Embodiment>. Hereinafter, a configuration of a connector according to the second embodiment is explained, and signal transmission characteristics in the configuration are explained.

[4.1. Configuration of Connector According to Second Embodiment]

With reference to FIG. 29, a configuration of a receptacle-side connector according to the second embodiment of the present disclosure is explained. FIG. 29 is a cross-sectional view showing a structural example of a receptacle-side connector according to the second embodiment of the present disclosure when being cut at a y-z plane through signal pins.

Note that, FIG. 29 shows a configuration corresponding to the Type A receptacle-side HDMI connector and the Type D receptacle-side HDMI connector, as a configuration example of the connector according to the second embodiment. As explained, the configuration according to the second embodiment shown in FIG. 29 corresponds to a configuration obtained by combining the configuration of the receptacle-side connector according to the first embodiment shown in FIG. 4A and the configuration of the receptacle-side connector according to the second modification shown in FIGS. 16A to 16C. Note that, the second embodiment is not limited thereto. The second embodiment may have a configuration corresponding to the Type C receptacle-side HDMI connector. That is, the receptacle-side connector according to the second embodiment may be a configuration obtained by combining the configuration according to the first embodiment corresponding to the Type C receptacle-side HDMI connector and the configuration of the receptacle-side connector according to the second embodiment shown in FIGS. 9A to 9C. In addition, the second embodiment of the present disclosure can be applied to a connector based on another communication method or another communication standard.

With reference to FIG. 29, the receptacle-side connector 2 according to the second embodiment includes signal pins 21, a dielectric 22, a substrate 23, and a shell 24. As explained, the receptacle-side connector 2 shown in FIG. 29 corresponds to a configuration obtained by combining the configuration of the receptacle-side connector according to the present embodiment shown in FIG. 4A and the configuration of the receptacle-side connector according to the second modification shown in FIGS. 16A to 16C. Accordingly, the functions and the configurations of the signal pin 21, the dielectric 22, the substrate 23, and the shell 24 in the receptacle-side connector 2 are obtained by combining the functions and the configurations of the signal pin 11, the dielectric 12, and the shell 13 that have been explained with reference to FIG. 4A and the functions and the configurations of the signal pin 410, the dielectric 420, the substrate 430, and the shell 440 that have been explained with reference to FIGS. 16A to 16C.

The signal pin 21 extends in a first direction, in other words, a y axis direction. In addition, the signal pin 21 is formed as a wiring pattern on a surface of the substrate 23 formed of dielectric.

The shell 24 covers the signal pins 21 and the substrate 23. One surface of the shell 24 in the negative direction of the y axis is an open surface open to an outside. In addition, the shell 24 is formed of an electric conductor. Potential of the shell 24 is fixed to, for example, the ground potential.

An open surface is provided in a shell of a plug-side connector (not shown) corresponding to the open surface of the shell 24. An end of the shell of the plug-side connector (not shown), in which the open surface is provided, is inserted in an opening of the open surface of the shell 24 of the receptacle-side connector 2 from the negative direction of the y axis. Accordingly, the plug-side connector and the receptacle-side connector 2 are fitted. In addition, the dielectric 22 may be stacked above (in positive direction of the z axis) the signal pin 21 formed on the substrate 23. Note that, when the dielectric 22 is formed, the dielectric 22 is formed in a manner that a part of a region of the surface of the signal pin 21 is exposed in a predetermined region near the open surface of the shell 24. In a predetermined region near the open surface of the shell 24, the signal pin 21 includes an exposed part in which a part of a region of a surface of the signal pin 21 is exposed from the dielectric 22. When the plug-side connector and the receptacle-side connector 2 are fitted, the exposed part of the signal pin 11 contacts a signal pin of the plug-side connector. Accordingly, the plug-side connector and the receptacle-side connector 2 are electrically connected to each other.

An electric conductor layer having ground potential is formed on a rear surface of the substrate 23, in other words, an opposite surface of a surface on which the signal pin 21 is formed. With reference to FIG. 29, according to the present modification, a surface of a shell 24 that faces the rear surface of the substrate 23 is thicker than other surfaces, and is in contact with the rear surface of the substrate 23. Thus, the electric conductor layer formed on the rear surface of the substrate 23 is integrated with the shell 24. Note that, in the present modification, it is only necessary to form the electric conductor layer having ground potential on the rear surface of the substrate 430. The structure of the electric conductor layer is not limited to the above example. Accordingly, the surface of the shell 24 is not necessarily thickened. For example, the electric conductor layer formed on the rear surface of the substrate 23 may be electrically connected to the shell 24 through a via hole or the like.

Since the receptacle-side connector 2 according to the second embodiment has the configuration corresponding to the Type A HDMI connector and the Type D HDMI connector as described above, structural elements similar to the signal pin 21 and the dielectric 22, the substrate 23, and the electric conductor layer are horizontal-line symmetrically provided inside the shell 24 at both the upper and lower sides in the z axis direction.

With reference to FIG. 29, a mounted substrate 25 connected to the signal pins 21 of the receptacle-side connector 2 is disposed in the transmitting apparatus and the receiving apparatus. As shown in FIG. 29, the signal pins 21 stretch toward the positive direction of the y axis in the transmitting apparatus and the receiving apparatus, are bent toward the mounted substrate 25 in the transmitting apparatus and the receiving apparatus, and are connected to the mounted substrate 25. Specifically, a plurality of wiring patterns 26 corresponding to the signal pins 21 are provided on the mounted substrate 25, and the signal pins 21 are connected to the wiring patterns 26 on the mounted substrate 25 in the transmitting apparatus and the receiving apparatus. The wiring patterns 26 stretch toward various circuits for performing predetermined signal processes on the mounted substrate 25 or other substrates. Various signals transmitted via the signal pins 21 are further transmitted to the predetermined circuits by the wiring patterns 26, and signal processes corresponding to the respective signals are appropriately performed in such circuits. As explained above, the signal pin 21 is connected to the wiring pattern 26 on the mounted substrate 25 and transmits a signal to an inside and an outside of any apparatus, the mounted substrate 25 having an end disposed in the apparatus.

The shell 24 is formed of an electric conductor and grounded to ground potential on the mounted substrate 25, in a manner that the shell 24 covers the signal pins 21 in a region in which the signal pins 21 stretches toward the mounted substrate 25. In addition, as shown in FIG. 29, between the shell 24 and the mounted substrate 25, grounding parts 27a to 27g for connecting the shell 24 to ground potential are provided. The grounding parts 27a to 27g are, for example, formed of the same dielectric as that of the shell 24, and are grounded to ground potential on the mounted substrate 25. Accordingly, the locations in which the grounding parts 27a to 27g are provided represent grounding locations of the shell 24 and the mounted substrate 25. In the example shown in FIG. 29, the grounding parts 27a to 27g having sizes similar to those of the grounding parts 16a to 16g indicated by dashed lines in FIG. 4B are arranged at locations similar to the grounding parts 16a to 16g.

With reference to FIG. 29, the configuration of a receptacle-side connector 2 according to the second embodiment of the present disclosure has been explained. In the second embodiment, both the effect of the configuration of the receptacle-side connector 1 explained in <2. First Embodiment> and the effect of the configuration of the receptacle-side connector 40 explained in <3. Modification due to Increase in Transmission Data Amount> can be obtained. Accordingly, the shell 24 in the receptacle-side connector 2 according to the first embodiment is grounded to ground potential on the mounted substrate 25 in a manner that the shell 24 covers the signal pins 21 in the region in which the signal pins 21 stretch toward the mounted substrate 25. Accordingly, shielding effect of signal pins can be achieved. In addition, the so-called microstrip structure between the signal pins 21 and the shell 24 achieves effect of controlling impedance. Therefore, it is possible to reduce deterioration in signal quality due to disturbance and the like with regard to signals transmitted to the signal pins 21. In addition, not only in a lower portion of the shell 24, but also in every portion of the shell 24, a path through which induction current generated in the shell 24 flows out to the mounted substrate 25 is formed. Therefore, EMI is suppressed, and it is possible to reduce deterioration in signals transmitted to the signal pins 21. In addition, in the receptacle-side connector 2 according to the second embodiment, signal pins 21 are formed on the substrate 23 formed of the dielectric, and the electric conductor layers having the ground potential are formed on the opposite side of the surface of the substrate 23 on which the signal pins 21 are formed. Accordingly, the receptacle-side connector 2 according to the present modification has a configuration that a ground plane (electric conductor layer), a dielectric layer (substrate 23), and wirings (signal pins 21) are stacked in this order. According to such configuration, an electromagnetic field due to current (signal) flowing in the signal pins 21 is trapped in the substrate 23, and the so-called microstrip lines (microstrip structure) is formed. Thus, in the second embodiment, it is possible to reduce effects of the current (signal) flowing through the signal pins 21 on other signal pins 21, and the deterioration in signals can be further reduced.

[4.2. Comparison of Characteristic]

Next, a result of comparison in a characteristic of a signal flowing through a signal pin and an EMI characteristic between the general Type A HDMI connector structure shown in FIGS. 15A to 15C and the connector structure according to the second embodiment shown in FIG. 29 is explained.

First, with reference to FIGS. 30A to 30B and FIGS. 31A to 31C, difference in signal transmission characteristics as represented by an eye pattern between the general Type A HDMI connector and the connector according to the second embodiment is explained.

Figure 30A:
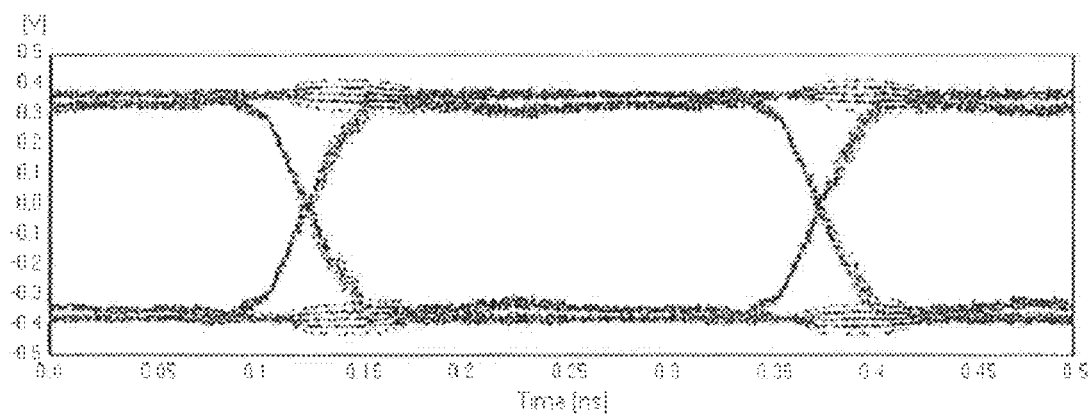
FIG. 30A is a voltage characteristic diagram showing an eye pattern of a general Type A HDMI connector structure.
Figure 30B:
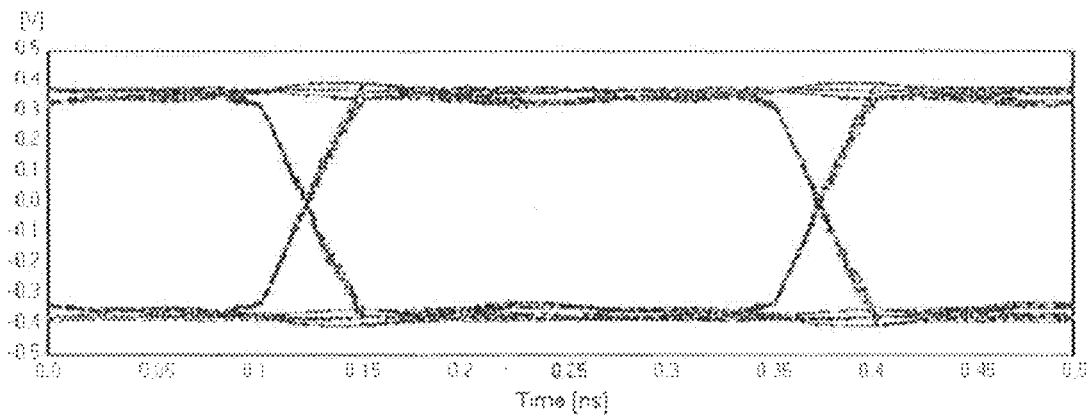
FIG. 30B is a voltage characteristic diagram showing an eye pattern of a general Type A HDMI connector structure.

FIGS. 30A and 30B are each a voltage characteristic diagram showing an eye pattern of a general Type A HDMI connector structure shown in FIGS. 15A to 15C. Note that, the results in FIGS. 30A and 30B show simulation results of voltage characteristics when signals corresponding to the general pin arrangement (that is, pin arrangement in which three sets of differential signal data lines are provided) shown in FIG. 6A. FIG. 30A shows an eye pattern of the "Data 1" line shown in FIG. 6A, and FIG. 30B shows an eye pattern of the "Data 2" line shown in FIG. 6A.

Figure 31A:
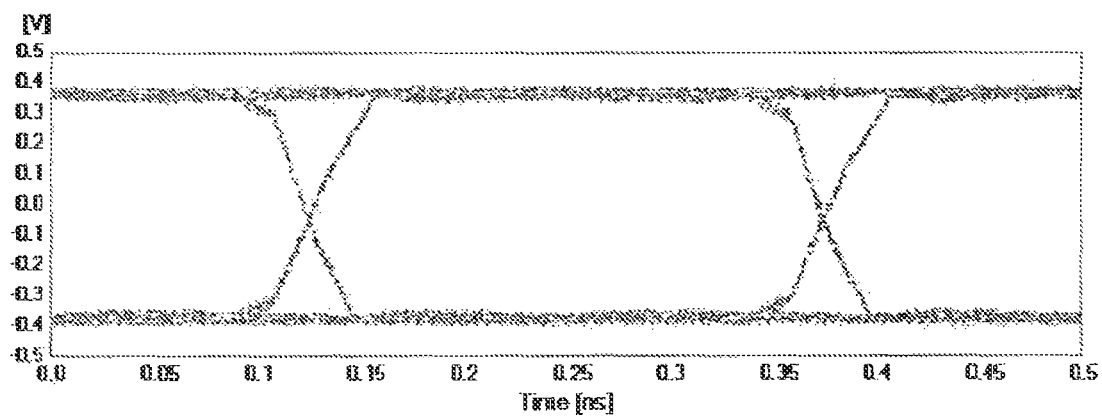
FIG. 31A is a voltage characteristic diagram showing an eye pattern of a connector structure according to the second embodiment shown in FIG. 29.
Figure 31B:
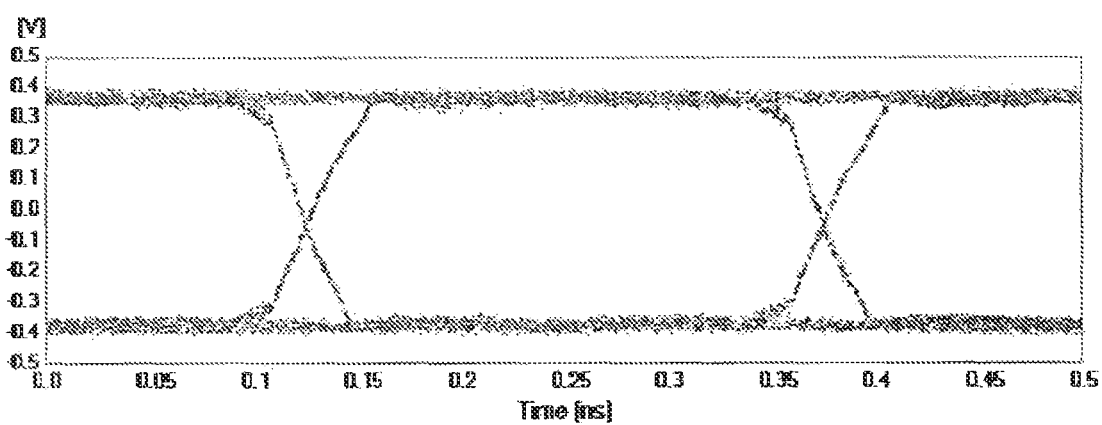
FIG. 31B is a voltage characteristic diagram showing an eye pattern of a connector structure according to the second embodiment shown in FIG. 29.
Figure 31C:
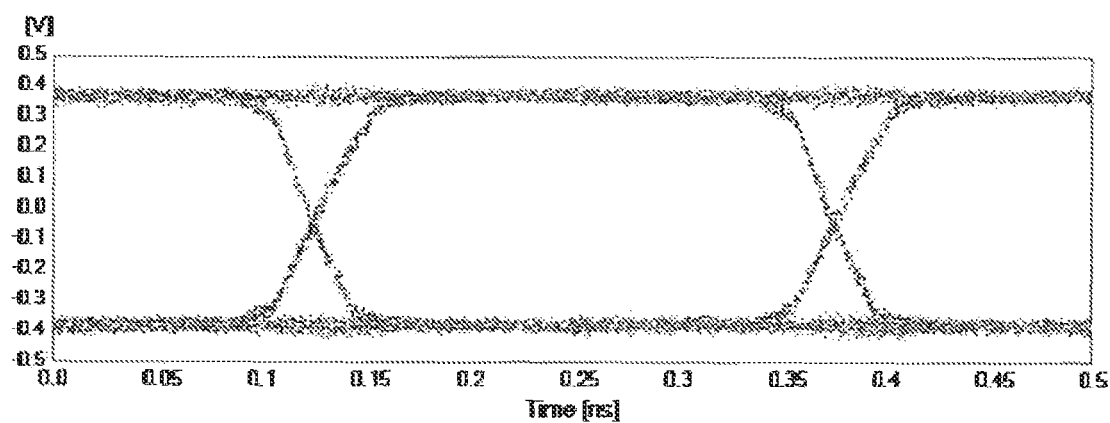
FIG. 31C is a voltage characteristic diagram showing an eye pattern of a connector structure according to the second embodiment shown in FIG. 29.

FIGS. 31A to 31C are each a voltage characteristic diagram showing an eye pattern of a connector structure according to the second embodiment shown in FIG. 29. Note that, the results in FIGS. 31A and 31C show simulation results of voltage characteristics when signals corresponding to the pin arrangement in which differential data lines are newly added (that is, pin arrangement in which six sets of differential signal data lines are provided) shown in FIG. 6B. FIG. 31A shows an eye pattern of the "Data 1" line shown in FIG. 6B. FIG. 31B shows an eye pattern of the "Data 2" line shown in FIG. 6B. FIG. 31C shows an eye pattern of the "Data 4" line shown in FIG. 6B.

In FIGS. 30A to 30B and FIGS. 31A to 31C, the eye patterns corresponding to "Data1" and "Data2" represents transmission characteristics of data lines (existing data lines) that already exist in the general pin arrangement shown in FIG. 6A, and the eye pattern corresponding to "Data4" represents a transmission characteristic of data lines (new data lines) that is newly added in the pin arrangement in which differential data lines are newly added as shown in FIG. 6B. Note that, the eye patterns shown in FIGS. 30A and 30B and FIGS. 31A to 31C shows simulation results in a case where a differential signal having a 2 GHz frequency is applied to a signal pin.

When the FIGS. 30A and 30B, and FIGS. 31A to 31C are compared, the signal transmission characteristic is improved due to the connector structure according to the second embodiment, in addition to the existing data lines "Data1" and "Data2" and the new data line "Data4". Thus, the deterioration in signals is reduced by the connector according to the second embodiment.

Figure 32:
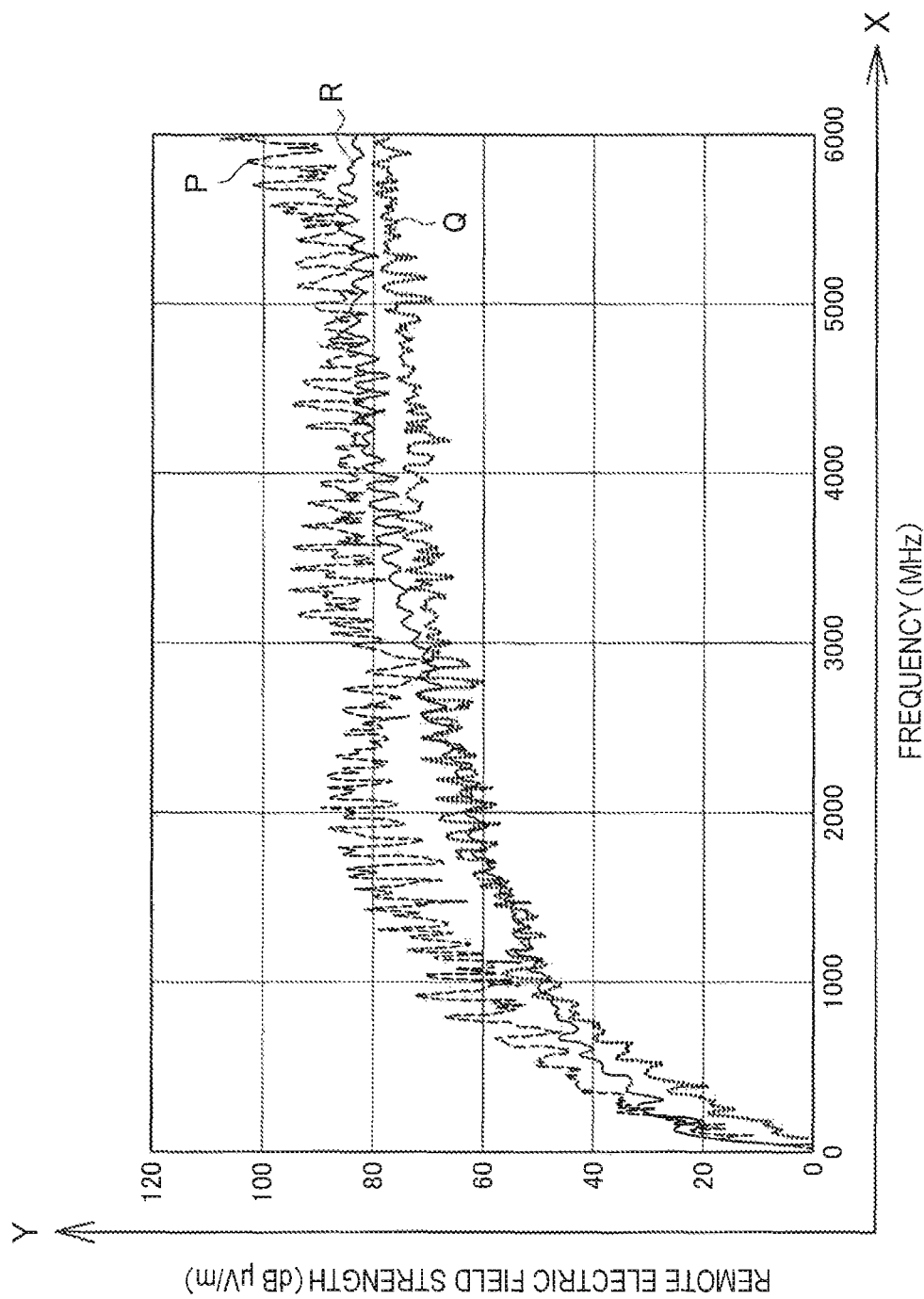
FIG. 32 is a graph showing a result of simulating EMI characteristics of a general Type A HDMI connector and a connector according to the second embodiment.

Next, with reference to FIG. 32, a comparison result of EMI characteristics between the general Type A HDMI connector and a Type A HDMI connector to which the connector structure according to the second embodiment has been applied is explained. FIG. 32 is a graph showing a result of simulating EMI characteristics of the general Type A HDMI connector and the connector according to the second embodiment. In FIG. 32, the horizontal axis (x axis) represents frequency (MHz) of a signal applied to a signal pin, and the vertical axis (y axis) represents remote electric field strength (dBμV/m). In addition, the both relations are plotted. When a value of the remote electric field strength (dBμV/m) represented in the vertical axis is greater, effect of electromagnetic waves generated by signals transmitting in the signal pins is greater, and EMI occurs easily. FIG. 32 shows a result after a computation model of the connector according to the second embodiment having the configuration as shown in FIG. 29 is generated and a simulation is performed on the computation model. As a reference, FIG. 32 also shows a result of the connector according to the first embodiment shown in FIG. 5C.

In FIG. 32, a curve of P (dashed curve) represents a graph showing a relation between frequencies (MHz) and remote electric field strength (dBμV/m) in the general Type A HDMI connector, and a curve of R (solid curve) represents a graph showing a relation between frequencies (MHz) and remote electric field strength (dBμV/m) in the connector according to the second embodiment. In addition, a curve of Q (dotted curve) represents a graph showing a relation between frequencies (MHz) and remote electric field strength (dBμV/m) in the connector according to the first embodiment shown in FIG. 5C. Note that, the simulation result of the general Type A HDMI connector and the simulation result of the connector according to the first embodiment show simulation results when signals corresponding to the general pin arrangement (that is, pin arrangement in which three sets of differential signal lines are provided) shown in FIG. 6A. The simulation result of the connector according to the second embodiment shows a simulation result when signals corresponding to the pin arrangement in which the differential data lines are newly added (that is, pin arrangement in which six sets of differential signal lines are provided) shown in FIG. 6B.

With reference to FIG. 32, the number of the differential data lines is doubled from three sets to six sets in the connector according to the second embodiment. However, the value of the remote electric field strength (dBμV/m) is lower than that of the general Type A HDMI connector. Thus, the EMI is suppressed and the deterioration in signals is reduced by the connector structure according to the second embodiment.

<5. Conclusion>

The schematic configuration of the receptacle-side connector according to the first embodiment of the present disclosure has been explained. The shell according to the first embodiment is grounded to ground potential on the mounted substrate in a manner that the shell covers the signal pins in the region in which the signal pins stretch toward the mounted substrate. Accordingly, shielding effect of signal pins can be achieved. In addition, the so-called microstrip structure between the signal pins and the shell achieves effect of controlling impedance. Therefore, it is possible to reduce deterioration in signal quality due to disturbance and the like with regard to signals transmitted to the signal pins. In addition, in every portion of the shell including not only a lower portion but also an upper portion of the shell, a path through which induction current generated in the shell flows out to the mounted substrate is formed. Therefore, EMI is suppressed, and it is possible to further reduce deterioration in quality of signals transmitted to the signal pins.

In the first embodiment, the grounding locations of the shell and the mounted substrate may be appropriately adjusted. For example, the grounding locations of the shell and the mounted substrate may be provided in a manner that the grounding locations sandwich, in the y axis direction, the region corresponding to the locations in which the signal pins and the wiring patterns are connected, in the direction in which the wiring patterns connected to the signal pins for transmitting differential signals on the mounted substrate and in a direction opposite to the direction. Alternatively, for example, the grounding locations of the shell and the mounted substrate may be provided in a manner that the grounding locations sandwich, in the x axis direction, the region corresponding to the location in which the wiring patterns and the signal pins for transmitting differential signals are connected. Alternatively, the grounding locations may be provided in a manner that the grounding area becomes large insofar as the grounding locations are not in contact with the signal pins and the wiring patterns (insofar as the grounding locations do not interfere with the connection between the signal pins and the wiring patterns). Since the grounding locations of the shell and the mounted substrate are provided in the vicinity of the wiring patterns and the signal pins for transmitting differential signals and the larger grounding areas thereof are provided, a path through which induction current generated in the shell flows out to the mounted substrate is formed more certainly to further reduce deterioration in signal quality.

Next, there has been explained the configurations of the connectors according to the first and second modifications of the present disclosure, as a configuration by which transmission data amounts are increased more in data transmission by an HDMI connector. In addition, as a configuration obtained by combining the configuration according to the first embodiment of the present disclosure and the configurations according to the first and second modifications of the present disclosure, the configuration of the receptacle-side connector according to the second embodiment of the present disclosure has been explained. In the second embodiment, both the effect in the first embodiment and the effect of the first and second modifications can be obtained at the same time. That is, in the second embodiment, the following effect can be obtained in addition to the effect obtained in the above-described first embodiment described.

In the second embodiment of the present disclosure, signal pins are formed on the substrates formed of the dielectric, and the electric conductor layers having the ground potential are formed on the opposite sides of the substrate surfaces on which the signal pins are formed. According to such configuration, the microstripline is formed by the signal pins, the substrates and the electric conductor layers. Thus, it is possible to reduce effects of the current (signal) flowing through the signal pins, on other signal pins. In addition, the deterioration in signals can be reduced.

In the second embodiment, among the signal pins, the intervals between the pairs of the signal pins that transmit differential signals and adjacently extend are shorter than the intervals from other signal pins adjacent to the pairs of the signal pins. According to such configuration, the differential stripline (differential strip structure) is formed by the pair of the signal pins having the short intervals. Thus, it is possible to reduce effects of the current (signal) flowing through the pair of the signal pins, on other signal pins. In addition, the deterioration in signals can be reduced. Moreover, since the intervals between the pairs of the signal pins are short, intervals from a different kind of adjacent signal wirings can be widen. Accordingly, the crosstalk can be reduced and signal quality can be improved.

Thus, in the second embodiment, it is possible to transmit data without deterioration in signals, even in the case of the pin arrangement in which data lines are newly added such as a pin arrangement in which data lines are newly allocated to a signal pin used as a shield and a signal pin used as a clock.

In addition, in the second embodiment, guard lines having ground potential may further extend at positions for sandwiching a signal pin in a manner that the guard lines are substantially parallel to the signal pin. According to such configuration, it is possible to reduce effects of the current (signal) flowing through the signal pins on other signal pins, and the deterioration in signals can be reduced.

Meanwhile, in the second embodiment, the wiring intervals between the signal pins in the fitting part of the plug-side connector and the receptacle-side connector may be identical to the wiring intervals between the signal pins in the fitting part of the general HDMI connector. According to such configuration, it is possible to ensure compatibility between the connectors according to the first modification and the second modification and the general HDMI connector. Thus, the user can connect apparatuses without considering types of connectors, and convenience of the user can be improved.

In addition, with regard to the connectors according to the first embodiment and the second embodiment of the present disclosure, the following additional modification has been explained.

With regard to the connectors according to the first embodiment and the second embodiment of the present disclosure, cross-sectional areas of the signal pins may be expanded. According to such configuration, it is possible to flow larger current through the signal pins while attenuation is suppressed more, and reliability of the connectors is improved. With regard to the HDMI connector, more effect can be obtained by expanding cross-sectional areas of a HPD signal pin and a power supply signal pin to which power-supply voltage is applied.

In addition, a substrate is provided inside the connector according to the second embodiment of the present disclosure. Various kinds of devices (circuits) that act on transmission of signals in the signal pins can be mounted on the substrates. According to such configuration, the connectors themselves can perform various kinds of signal processing. Accordingly, it is possible to simplify the signal processing in the transmitting apparatus and the receiving apparatus that are connected via the connectors.

In addition, the connectors according to the first embodiment and the second embodiment of the present disclosure can be suitably applied to various kinds of applications with regard to communication between apparatuses that use the HDMI interfaces.

Although preferred embodiments of the present disclosure have been described in detail above with reference to the appended drawings, the technical scope of the embodiments of the present disclosure is not limited to the above example. It is obvious to those with a general knowledge of the technical field of the embodiments of the present disclosure that various modifications and alterations may occur within the technical scope defined in the claims, and that these modifications and alterations are encompassed within the technical scope of the embodiments of the present disclosure.

Additionally, the present technology may also be configured as below.

(1)
A connector including:
a signal pin that is connected to a wiring pattern on a mounted substrate and that transmits a signal to an inside and an outside of any apparatus, the mounted substrate having an end disposed in the apparatus; and
a shell that is formed of an electric conductor and grounded to ground potential on the mounted substrate, in a manner that the shell covers the signal pin in a region in which the signal pin stretches toward the mounted substrate.

(2)
The connector according to (1),
wherein the shell is grounded to the ground potential at a plurality of grounding locations on the mounted substrate, and
wherein the grounding location includes a part of a region in a direction in which the wiring pattern is led out on the mounted substrate and a part of a region in a direction opposite to the direction, with respect to a region corresponding to a location in which the signal pin and the wiring pattern are connected.

(3)
The connector according to (1) or (2),
wherein the shell is grounded to the ground potential at the plurality of grounding locations on the mounted substrate,
wherein a part of a plurality of the signal pins transmits a differential signal, and
wherein the plurality of grounding locations of the shell includes locations for sandwiching a region corresponding to a location in which the part of the plurality of the signal pins that transmits the differential signal and the wiring pattern are connected.

(4)
The connector according to (3),
wherein a grounding area of the grounding location in the direction in which the wiring pattern is led out on the mounted substrate is smaller than a grounding area of the grounding location in a direction opposite to the direction.

(5)
The connector according to (3) or (4),
wherein the plurality of grounding locations of the shell include locations for sandwiching a region corresponding to a location in which a group of the signal pins that transmit differential signals and the wiring pattern are connected.

(6)
The connector according to any one of (1) to (5), further including, in the connector:
a substrate that has a surface on which the signal pin that stretches in a first direction is formed; and
an electric conductor layer that has ground potential, the electric conductor layer being formed on an opposite surface of the surface on which the signal pin is formed in the substrate.

(7)
The connector according to (6), including:
a plurality of the signal pins,
wherein, among the plurality of signal pins, an interval between a pair of the signal pins that transmit a differential signal and adjacently extend is shorter than an interval from another signal pin adjacent to the pair of signal pins.

(8)
The connector according to (6) or (7),
wherein the shell covers the signal pin and the substrate, the shell including an open surface open to an outside in the first direction, and
wherein the electric conductor layer is electrically connected to the shell that has ground potential.

(9)
The connector according to (8),
wherein the electric conductor layer constitutes at least a part of the shell.

(10)
The connector according to any one of (6) to (9),
wherein guard lines that have ground potential further extend at locations for sandwiching the signal pin on the substrate in a manner that the guard lines are substantially parallel to the signal pin.

(11)
The connector according to any one of (6) to (10),
wherein the signal pin extends with substantially equal wiring intervals in a fitting part of the connector that fits another connector to be paired with the connector.

(12)
The connector according to any one of (6) to (11), including:
a plurality of the signal pins,
wherein, among the plurality of signal pins, a cross-sectional area of a cross section of a power signal pin to which a power signal is applied is larger than a cross-sectional area of the signal pin other than the power signal pin, the cross section being substantially perpendicular to the first direction.

(13)
The connector according to any one of (6) to (12),
wherein a device that acts on transmission of a signal in the signal pin is mounted on the substrate.

(14)
The connector according to (13),
wherein the device is at least any of
an AC/DC conversion circuit that converts AC transmission into DC transmission of a signal to be transmitted by the signal pin,
a register that holds information on a characteristic of a signal to be transmitted by the signal pin, and a communication circuit that notifies any apparatus connected via the connector of the information held by the register, and
a battery that supplies at least any of the signal pins with power-supply voltage.

(15)
A data transmitting apparatus that transmits a signal via a connector to any apparatus, the data transmitting apparatus including:
the connector including
a signal pin that is connected to a wiring pattern on a mounted substrate and that transmits a signal to an inside and an outside of any apparatus, the mounted substrate having an end disposed in the apparatus, and
a shell that is formed of an electric conductor and grounded to ground potential on the mounted substrate, in a manner that the shell covers the signal pin in a region in which the signal pin stretches toward the mounted substrate.

(16)
The data transmitting apparatus according to (15), further including, in the connector:
a substrate that has a surface on which the signal pin that stretches in a first direction is formed; and
an electric conductor layer that has ground potential, the electric conductor layer being formed on an opposite surface of the surface on which the signal pin is formed in the substrate.

(17)
A data receiving apparatus that receives a signal transmitted via a connector from any apparatus, the data receiving apparatus including:
the connector including
a signal pin that is connected to a wiring pattern on a mounted substrate and that transmits a signal to an inside and an outside of any apparatus, the mounted substrate having an end disposed in the apparatus, and
a shell that is formed of an electric conductor and grounded to ground potential on the mounted substrate, in a manner that the shell covers the signal pin in a region in which the signal pin stretches toward the mounted substrate.

(18)
The data receiving apparatus according to (17), further including, in the connector:
a substrate that has a surface on which the signal pin that stretches in a first direction is formed; and
an electric conductor layer that has ground potential, the electric conductor layer being formed on an opposite surface of the surface on which the signal pin is formed in the substrate.

(19)
A data transmitting and receiving system including:
a data transmitting apparatus that transmits a signal to any apparatus via a connector including
a signal pin that is connected to a wiring pattern on a mounted substrate and that transmits a signal to an inside and an outside of any apparatus, the mounted substrate having an end disposed in the apparatus, and
a shell that is formed of an electric conductor and grounded to ground potential on the mounted substrate, in a manner that the shell covers the signal pin in a region in which the signal pin stretches toward the mounted substrate; and
a data receiving apparatus that receives a signal transmitted from any apparatus via the connector.

(20)
The data transmitting and receiving system according to (19), further including, in the connector:
a substrate that has a surface on which the signal pin that stretches in a first direction is formed; and
an electric conductor layer that has ground potential, the electric conductor layer being formed on an opposite surface of the surface on which the signal pin is formed in the substrate.

REFERENCE SIGNS LIST 1, 2 receptacle-side connector
11, 21 signal pin
12, 22 dielectric
13, 24 outer shell (shell)
14, 25 mounted substrate
15, 26 wiring pattern
16a to 16d, 27a to 27g grounding part
23 substrate
10, 20, 30, 40 connector
110, 210, 310, 410 signal pin
120, 220, 320, 420 dielectric
130, 230, 330, 430 substrate
140, 240, 340, 440 outer shell (shell)
150, 250 guard line
160 device

The invention claimed is:
1. A connector comprising:
a signal pin that is connected to a wiring pattern on a mounted substrate and that transmits a signal to an inside and an outside of any apparatus, the mounted substrate having an end disposed in the apparatus;
a shell that is formed of an electric conductor and grounded to ground potential on the mounted substrate, in a manner that the shell covers the signal pin in a region in which the signal pin stretches toward the mounted substrate;
a substrate portion that has a surface on which the signal pin stretches in a first direction is formed; and
an electric conductor layer that has ground potential, the electric conductor layer being formed on an opposite surface of the surface on which the signal pin is formed in the substrate portion.

2. The connector according to claim 1,
wherein the shell is grounded to the ground potential at a plurality of grounding locations on the mounted substrate, and
wherein each grounding location includes a part of a region in a direction in which the wiring pattern is led out on the mounted substrate and a part of a region in a direction opposite to the direction, with respect to a region corresponding to a location in which the signal pin and the wiring pattern are connected.

3. The connector according to claim 2, further comprising:
a plurality of signal pins;
wherein the shell is grounded to the ground potential at the plurality of grounding locations on the mounted substrate, wherein a part of a plurality of the signal pins transmits a differential signal, and
wherein the plurality of grounding locations of the shell includes locations for sandwiching a region corresponding to a location in which the part of the plurality of the signal pins that transmits the differential signal and the wiring pattern are connected.

4. The connector according to claim 3,
wherein a grounding area of the grounding location in the direction in which the wiring pattern is led out on the mounted substrate is smaller than a grounding area of the grounding location in a direction opposite to the direction.

5. The connector according to claim 4,
wherein the plurality of grounding locations of the shell include locations for sandwiching a region corresponding to a location in which a group of the signal pins that transmit differential signals and the wiring pattern are connected.

6. The connector according to claim 1, comprising:
a plurality of signal pins,
wherein, among the plurality of signal pins, an interval between a pair of the signal pins that transmit a differential signal and adjacently extend is shorter than an interval from another signal pin adjacent to the pair of signal pins.

7. The connector according to claim 1,
wherein the shell covers the signal pin and the substrate portion, the shell including an open surface open to an outside in the first direction, and
wherein the electric conductor layer is electrically connected to the shell that has ground potential.

8. The connector according to claim 7,
wherein the electric conductor layer constitutes at least a part of the shell.

9. The connector according to claim 1,
wherein guard lines that have ground potential further extend at locations for sandwiching the signal pin on the substrate portion in a manner that the guard lines are substantially parallel to the signal pin.

10. The connector according to claim 1, further comprising:
a plurality of signal pins;
wherein each of the signal pins extends with substantially equal wiring intervals in a fitting part of the connector that fits another connector to be paired with the connector.

11. The connector according to claim 1, comprising:
a plurality of signal pins,
wherein, among the plurality of signal pins, a cross-sectional area of a cross section of a power signal pin to which a power signal is applied is larger than a cross-sectional area of the signal pin other than the power signal pin, the cross section being substantially perpendicular to the first direction.

12. The connector according to claim 1,
wherein a device that acts on transmission of a signal in the signal pin is mounted on the substrate portion.

13. The connector according to claim 12,
wherein the device is at least any of
an AC/DC conversion circuit that converts AC transmission into DC transmission of a signal to be transmitted by the signal pin,
a register that holds information on a characteristic of a signal to be transmitted by the signal pin, and a communication circuit that notifies any apparatus connected via the connector of the information held by the register, and
a battery that supplies at least any of the signal pins with power-supply voltage.

14. The connector according to claim 1, wherein the substrate portion is a part of the mounted substrate.

15. A data transmitting apparatus that transmits a signal via a connector to any apparatus, the data transmitting apparatus comprising:
the connector including
a signal pin that is connected to a wiring pattern on a mounted substrate and that transmits a signal to an inside and an outside of any apparatus, the mounted substrate having an end disposed in the apparatus,
a shell that is formed of an electric conductor and grounded to ground potential on the mounted substrate, in a manner that the shell covers the signal pin in a region in which the signal pin stretches toward the mounted substrate,
substrate portion that has a surface on which the signal pin stretches in a first direction is formed, and
an electric conductor layer that has ground potential, the electric conductor layer being formed on an opposite surface of the surface on which the signal pin is formed in the substrate portion.

16. A data receiving apparatus that receives a signal transmitted via a connector from any apparatus, the data receiving apparatus comprising:
the connector including
a signal pin that is connected to a wiring pattern on a mounted substrate and that transmits a signal to an inside and an outside of any apparatus, the mounted substrate having an end disposed in the apparatus,
a shell that is formed of an electric conductor and grounded to ground potential on the mounted substrate, in a manner that the shell covers the signal pin in a region in which the signal pin stretches toward the mounted substrate,
a substrate portion that has a surface on which the signal pin stretches in a first direction is formed, and
an electric conductor layer that has ground potential, the electric conductor layer being formed on an opposite surface of the surface on which the signal pin is formed in the substrate portion.

17. A data transmitting and receiving system comprising:
a data transmitting apparatus that transmits a signal to any apparatus via a connector including
a signal pin that is connected to a wiring pattern on a mounted substrate and that transmits a signal to an inside and an outside of any apparatus, the mounted substrate having an end disposed in the apparatus,
a shell that is formed of an electric conductor and grounded to ground potential on the mounted substrate, in a manner that the shell covers the signal pin in a region in which the signal pin stretches toward the mounted substrate;
a data receiving apparatus that receives a signal transmitted from any apparatus via the connector,
a substrate portion that has a surface on which the signal pin stretches in a first direction is formed, and
an electric conductor layer that has ground potential, the electric conductor layer being formed on an opposite surface of the surface on which the signal pin is formed in the substrate portion.

* * * * *